(12) United States Patent
Chew

(10) Patent No.: US 12,506,055 B2
(45) Date of Patent: Dec. 23, 2025

(54) CHIP PACKAGING METHOD AND CHIP STRUCTURE

(71) Applicant: PEP INNOVATION PTE. LTD., Singapore (SG)

(72) Inventor: Hwee Seng Chew, Singapore (SG)

(73) Assignee: PEP INNOVATION PTE. LTD., Singapore (SG)

( * ) Notice: Subject to any disclaimer, the term of this patent is extended or adjusted under 35 U.S.C. 154(b) by 1083 days.

(21) Appl. No.: 17/508,335

(22) Filed: Oct. 22, 2021

(65) Prior Publication Data

US 2022/0102254 A1 Mar. 31, 2022

Related U.S. Application Data

(63) Continuation-in-part of application No. 16/805,853, filed on Mar. 2, 2020, now Pat. No. 11,233,028.
(Continued)

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4821* (2013.01); *H01L 21/56* (2013.01);
(Continued)

(58) Field of Classification Search
CPC . H01L 23/5389; H01L 23/3135; H01L 21/56; H01L 23/31; H01L 23/49575; H01L 21/4821; H01L 23/49517; H01L 24/20
See application file for complete search history.

(56) References Cited

U.S. PATENT DOCUMENTS 6,232,238 B1 5/2001 Chang et al.
6,396,159 B1 5/2002 Shoji
(Continued)

FOREIGN PATENT DOCUMENTS

CN 101835866 A 9/2010
CN 102194718 9/2011
(Continued)

OTHER PUBLICATIONS

First Office Action dated Sep. 13, 2022 in related Taiwan Application No. 110139387 filed Oct. 22, 2021 (15 pages) with Google machine translation (29 pages).
(Continued)

*Primary Examiner* — Thanhha S Pham
(74) *Attorney, Agent, or Firm* — Daniel F. Nesbitt; Nesbitt IP LLC

(57) ABSTRACT

The present disclosure provides a chip package for power modules including at least one semiconductor die; a driver circuit for controlling the at least one semiconductor die; a protective layer formed on a die active surface of the at least one die and a driver active surface of the driver circuit; a metal unit having at least one metal feature; and a molding layer for encapsulating the at least one semiconductor die, the driver circuit, the protective layer and metal unit. The chip package is connected with an external circuit via the at least one metal feature. The present disclosure also provides a method of making the chip packages for power modules.

15 Claims, 32 Drawing Sheets

Related U.S. Application Data which is a continuation-in-part of application No. 15/826,268, filed on Nov. 29, 2017, now Pat. No. 11,049,734.

(51) Int. Cl.
  H01L 21/56    (2006.01)
  H01L 23/31    (2006.01)
  H01L 25/065   (2023.01)

(52) U.S. Cl.
  CPC ........ *H01L 23/31* (2013.01); *H01L 23/49517* (2013.01); *H01L 25/0655* (2013.01)

(56) References Cited

U.S. PATENT DOCUMENTS

| | | |
|---|---|---|
| 6,433,563 B1 | 8/2002 | Maruyama |
| 7,830,004 B2 | 11/2010 | Wu |
| 8,236,613 B2 | 8/2012 | Gong |
| 8,293,576 B2 | 10/2012 | Chino |
| 8,680,662 B2 | 3/2014 | Haba et al. |
| 8,848,380 B2 | 9/2014 | Malatkar et al. |
| 9,793,230 B1 * | 10/2017 | Yu ................... H01L 23/3171 |
| 9,870,975 B1 | 1/2018 | Wang et al. |
| 10,032,735 B2 | 7/2018 | Yu et al. |
| 10,157,867 B1 | 12/2018 | Chen et al. |
| 10,297,519 B2 | 5/2019 | Lin |
| 10,431,477 B2 | 10/2019 | Chew |
| 11,049,734 B2 | 6/2021 | Chew |
| 11,062,917 B2 | 7/2021 | Chew |
| 11,114,315 B2 | 9/2021 | Chew |
| 11,232,957 B2 | 1/2022 | Chew |
| 11,233,028 B2 | 1/2022 | Chew |
| 11,538,695 B2 | 12/2022 | Chew |
| 11,610,855 B2 | 3/2023 | Chew |
| 11,881,415 B2 | 1/2024 | Chew |
| 2002/0093082 A1 | 7/2002 | Miyamoto et al. |
| 2003/0090006 A1 | 5/2003 | Farnworth |
| 2003/0141591 A1 | 7/2003 | Hsu et al. |
| 2006/0043364 A1 | 3/2006 | Jiang et al. |
| 2008/0006910 A1 | 1/2008 | Miyata et al. |
| 2008/0237880 A1 | 10/2008 | Lin et al. |
| 2009/0152715 A1 | 6/2009 | Shim et al. |
| 2009/0261466 A1 | 10/2009 | Pagaila et al. |
| 2010/0006988 A1 | 1/2010 | Tang et al. |
| 2010/0133680 A1 | 6/2010 | Kang et al. |
| 2010/0140779 A1 | 6/2010 | Lin et al. |
| 2010/0171205 A1 | 7/2010 | Chen et al. |
| 2011/0026232 A1 | 2/2011 | Lin et al. |
| 2011/0065238 A1 | 3/2011 | Chiou et al. |
| 2011/0079913 A1 | 4/2011 | Chino |
| 2011/0198762 A1 | 8/2011 | Scanlan |
| 2011/0241222 A1 | 10/2011 | Sezi et al. |
| 2011/0278741 A1 | 11/2011 | Chua et al. |
| 2012/0061823 A1 | 3/2012 | Wu et al. |
| 2012/0119373 A1 | 5/2012 | Hunt |
| 2012/0313238 A1 | 12/2012 | Sato et al. |
| 2012/0313243 A1 | 12/2012 | Chang et al. |
| 2013/0075928 A1 | 3/2013 | Gallegos et al. |
| 2013/0241048 A1 | 9/2013 | Lin et al. |
| 2013/0292684 A1 | 11/2013 | Nikitin et al. |
| 2013/0295725 A1 | 11/2013 | Park et al. |
| 2013/0341784 A1 | 12/2013 | Lin et al. |
| 2014/0023885 A1 | 1/2014 | Choi et al. |
| 2014/0027885 A1 | 1/2014 | Kawase et al. |
| 2014/0027929 A1 | 1/2014 | Lin et al. |
| 2014/0042638 A1 | 2/2014 | Liu et al. |
| 2014/0264799 A1 | 9/2014 | Gowda et al. |
| 2015/0008566 A1 | 1/2015 | Gerber et al. |
| 2015/0137162 A1 | 5/2015 | Sabathil et al. |
| 2015/0145142 A1 | 5/2015 | Lin et al. |
| 2015/0155248 A1 | 6/2015 | Lin et al. |
| 2015/0162289 A1 | 6/2015 | Chang et al. |
| 2015/0179616 A1 | 6/2015 | Lin et al. |
| 2015/0206855 A1 | 7/2015 | Lin |
| 2015/0243607 A1 | 8/2015 | Jang et al. |
| 2015/0314941 A1 | 11/2015 | Ramadas et al. |
| 2015/0318262 A1 | 11/2015 | Gu et al. |
| 2015/0357256 A1 | 12/2015 | Suthiwongsunthorn et al. |
| 2015/0380356 A1 | 12/2015 | Chauhan et al. |
| 2016/0005628 A1 | 1/2016 | Yap et al. |
| 2016/0035663 A1 * | 2/2016 | Huang ................ H01L 23/3114 257/668 |
| 2016/0118326 A1 | 4/2016 | Kwon |
| 2016/0155713 A1 | 6/2016 | Kim et al. |
| 2016/0276307 A1 | 9/2016 | Lin |
| 2016/0322337 A1 | 11/2016 | Liang et al. |
| 2016/0338202 A1 | 11/2016 | Park et al. |
| 2016/0343697 A1 | 11/2016 | Lee et al. |
| 2017/0005057 A1 | 1/2017 | Hurwitz et al. |
| 2017/0084589 A1 | 3/2017 | Kuo et al. |
| 2017/0098628 A1 | 4/2017 | Liu et al. |
| 2017/0133334 A1 | 5/2017 | Kim et al. |
| 2017/0250171 A1 | 8/2017 | Yu et al. |
| 2017/0309571 A1 | 10/2017 | Yi et al. |
| 2017/0365566 A1 | 12/2017 | Lee et al. |
| 2017/0372981 A1 | 12/2017 | Su et al. |
| 2018/0006058 A1 | 1/2018 | Lee |
| 2018/0033782 A1 | 2/2018 | Jeng et al. |
| 2018/0082917 A1 | 3/2018 | Cheng et al. |
| 2018/0166396 A1 | 6/2018 | Lee et al. |
| 2018/0190513 A1 | 7/2018 | Chew |
| 2018/0204741 A1 | 7/2018 | Chew |
| 2018/0268188 A1 | 9/2018 | Zhang et al. |
| 2018/0269188 A1 | 9/2018 | Yu et al. |
| 2018/0359886 A1 | 12/2018 | Lin et al. |
| 2019/0006289 A1 | 1/2019 | Huang et al. |
| 2019/0182997 A1 | 6/2019 | Lin et al. |
| 2020/0051928 A1 | 2/2020 | Park et al. |
| 2020/0168506 A1 | 5/2020 | Kwon et al. |
| 2020/0203188 A1 | 6/2020 | Chew |
| 2020/0212018 A1 | 7/2020 | Lai et al. |
| 2021/0013026 A1 | 1/2021 | Jin et al. |
| 2021/0343549 A1 | 11/2021 | Chew et al. |
| 2021/0398822 A1 | 12/2021 | Chew |
| 2022/0102254 A1 | 3/2022 | Chew |
| 2022/0157750 A1 | 5/2022 | Chew |

FOREIGN PATENT DOCUMENTS

| | | |
|---|---|---|
| CN | 103337486 A | 10/2013 |
| CN | 103383927 | 11/2013 |
| CN | 103515252 | 1/2014 |
| CN | 104081521 | 10/2014 |
| CN | 104362102 A | 2/2015 |
| CN | 105304586 | 2/2016 |
| CN | 105304605 A | 2/2016 |
| CN | 107591391 | 1/2018 |
| CN | 108231606 A | 6/2018 |
| CN | 108231607 A | 6/2018 |
| CN | 208045473 | 11/2018 |
| CN | 110648930 A | 1/2020 |
| CN | 110648931 A | 1/2020 |
| CN | 110729256 A | 1/2020 |
| CN | 110729257 A | 1/2020 |
| CN | 110729258 A | 1/2020 |
| CN | 110729270 A | 1/2020 |
| CN | 110729271 A | 1/2020 |
| CN | 110729272 A | 1/2020 |
| CN | 110783300 A | 2/2020 |
| CN | 110828394 A | 2/2020 |
| CN | 110838452 A | 2/2020 |
| CN | 111755348 A | 10/2020 |
| CN | 114038843 A | 2/2022 |
| CN | 114512457 A | 5/2022 |
| CN | 115280489 A | 11/2022 |
| CN | 115360101 A | 11/2022 |
| JP | 2014135346 | 7/2014 |
| TW | 200423357 A | 11/2004 |
| TW | 200919668 A | 5/2009 |
| TW | 201250961 A | 12/2012 |
| TW | 201327744 | 7/2013 |
| TW | 201448139 A | 12/2014 |
| TW | 201608636 A | 3/2016 |

(56) References Cited

FOREIGN PATENT DOCUMENTS

| | | |
|---|---|---|
| TW | 201803042 A | 1/2018 |
| TW | 201803055 A | 1/2018 |
| TW | 201810562 | 3/2018 |
| TW | 201820565 A | 6/2018 |
| TW | 201830590 A | 8/2018 |
| TW | 201830621 | 8/2018 |
| TW | 201830654 | 8/2018 |
| TW | 201832297 | 9/2018 |
| TW | 201834085 | 9/2018 |
| TW | 201834086 | 9/2018 |
| TW | 201834088 | 9/2018 |
| TW | 201900761 | 1/2019 |
| TW | I648839 B | 1/2019 |
| TW | 201906076 A | 2/2019 |
| TW | 201909348 A | 3/2019 |
| TW | M589895 | 1/2020 |
| TW | M589897 | 1/2020 |
| TW | M589898 U | 1/2020 |
| TW | M591703 U | 3/2020 |
| TW | M595330 U | 5/2020 |
| TW | 202021076 A | 6/2020 |
| TW | 202025408 A | 7/2020 |
| TW | 202025410 A | 7/2020 |
| TW | M597977 U | 7/2020 |
| TW | 202034441 A | 9/2020 |
| TW | 202034442 A | 9/2020 |
| TW | 202034472 A | 9/2020 |
| TW | 202034481 A | 9/2020 |
| TW | 202034491 A | 9/2020 |
| TW | 202036812 A | 10/2020 |
| TW | 202036813 A | 10/2020 |
| TW | 202107640 A | 2/2021 |
| TW | 202121630 A | 6/2021 |
| TW | 202129829 A | 8/2021 |
| TW | 202135252 A | 9/2021 |
| TW | 202221851 A | 6/2022 |
| TW | 202221866 A | 6/2022 |
| TW | 202236562 A | 9/2022 |
| TW | 202308086 A | 2/2023 |
| WO | 2006054606 A1 | 5/2006 |
| WO | 2019044512 A1 | 3/2019 |
| WO | 2022015245 A1 | 1/2022 |

OTHER PUBLICATIONS

First Office Action and Search Report dated Nov. 21, 2024 in related Chinese Application No. 202111236349.1 filed Oct. 22, 2021 (9 pages) with Google machine translation (17 pages).

First Office Action and Search Report dated Nov. 21, 2024 in related Chinese Application No. 201910741612.9 filed Aug. 12, 2019 (8 pages) with Google machine translation (14 pages).

First Office Action and Search Report dated Sep. 6, 2024 in related Chinese Application No. 202211032667.0 filed Nov. 29, 2017 (9 pages) with Google machine translation (15 pages).

First Office Action and Search Report dated May 4, 2023 in related Taiwan Application No. 111139131 filed Oct. 14, 2022 (16 pages) with Google machine translation (9 pages).

* cited by examiner

CHIP PACKAGING METHOD AND CHIP STRUCTURE

CROSS-REFERENCE TO RELATED APPLICATIONS

This application is a continuation-in-part application of U.S. patent application Ser. No. 16/805,853 entitled "CHIP PACKAGING METHOD AND CHIP STRUCTURE", filed on Mar. 2, 2020, which is a continuation-in-part application of U.S. patent application Ser. No. 15/826,268 filed on Nov. 29, 2017 entitled "Method of Packaging Chip and Chip Package Structure", now U.S. Pat. No. 11,049,734, and also claims priority to Singapore patent application No. 10202010557R entitled "Semiconductor package structure with embedded lead frame" filed on Oct. 24, 2020, the disclosures of which are herein incorporated by reference in their entireties for all purposes.

TECHNICAL FIELD

The present disclosure relates to a field of semiconductor technologies, and more particularly, to a chip packaging method and a chip structure with embedded lead frame.

BACKGROUND

Panel-level package is a process of cutting a wafer to separate out a plurality of dies, arranging and adhering the dies onto a carrier, and simultaneously packaging the plurality of dies in a same process. The panel-level package has received wide attention as a technique emerging in recent years; and as compared with traditional wafer-level package, the panel-level package has advantages of high production efficiency, low production costs, and better applicability to mass production.

Meanwhile, demand of chip packages for power modules increases significantly nowadays. However, traditional chip packages still using Cu clips and wire bonds have many drawbacks. For example, the Cu clip has a bulky size which makes it difficult for the traditional chip packages to have thin profiles. Accordingly, the Cu clip attached onto dies of the traditional chips may induce the dies to crack due to its heavy weight. This drawback becomes more and more serious when the thin dies are required for power modules. In addition, the wire bonds may lead the traditional chip packages to inferior electrical and thermal performance.

Therefore, the present application discloses chip structures and packaged chips accordingly for solving the drawbacks of the traditional chip packages. In particular, the chip structures and packaged chips having an embedded lead frame show better electrical and thermal performance for power modules.

SUMMARY

According to various embodiments, the present disclosure is intended to provide a chip package for a power module, comprising: at least one semiconductor die having a die active surface and a die back surface opposed to each other, wherein the at least one semiconductor die has a thin profile for reducing electrical resistance for the power module; a driver for controlling the at least one semiconductor die, wherein the driver has a driver active surface and a driver back surface opposed to each other; a protective layer formed on the die active surface and the driver active surface, wherein the protective layer comprises a plurality of protective layer openings for exposing the die active surface and the driver active surface from the protective layer; a metal unit having at least one metal feature, wherein the at least one metal feature comprises at least one connection pad having a connection pad front surface and a connection pad back surface opposed to each other; and a molding layer for encapsulating the at least one semiconductor die, the driver, the protective layer and metal unit. The chip structure is connected with an external circuit via the at least one metal feature.

According to various embodiments, the present disclosure is intended to provide a chip structure, comprising: at least one semiconductor die having a die active surface and a die back surface opposed to each other; a protective layer formed on the die active surface, wherein the protective layer comprises a plurality of protective layer openings for exposing the die active surface from the protective layer; a metal unit having at least one metal feature, wherein the at least one metal feature comprises at least one connection pad having a connection pad front surface and a connection pad back surface opposed to each other; a molding layer for encapsulating the at least one semiconductor die, the protective layer and metal unit; and a first conductive structure on the at least one metal feature of the metal unit, the protective layer and the molding layer, wherein the first conductive structure is connected to the die active surface for connecting the at least one die to the meal unit. The chip structure is connected with an external circuit via the first conducive structure.

According to various embodiments, the present disclosure is intended to provide a chip method of making a chip package for a power module, comprising: providing at least one semiconductor die having a die active surface and a die back surface opposed to each other, wherein the at least one semiconductor die has a thin thickness between the die active surface and the die back surface for reducing electrical resistance for the power module; providing a driver for controlling the at least one semiconductor die, wherein the driver has a driver active surface and a driver back surface opposed to each other; forming a protective layer on the die active surface and the driver active surface, wherein the protective layer comprises a plurality of protective layer openings for exposing the die active surface and the driver active surface from the protective layer; disposing a metal unit enclosing the at least one semiconductor die and the driver, wherein the metal unit has at least one metal feature, and the at least one metal feature further comprises at least one connection pad having a connection pad front surface and a connection pad back surface opposed to each other; and forming a molding layer for encapsulating the at least one semiconductor die, the driver, the protective layer and metal unit.

DETAILED DESCRIPTION

In order to make the technical solution of the present disclosure clearer and the technical effect more apparent, preferred embodiments of the present disclosure will be described and explained in detail below in conjunction with the accompanying drawings; it cannot be understood that the description below is the only implementation form of the present disclosure or a limitation to the present disclosure.

Figure 1:
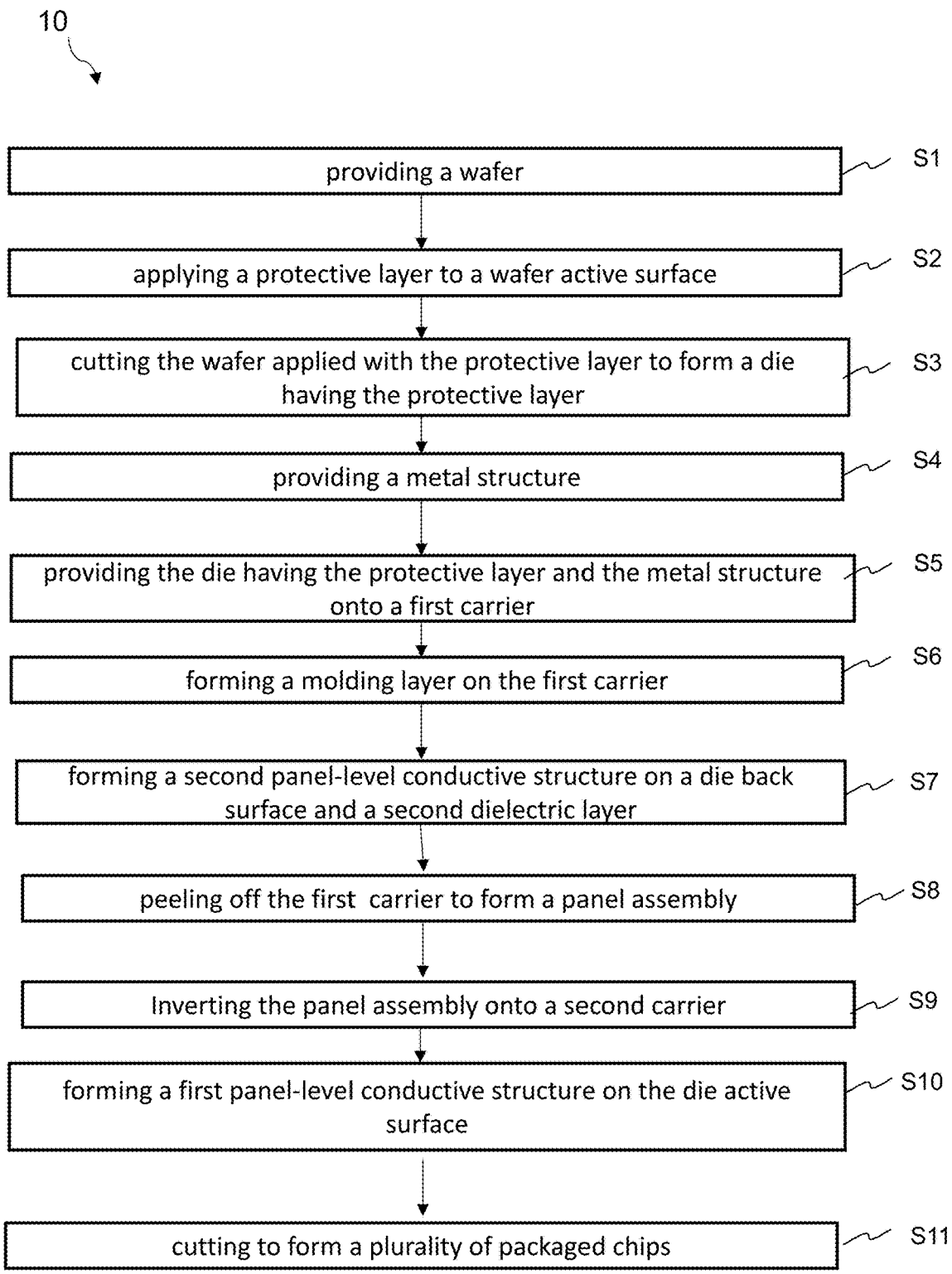
FIG. 1 illustrates a flow chart of a chip packaging method according to an exemplary embodiment of the present disclosure.

FIG. 1 illustrates a flow chart of a chip packaging method 10 according to an exemplary embodiment of the present disclosure. FIG. 2 to FIG. 25 illustrates schematic diagrams of making a panel assembly 150 with the chip packaging method 10 by following the flow chart in FIG. 1.

Referring to FIG. 1, the method according to the present disclosure comprises the following steps.

Step S1: providing a wafer 100.

Figure 2:
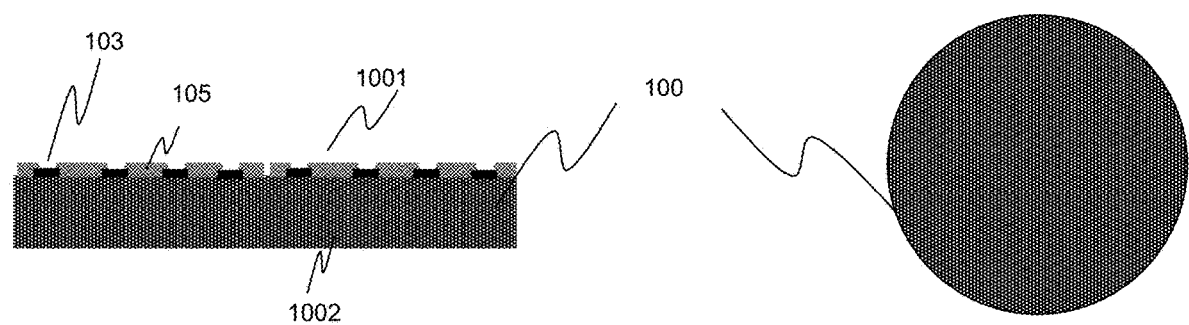
FIG. 2 to FIG. 25 illustrates schematic diagrams of making a panel assembly with the chip packaging method of FIG. 1.

As shown in FIG. 2, at least one wafer 100 is provided; the wafer 100 has a wafer active surface 1001 and a wafer back surface 1002; the wafer 100 includes a plurality of dies 113, and active surfaces of the dies 113 constitutes the wafer active surface 1001; the active surface of each die 113 in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form a functional circuit, so as to implement various functions. The wafer active surface 1001 further includes an electrical connection pad 103 for leading out the functional circuit and an insulating layer 105 for protecting the electrical connection pad 103.

Step S2: applying a protective layer 107 to the wafer active surface 1001.

Figure 3A:
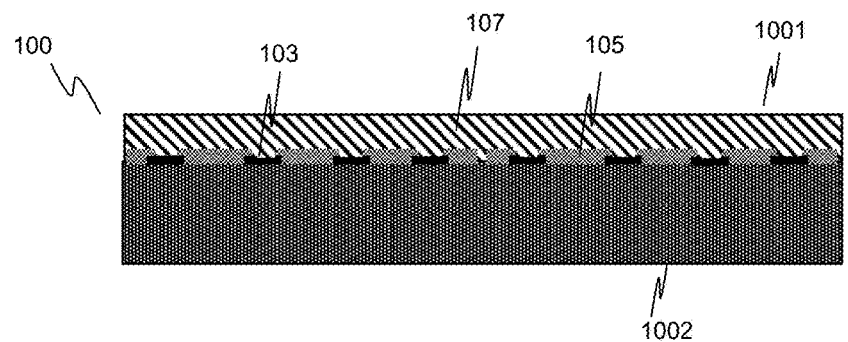
Figure 3B:
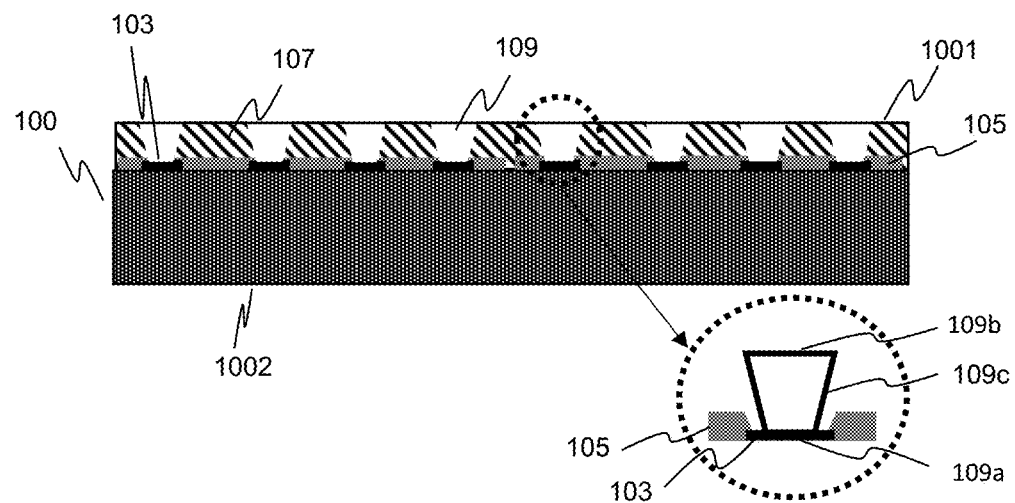

FIG. 3a to FIG. 3b show an optional process of applying the protective layer 107 to the wafer active surface 1001.

As shown in FIG. 3a, the protective layer 107 is applied to the wafer active surface 1001.

Preferably, the protective layer 107 is applied to the wafer active surface 1001 by lamination.

Optionally, before the step of applying the protective layer 107 to the wafer active surface 1001, the wafer active surface 1001 and/or a surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase a bonding area and/or chemically-promoting modifier treatment of introducing a chemically-promoting modifier group (for example, a surface modifier comprising both a group having affinity with an organic substance and a group having affinity with an inorganic substance) between the wafer 100 and the protective layer 107 so as to increase a bonding force at an interface between the organic layer and the inorganic layer.

As shown in FIG. 3b, a protective layer opening 109 is formed on a surface of the protective layer 107.

The protective layer opening 109 is formed in the protective layer 10 at a position corresponding to the electrical connection pad 103 provided on the wafer active surface 1001, to expose the electrical connection pad 103 provided on the wafer active surface 1001.

Preferably, the protective layer openings 109 correspond to the electrical connection pads 103 provided on the wafer active surface 1001 in a one-to-one manner.

Optionally, each protective layer opening 109 of at least a part of the protective layer openings 109 corresponds to a plurality of electrical connection pads 103.

Optionally, at least a part of the electrical connection pads 103 correspond to a plurality of protective layer openings 109.

Optionally, at least a part of the protective layer openings 109 have no corresponding electrical connection pads 103, or at least a part of the electrical connection pads 103 have no corresponding protective layer openings 109.

The protective layer opening is formed by a laser patterning process or a photolithography patterning process.

If the protective layer opening is formed by the laser patterning process, preferably, before the protective layer 107 is applied to the wafer active surface 1001, a chemical plating process is performed on the wafer active surface 1001 to form a conductive cover layer on the electrical connection pad 103. Optionally, the conductive cover layer comprises one or more layers of Cu, Ni, Pd, Au, Cr; preferably, the conductive protective layer is a Cu layer; and the conductive cover layer preferably has a thickness of 2 µm to 3 µm. The conductive cover layer is not shown in the drawings. The conductive cover layer protects the electrical connection pad 103 provided on the wafer active surface 1001 from being damaged by laser in a subsequent step of forming the protective layer opening.

Preferably, as shown by a partially enlarged view in FIG. 3b, a gap is formed between a lower surface 109a of the protective layer opening and the insulating layer 105; preferably, the lower surface 109a of the protective layer opening 109 is located at a position close to a central portion of the electrical connection pad 103.

In a preferred embodiment, the protective layer opening 109 has a shape such that an area of an upper surface 109b of the protective layer opening 109 is larger than an area of the lower surface 109a of the protective layer opening 109, and an area ratio of the lower surface 109a to the upper surface 109b is 60% to 90%.

In this case, a side wall 109c of the protective layer opening 109 has a slope which facilitates filling of a conductive material, so that the conductive material is uniformly and continuously formed on the side wall during a filling process.

Optionally, the protective layer opening 109 is not formed in this step, and the protective layer opening 109 is formed in the protective layer for example after a process of peeling off a carrier.

Optionally, a conductive medium is filled in the protective layer opening 109 such that the protective layer opening 109 becomes a conductive filled via 124. At least one of the conductive filled vias 124 are connected with the electrical connection pads 103 provided on the wafer active surface 1001. In this way, the conductive filled via 124 leads out the electrical connection pad 103 provided on the wafer active surface 1001 unilaterally to the surface of the protective layer 107, and the protective layer 107 is formed around the conductive filled via 124. The conductive medium for example is made of a material such as gold, silver, copper, tin, aluminum and the like, or a combination thereof, or other suitable conductive materials; the conductive medium is filled in the protective layer opening 109 to form the conductive filled via 124 by physical vapor deposition (PVD), chemical vapor deposition (CVD), sputtering, electrolytic electroplating, electrodeless electroplating, or other suitable metal deposition processes.

Figure 4A:
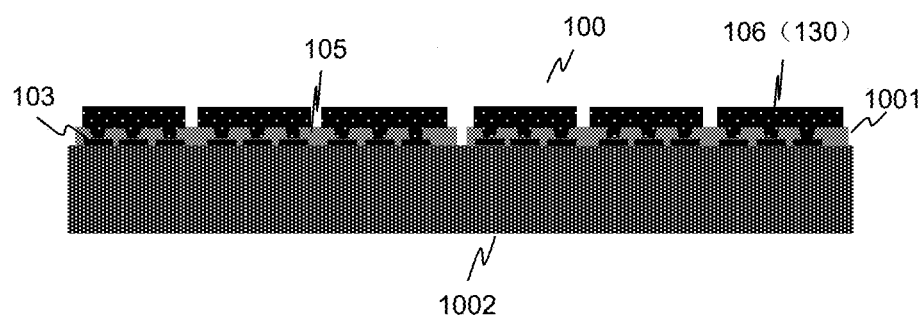
Figure 4B:
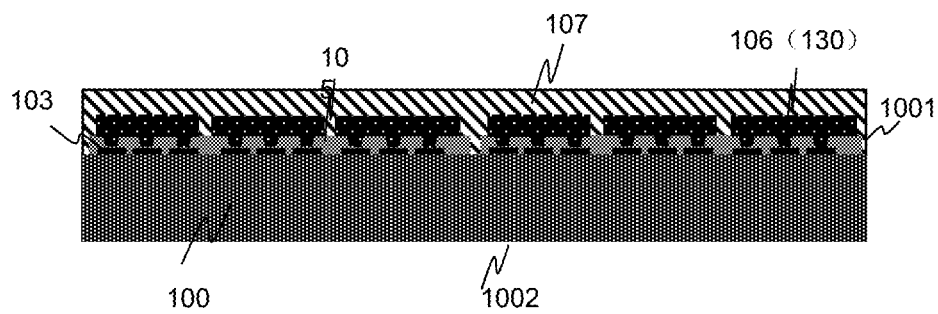
Figure 4C:
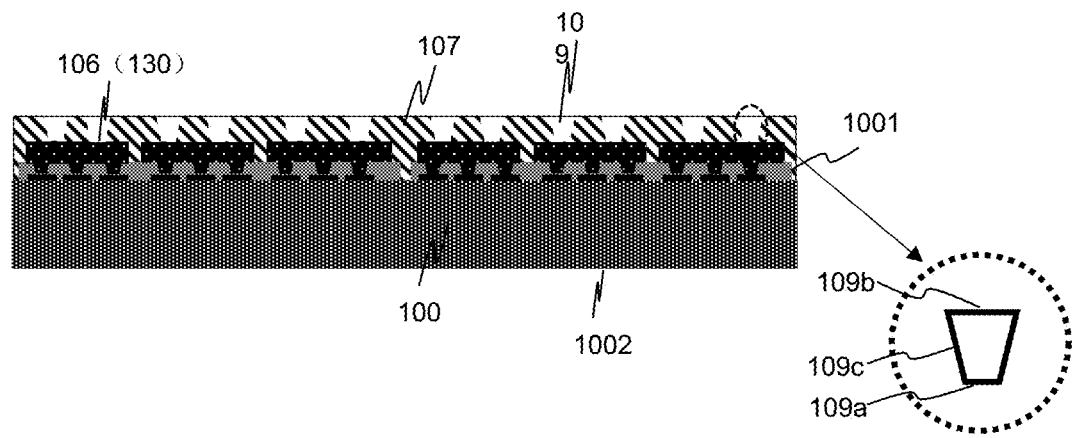

FIG. 4a to FIG. 4c show another optional process of applying the protective layer 107 to the wafer active surface 1001.

As shown in FIG. 4a, a wafer conductive layer 130 is formed on the wafer active surface 1001.

The wafer conductive layer 130 is a wafer conductive trace 106. The wafer conductive trace 106 for example is made of a material such as copper, gold, silver, tin, aluminum and the like, or a combination thereof, or other suitable conductive materials by PVD, CVD, sputtering, electrolytic electroplating, electrodeless electroplating, or other suitable metal deposition processes.

At least a part of the wafer conductive traces 106 are connected with at least a part of the electrical connection pads 103 provided on the wafer active surface 1001.

Figure 6A:
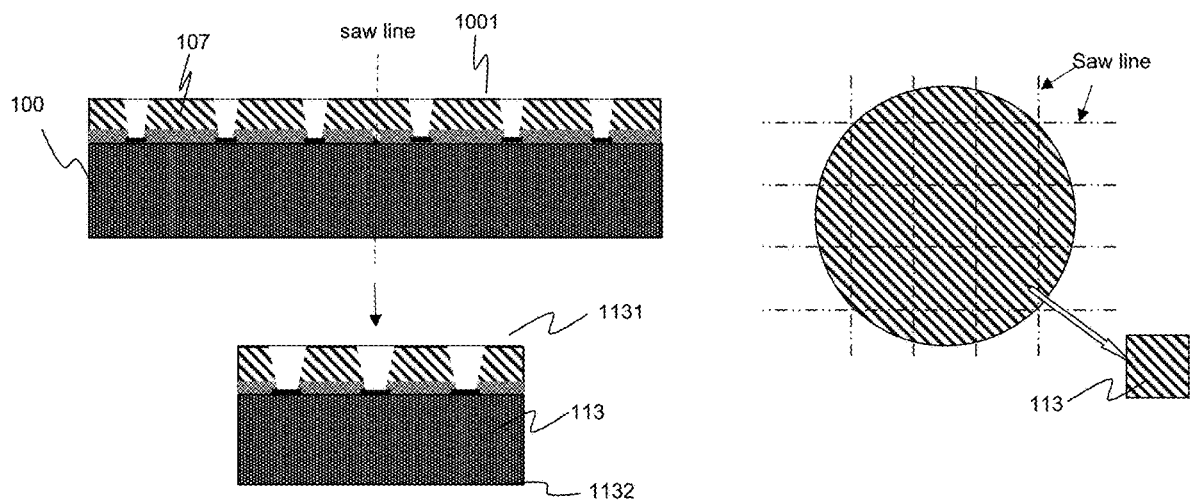
Figure 6B:
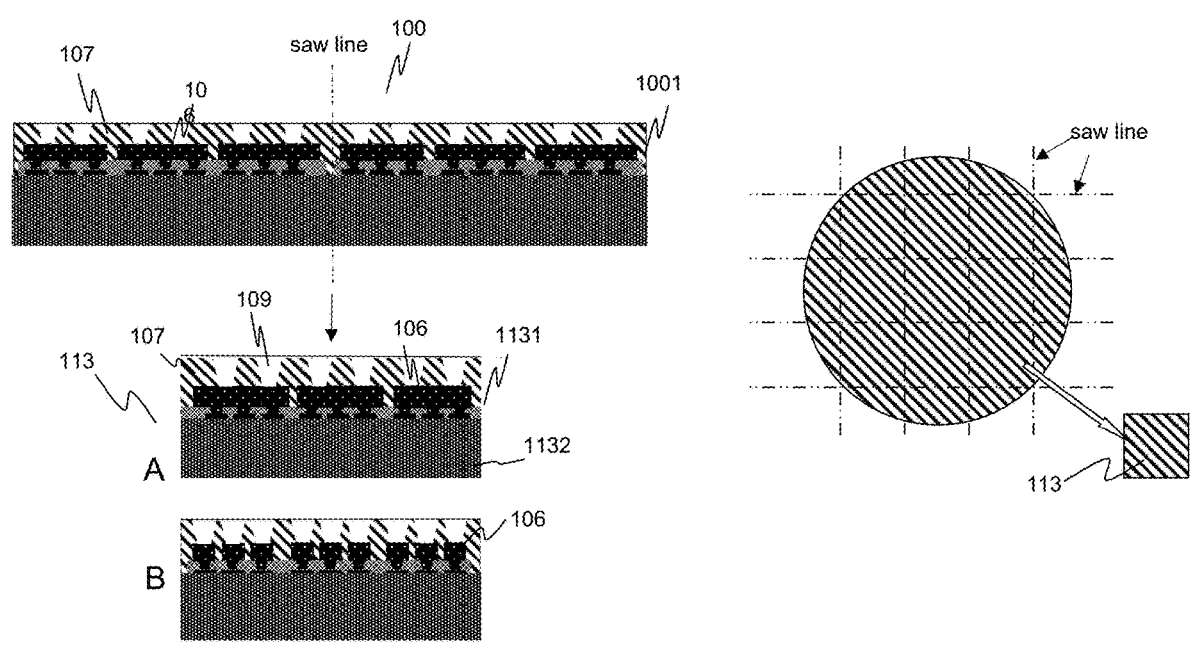

Optionally, the wafer conductive trace 106 interconnects and leads out a plurality of electrical connection pads 103 of at least a part of the electrical connection pads 103 provided on the wafer active surfaces 1001, to obtain the die 113 shown in a die schematic diagram A in FIG. 6b.

Formation of the wafer conductive trace 106 reduces the amount of protective layer openings 109 formed in a subsequent process; and the wafer conductive trace 106 is employed to firstly interconnect the plurality of electrical connection pads 103 according to the circuit design, so that it is not necessary to form the protective layer opening 109 on each electrical connection pad 103.

Optionally, the wafer conductive traces 106 respectively lead out at least a part of the electrical connection pads 103 provided on the wafer active surface 1001, to obtain the die 113 shown in a die schematic diagram B in FIG. 6b.

Formation of the wafer conductive trace 106 reduces a difficulty of forming the protective layer opening 109 in a subsequent process; due to the presence of the wafer conductive trace 106, the lower surface 109a of the protective layer opening has a larger area, and accordingly the protective layer opening 109 has a larger area, so that it is possible to form the protective layer opening especially on the wafer 100 having a smaller exposed electrical connection pad 103.

Although not shown in the drawings, it should be understood that, a part of the wafer conductive traces 106 respectively lead out a part of the electrical connection pads 103 provided on the wafer active surface 1001, and each of a part of the wafer conductive traces 106 interconnects and leads out a part of the electrical connection pads 103 provided on the wafer active surface 1001.

As shown in FIG. 4b, the protective layer 107 is applied to the wafer active surface 1001 and the wafer conductive layer 130.

In one embodiment, the protective layer 107 is applied by lamination.

Optionally, before the step of applying the protective layer 107, the wafer active surface 1001 and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

As shown in FIG. 4c, the protective layer opening 109 is formed on the surface of the protective layer 107.

Positions of at least a part of the protective layer openings 109 correspond to the wafer conductive layer 130, and the wafer conductive layer 130 is exposed through the protective layer opening 109; and the protective layer opening 109 has the lower surface 109a and the upper surface 109b.

In a preferred embodiment, the protective layer opening 109 has the shape such that the area of the upper surface 109b of the protective layer opening 109 is larger than the area of the lower surface 109a of the protective layer opening 109; in this case, the side wall 109c of the protective layer opening 109 has the slope which facilitates the filling of the conductive material, so that the conductive material is uniformly and continuously formed on the side wall during the filling process.

Preferably, a contact area of a single contact region between the wafer conductive layer 130 and the electrical connection pads 103 is smaller than a contact area of a single contact region between the wafer conductive layer 130 and the protective layer openings 109.

In a case that the wafer 100 is designed such that the exposed electrical connection pad 103 has a small area, by forming the conductive layer on the wafer active surface 1001 and then forming the protective layer opening, a difficulty in forming the protective layer opening is effectively reduced and a case that the protective layer opening 109 is difficult to form because the lower surface 109a of the protective layer opening is too small is avoided.

The protective layer opening 109 is formed by the laser patterning process or the photolithography patterning.

Optionally, the protective layer opening 109 is not formed in this step, and the protective layer opening 109 is formed in the protective layer for example after the process of peeling off the carrier.

Optionally, the conductive medium is filled in the protective layer opening 109 such that the protective layer opening 109 becomes the conductive filled via 124; at least one of the conductive filled vias 124 are connected with the wafer conductive layer 130; and the protective layer 107 surrounds the conductive filled via 124.

Figure 5A:
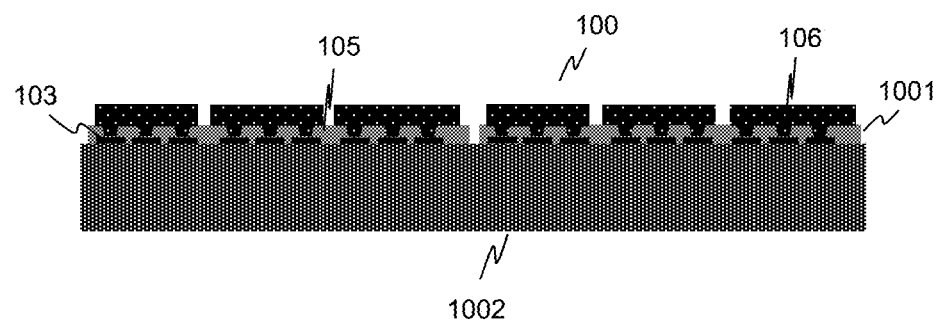
Figure 5B:
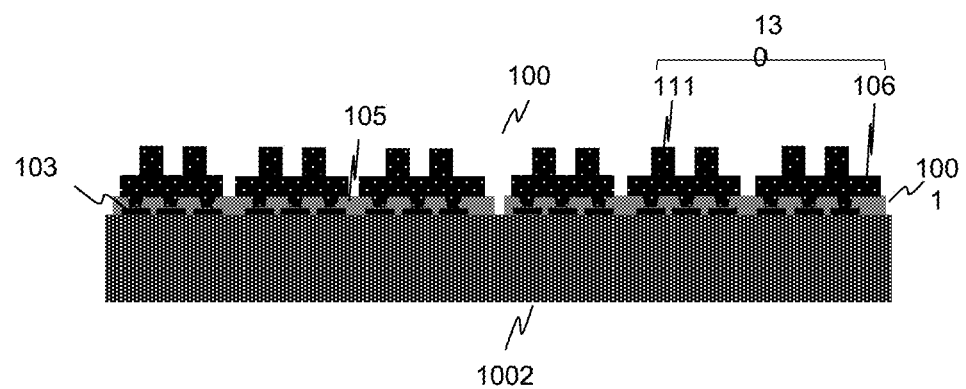
Figure 5C:
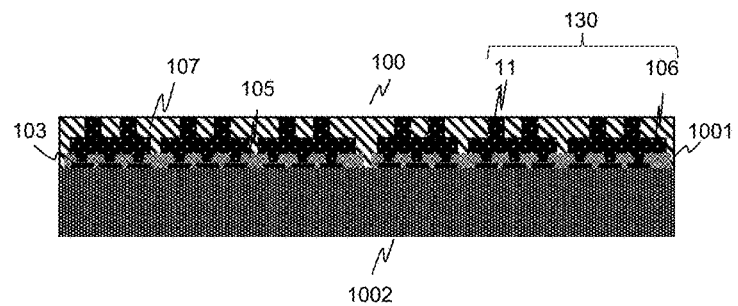

FIG. 5a to FIG. 5c show still another optional process of applying the protective layer 107 to the wafer active surface 1001.

As shown in FIG. 5a, the wafer conductive trace 106 is formed on the wafer active surface 1001.

The wafer conductive trace 106 for example is made of the material such as copper, gold, silver, tin, aluminum and the like, or a combination thereof, or other suitable conductive materials by PVD, CVD, sputtering, electrolytic electroplating, electrodeless electroplating, or other suitable metal deposition processes.

Each of at least a part of the wafer conductive traces 106 interconnects and leads out a plurality of electrical connection pads 103 of at least a part of the electrical connection pads 103.

Figure 6C:
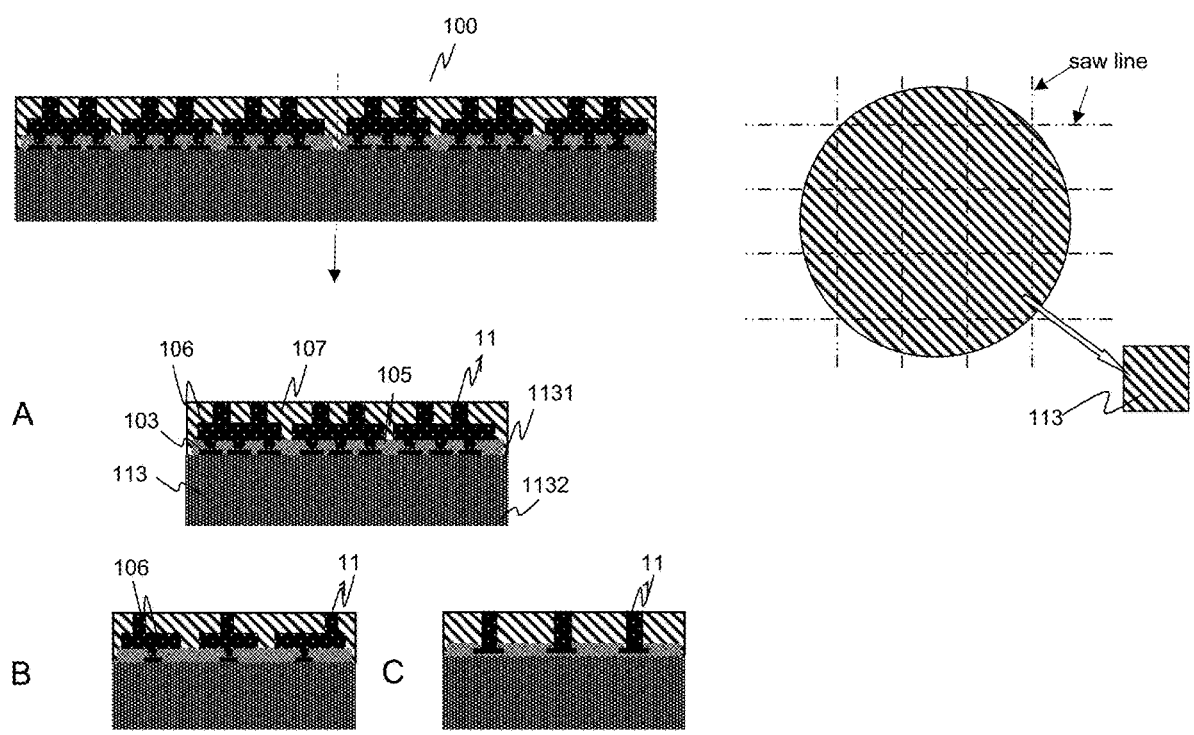

At least a part of the wafer conductive traces 106 respectively lead out at least a part of the electrical connection pads 103, to obtain the die shown in a die schematic diagram B in FIG. 6c.

As shown in FIG. 5b, a wafer conductive stud 111 is formed on a pad or a connection point of the wafer conductive trace 106.

The wafer conductive stud 111 for example has a shape of a circle, or may have other shape such as an ellipse, a square, a line and the like. The wafer conductive stud 111 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Optionally, the wafer conductive stud 111 is directly formed on the electrical connection pad 103 provided on the wafer active surface 1001 and leads out the electrical connection pad 103, to obtain the die shown in a die schematic diagram C in FIG. 6c.

The wafer conductive trace 106 and/or the wafer conductive stud 111 are collectively referred to as the wafer conductive layer 130.

As shown in FIG. 5c, the protective layer 107 is applied to the wafer conductive layer 130.

The protective layer 107 is applied onto the wafer conductive layer 130 to cover the wafer conductive layer 130.

In one embodiment, the protective layer 107 is applied by lamination.

In one embodiment, the protective layer 107 is applied so that the protective layer 107 completely covers the wafer conductive layer 130, in this case, the protective layer 107 is thinned to expose a surface of the wafer conductive layer after the application process of the protective layer 107.

In another embodiment, the protective layer 107 is applied to have a thickness such that a surface of the wafer conductive layer 130 is just exposed.

Optionally, before the step of applying the protective layer 107, the wafer active surface 1001 formed with the wafer conductive layer 130 and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

The protective layer 107 is applied to the wafer active surface 1001 in step S2, the protective layer 107 prevents a permeation of a molding material so as to protect the active surface 1131 of the die from being damaged during a molding process; meanwhile, during the molding process, a molding pressure is not easy to cause a position shift of the die 113 on a carrier (also called as first carrier) 117; in addition, an alignment accuracy requirement of a subsequent process of forming a panel-level conductive layer is lowered.

The protective layer 107 is made of an insulating material, optionally, for example, benzocyclobutene (BCB), polyimide (PI), polybenzoxazole (PBO), polymer-based dielectric film, organic polymer film, or is made of other material having similar insulation and structural properties, by lamination, coating and printing, etc.

Preferably, the protective layer 107 has a Young's modulus in a range of 1,000 MPa to 20,000 MPa; more preferably, the protective layer 107 has a Young's modulus in a range of 1,000 MPa to 10,000 MPa; further preferably, the protective layer 107 has a Young's modulus in a range of 1,000 MPa to 7,000 MPa, 4,000 MPa to 7,000 MPa, or 4,000 MPa to 8,000 MPa; and in a most preferred embodiment, the protective layer 107 has a Young's modulus of 5,500 MPa.

Preferably, the protective layer 107 has a thickness in a range of 15 μm to 50 μm; more preferably, the protective layer 107 has a thickness in a range of 20 μm to 50 μm; in a preferred embodiment, the protective layer 107 has a thickness of 35 μm; in another preferred embodiment, the protective layer 107 has a thickness of 45 μm; and in still another preferred embodiment, the protective layer 107 has a thickness of 50 μm.

The protective layer 107 has the Young's modulus in the range of 1,000 MPa to 20,000 MPa; on one hand, the protective layer 107 is soft and has good flexibility and elasticity; on the other hand, the protective layer provides sufficient supporting force so that the protective layer 107 provides sufficient support for a conductive layer formed on the surface of the protective layer 107. Meanwhile, the protective layer 107 has the thickness in the range of 15 μm to 50 μm, it is ensured that the protective layer 107 provides sufficient buffering and support.

Particularly, in some types of chips, it is required not only that a thin die is packaged, but also that the conductive layer has a certain thickness suitable for a large electric flux; at this time, it is selected that the protective layer 107 has the thickness in the range of 15 μm to 50 μm and has the Young's modulus in the range of 1,000 MPa to 10,000 MPa. The soft and flexible protective layer 107 forms a buffer layer between the die 113 and the conductive layer formed on the surface of the protective layer, so that the conductive layer on the surface of the protective layer does not excessively press the die 113 and the die 113 is prevented from being broken under pressure of the thick and heavy conductive layer during the chip is used. Meanwhile, the protective layer 107 has a sufficient strength, so that the protective layer 107 provides sufficient support for the thick and heavy conductive layer.

In the case that the protective layer 107 has the Young's modulus in the range of 1,000 MPa to 20,000 MPa, especially in the case that the protective layer 107 has the Young's modulus in the range of 4,000 MPa to 8,000 MPa and has the thickness in the range of 20 μm to 50 μm, due to material properties of the protective layer 107, the protective layer 107 effectively protects the die against a pressure from a pin of a die bonder machine during a subsequent process of transferring the die.

The die transferring process is a reconstruction process of arranging and adhering the die 113 which has underwent the cutting and separating process onto the carrier 117; the die transferring process adopts the die bonder machine; the die bonder machine includes the pin; the die 113 on the wafer 100 is jacked up by the pin, and the die 113 which is jacked up is sucked by a bonder head, and then is transferred and bonded to the carrier 117.

During the process that the pin jacks up the die 113, the die 113, especially the thin die 113, is brittle and is easily broken under the jacking pressure of the pin, so the protective layer 107 having the above material properties protects the brittle die 113 to maintain integrity of the die 113 even under a relatively large jacking pressure.

Preferably, the protective layer 107 is an organic/inorganic composite material layer including filler particles. For example, the filler particles are inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In a preferred embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

An organic material has advantages of easy operation and easy application, and the die 113 to be packaged is made of an inorganic material such as silicon; if the protective layer 107 is only made of the organic material, a difference between material properties of the organic material and material properties of the inorganic material may increase a difficulty in the packaging process and affect a packaging effect. By employing the organic/inorganic composite material in which the inorganic particles are added to the organic material, the material properties of the organic material is modified, so that the material of the protective layer 107 has properties of both the organic material and the inorganic material.

Especially with respect to a coefficient of thermal expansion (CTE), the silicon die 113 has a relatively low coefficient of thermal expansion, usually about 3 ppm/K, and the protective layer 107 is the organic/inorganic composite material layer including the filler particles to reduce the coefficient of thermal expansion of the protective layer, so that a difference in properties between the organic layer and the inorganic layer in the package structure is reduced.

In a preferred embodiment, in the case that T<Tg, the protective layer 107 has a coefficient of thermal expansion in a range of 3 ppm/K to 10 ppm/K; in a preferred embodiment, the protective layer 107 has a coefficient of thermal expansion of 5 ppm/K; in a preferred embodiment, the protective layer 107 has a coefficient of thermal expansion of 7 ppm/K; and in a preferred embodiment, the protective layer 107 has a coefficient of thermal expansion of 10 ppm/K.

In a subsequent molding process, the die 113 applied with the protective layer 107 expands and contracts correspondingly during heating and cooling processes of the molding process; in the case that the protective layer 107 has the coefficient of thermal expansion in the range of 3 ppm/K to 10 ppm/K, the protective layer 107 and the die 113 maintain a relatively uniform degree of expansion and contraction, so that an interface stress is not easily caused at a bonding interface between the protective layer 107 and the die 113, and thus the bonding between the protective layer 107 and the die 113 is not easily destroyed and the packaged chip is more stable.

The chip after being packaged often needs to undergo a thermal cycle during being used; in the case that the protective layer 107 has the coefficient of thermal expansion in the range of 3 ppm/K to 10 ppm/K, which is the same as or similar to the coefficient of thermal expansion of the die 113, the protective layer 107 and the die 113 maintain a relatively uniform degree of expansion and contraction in the thermal cycle, so that accumulation of interface fatigue at the interface between the protective layer 107 and the die 113 is avoided, and thus the packaged chip becomes more durable and a service life of the packaged chip is prolonged.

On the other hand, if the coefficient of thermal expansion of the protective layer 107 is further reduced, the composite material of the protective layer 107 has to be filled with too many filler particles and the Young's modulus of the material is increased while the coefficient of thermal expansion is further reduced, so that the flexibility of the protective layer is reduced, resulting in excessively strong rigidity but a poor buffering effect of the protective layer 107. It is most preferable to limit the coefficient of thermal expansion of the protective layer to be 5 ppm/k to 10 ppm/k.

In the case that the protective layer opening is formed by laser patterning process, the filler particles in the protective layer 107 (for example, the inorganic oxide particles, such as $SiO_2$ particles) preferably have a diameter of less than 3 μm; preferably, the filler particles in the protective layer 107 (for example, the inorganic oxide particles, such as $SiO_2$ particles) have a diameter between 1 μm and 2 μm.

Controlling the diameter of the filler particles to be less than 3 μm facilitates the protective layer opening formed in the protective layer 107 by the laser patterning process to have a smoother side wall, so that the conductive material is sufficiently filled in the conductive material filling process, to avoid a case that, due to a side wall 109c of the protective layer opening 109 having large-sized unevenness, the protective layer opening cannot be filled by the conductive material at a lower side of the side wall that is shielded by a protrusion, and further avoid a case that a conductive property of the conductive filled via 124 is adversely affected.

Meanwhile, by controlling the diameter of the filler particles to be 1 μm to 2 μm, the filler particles with such small diameter will be exposed during the laser patterning process, so that the side wall 109c of the protective layer opening 109 has a certain roughness; in this case, the side wall having a certain roughness and the conductive material have a larger contact area therebetween and thus contact each other more closely, so as to form the conductive filled via 124 with better conductivity.

The above-described diameter of the filler particles is an average value of the diameters of the filler particles.

Optionally, the protective layer 107 has a tensile strength in a range of 20 MPa to 50 MPa; and in a preferred embodiment, the protective layer 107 has a tensile strength of 37 MPa.

Optionally, after the process of applying the protective layer 107 to the wafer active surface 1001, the wafer back surface 1002 is ground to thin the wafer 100 to a desired thickness.

Modern electronic devices are small and lightweight, and thus the chip has a tendency of becoming thinner; in the step, the wafer 100 sometimes needs to be thinned to a very small thickness. However, it is very difficult to process and transfer the thin wafer 100, and a process of grinding and thinning the thin wafer 100 is also difficult, so it is usually difficult to thin the wafer 100 to a desired thickness. In the case that the surface of the wafer 100 has the protective layer 107, the protective layer 107 having the above material properties supports the wafer 100, so that the difficulties in processing, transferring and thinning the wafer 100 are reduced.

Step S3: cutting the wafer 100 applied with the protective layer 107 to form the die 113 having the protective layer 107.

As shown in FIG. 6a, the wafer 100 applied with the protective layer 107 is cut along a cutting line, to obtain a plurality of dies 113 formed with the protective layer; and the die 113 has a die active surface 1131 and a die back surface 1132.

As shown in FIG. 6b, the wafer 100 formed with the wafer conductive layer 130, applied with the protective layer 107 and formed with the protective layer opening 109 is cut along the cutting line, to obtain a plurality of dies 113; and the die 113 has the die active surface 1131 and the die back surface 1132.

As shown in the die schematic diagram A in FIG. 6b, the wafer conductive trace 106 interconnects and leads out a plurality of electrical connection pads 103 provided on the die active surface 1131.

As shown in the die schematic diagram B in FIG. 6b, the wafer conductive traces 106 respectively lead out the electrical connection pads 103 provided on the die active surface 1131.

As shown in FIG. 6c, the wafer 100 formed with the wafer conductive layer 130 and applied with the protective layer 107 is cut along the cutting line, to obtain a plurality of dies 113; and the die 113 has the die active surface 1131 and the die back surface 1132.

As shown in the die schematic diagram A in FIG. 6c, the wafer conductive trace 106 interconnects and leads out a plurality of electrical connection pads 103 provided on the die active surface 1131.

As shown in the die schematic diagram B in FIG. 6c, the wafer conductive traces 106 respectively lead out the electrical connection pads 103 provided on the die active surface 1131.

As shown in the die schematic diagram C in FIG. 6c, the wafer conductive stud 111 is directly formed at the electrical connection pad 103 provided on the wafer active surface 1001, and leads out the electrical connection pad 103.

Optionally, before the step of cutting the wafer 100 to separate out the dies 113, the method further comprises: performing plasma surface treatment on the surface, applied with the protective layer 107, of the wafer 100 to increase surface roughness, so that adhesiveness of the die 113 to the carrier 117 in a subsequent process is increased and thus position shift of the die under the package pressure is less likely to occur.

Due to the material properties of the protective layer, the die 113 which is separated out in the process of cutting the wafer 100 has no burrs and chippings.

It should be understood that, if the process permits, the wafer conductive layer 130 and/or the protective layer 107 for example are/is formed on the die active surface 1131 of each die 113 after the wafer 100 is cut into the dies 113 to be packaged according to specific practical situations. The wafer conductive layer 130 refers to a conductive layer formed before the die 113 obtained by cutting the wafer 100 is adhered to the carrier.

Step S4: providing a metal structure.

Figure 7:
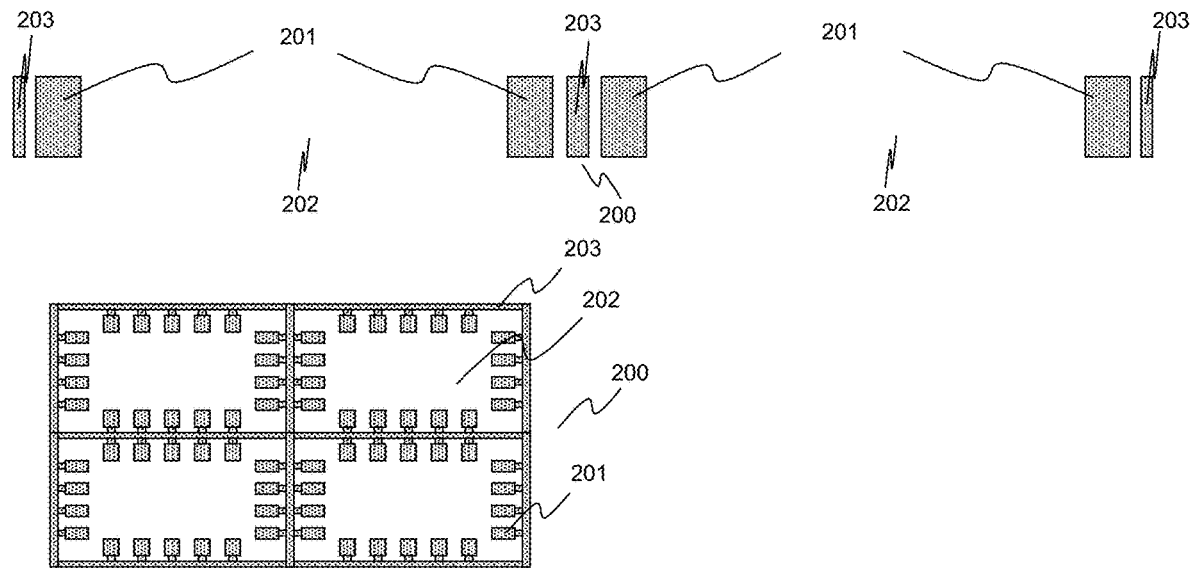

According to the embodiment shown in FIG. 7, the metal structure is a metal frame 200, and the metal frame 200 comprises an array of metal units. The metal frame 200 for example is an existing lead frame in the industry, or is formed by etching or mechanical stamping one sheet or one block of metal piece according to actual needs. The metal piece to be patterned for example is made of a single metal such as copper, or an alloy. A surface of the metal piece for example is partially or completely coated with a second metal such as nickel and/or gold, to protect the metal piece from environmental erosion such as oxidation. In some implementations, a thickness of the metal piece is not less than the thickness of the die 113. In other implementations, the thickness of the metal piece may be initially less than the thickness of the die 113, but the two thicknesses of the metal piece and the die 113 would be substantially the same after the die 113 is ground for reducing a profile of the packaged chip in thickness. The metal piece to be patterned for example has a shape of a rectangle, or a square, or other shape. As shown in FIG. 7, the metal piece is patterned to include 4 identical metal units and each of the metal units has a rectangular outer contour; however, such design is exemplary, the amount of the metal units is not limited to 4 and may be set according to actual needs, and the metal unit may have a shape of a rectangle, or other shape. A blank region in the metal unit indicates a region in which the metal is completely etched away, a reserved metal portion includes a metal feature, and different metal features bring different performance improvements.

The lead frame will be embedded inside a molding layer 1213 described below; and thus is also called embedded lead frame (ELF). Alternative to the lead frame, the metal frame 200 may include molded interconnect substrate (MIS) or other conductive substrates having the same or similar functions of the lead frame as described above.

In FIG. 7, the metal feature includes at least one connection pad 201; these connection pads 201 are arranged on an inner side of an outer contour edge of the metal frame 200, or are arranged at other position according to actual needs; and the connection pads 201 are connected by a connection bar 203 made of the metal that is not etched away. The connection pad 201 is a pin of the packaged die; according to the present disclosure, after the die 113 is packaged, the connection pads 201 are in an exposed state, and the packaged die 113 is soldered to a circuit board through these connection pads 201, to implement connection of the packaged die 113 with other circuit elements. The connection bar 203 is reserved during the metal piece is patterned to ensure that the connection pads 201 and some other features formed by patterning are connected with the outer contour edge of the metal frame 200, so that it is ensured that the features patterned on the metal frame 200 will not fall during transferring the metal frame 200. Optionally, the metal piece is firstly affixed onto a temporary support for patterning, and after the patterning is completed, the metal frame is transferred by means of the temporary support; in this case, it is not necessary to form a connection line/the connection bar.

Each metal unit in the metal frame 200 shown in FIG. 7 includes a vacancy 202; the vacancy 202 is shown as the blank region in the drawing; and the blank region is formed by completely etching away a portion of the metal piece and has an area larger than a surface area of the die 113, to facilitate adhering the die 113 and the metal frame 200 to the carrier without the metal frame 200 contacting the die 113 in a subsequent step. According to the example in the drawing, each metal unit includes the vacancy 202; in another example, one metal unit for example includes two or more vacancies 202, and each vacancy 202 accommodates one or more dies 113. Adjacent metal units have a common outer contour edge, as shown in FIG. 7, a metal unit at an upper left corner respectively has a common outer contour edge with a metal unit on a right side thereof and a metal unit on a lower side thereof, so that all the metal units are connected into a whole.

The metal frame 200 according to the present disclosure shown in FIG. 7 is merely exemplary; an entirety of the metal piece for example has an area equal to a surface area of the carrier 117, and has a shape identical to a shape of the carrier 117, which is preferably a rectangle or an oblong or is designed into other shape according to actual needs. However, it is found in experiments that, in a case where the area of the carrier 117 is relatively large, if the metal piece as large as the carrier 117 is employed to form the metal frame 200 by etching, it is easily deformed in a transferring process and is difficult to operate because the metal piece is relatively thin with a larger area. Therefore, preferably, two or more metal pieces having a sum of areas equal to the surface area of the carrier 117 are employed, and one or more metal frames 200 is formed on each metal piece by etching; and in a fabrication process, the metal pieces each of which has been etched are sequentially arranged on the carrier 117, and then put together to obtain area equal to the surface area of the carrier 117.

Step S5: providing the die 113 having the protective layer 107 and the metal structure onto the carrier 117.

Figure 8A:
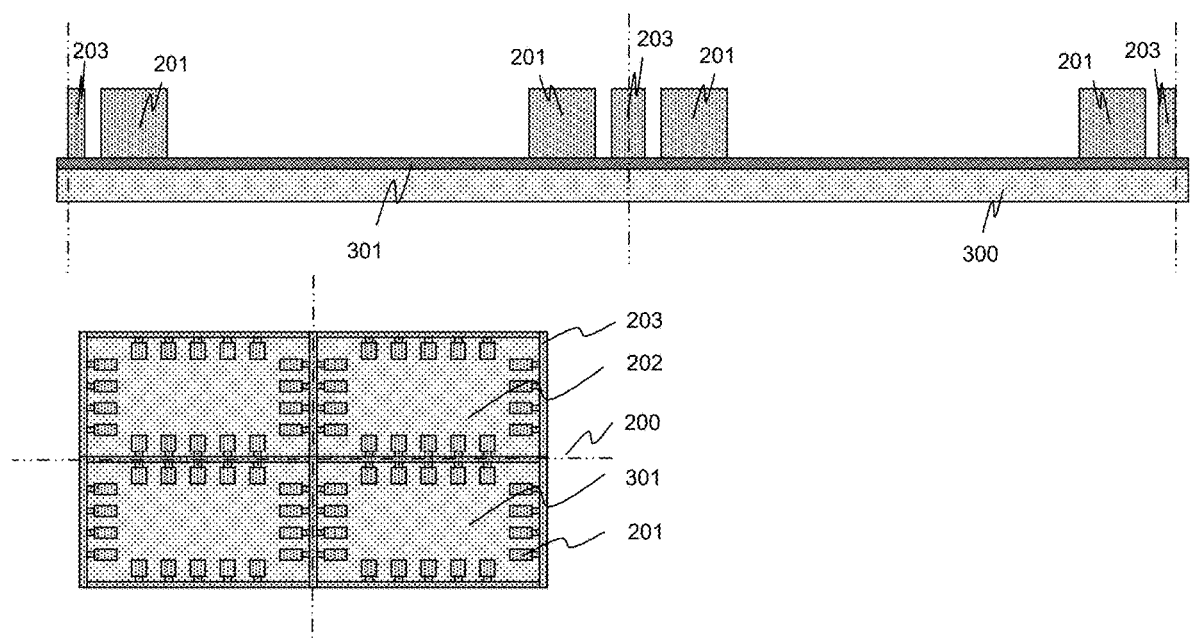
Figure 8B:
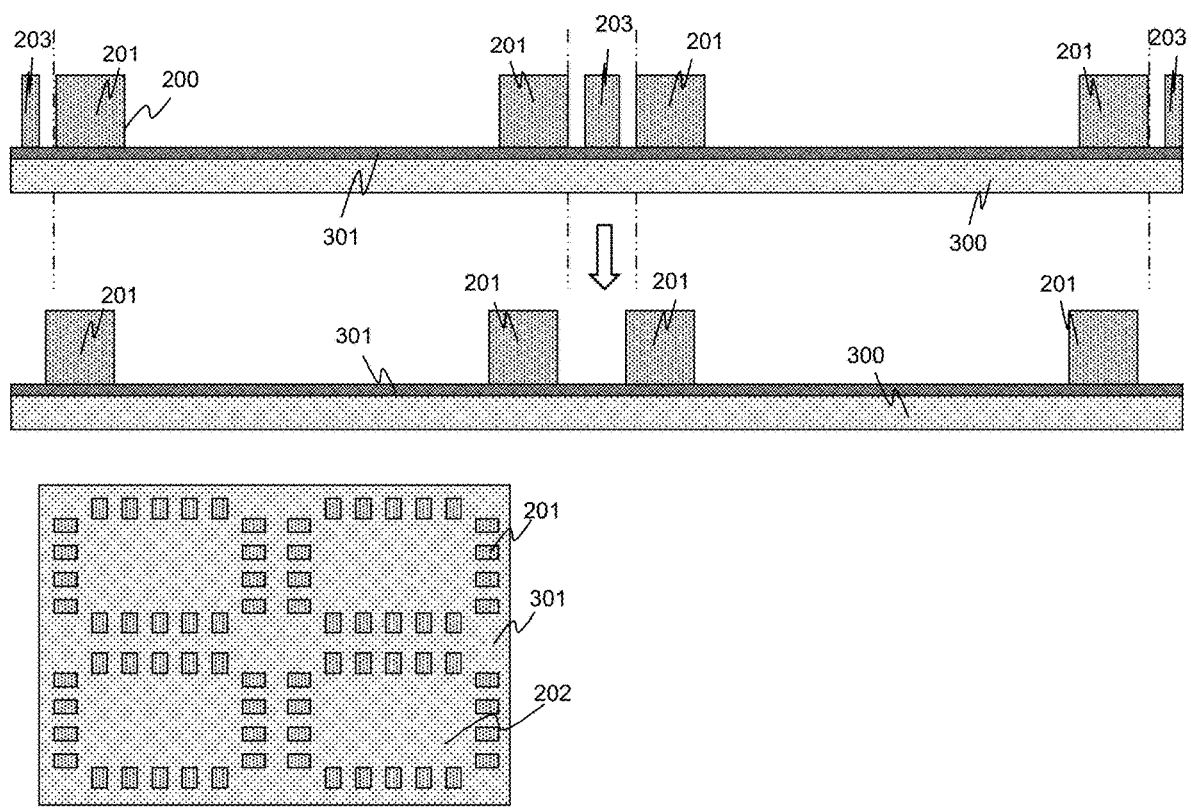
Figure 9:
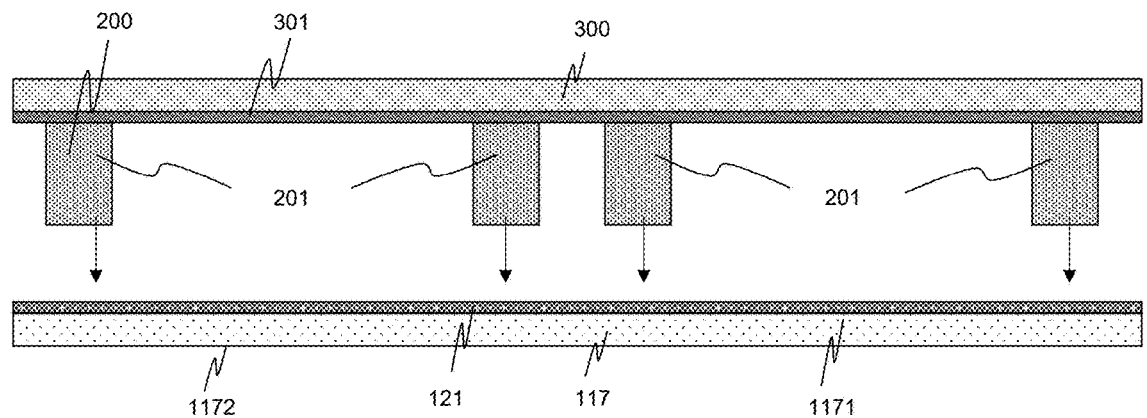

FIG. 8a to FIG. 9 show a preferred implementation mode of providing the metal frame onto the carrier in step S5.

Because the metal frame 200 is relatively thin, especially in the case that the area is relatively large, the metal frame 200 is easily bent and deformed during the metal frame 200 is taken and placed; so in order to more conveniently adhere the metal frame 200 to the carrier 117 accurately while keeping the metal frame 200 flat, a mode below for example is employed.

As shown in FIG. 8a and FIG. 8b, a temporary support 300 is provided, an adhesive layer 301 is formed on a surface of the temporary support 300, and the patterned metal frame 200 is affixed to the temporary support 300 by adhering; optionally, the temporary support 300 is omitted, the adhesive layer 301 with a large thickness is used directly as the temporary support 300 to transport the patterned metal frame 200. Preferably, the temporary support 300, the adhesive layer 301 and the carrier 117 are same in shape and size. In addition, two opposed surfaces of the connection pad 201 of the metal frame 200 in contact with and remote from the adhesive layer 301 are defined as a connection pad back surface 2012 and a connection front surface 2011, respectively.

Preferably, as shown in FIG. 8a, after the metal frame 200 is adhered onto the temporary support 300, the connection bar 203 is cut to separate the metal frame 200. Optionally, each of the connection bars 203 connecting the respective metal units is cut, so that the metal units adhered onto the temporary support 300 are separated from one another; or the connection bars 203 within a certain region are cut to separate the entire metal frame 200 on the temporary support 300 into two portions, four portions, six portions, or any other number of portions. Preferably, a cutting line is along a central line of the connection bar 203. The method has advantages that: during the packaging process, it is often necessary to perform heating and cooling processes; if the entire metal frame 200 is separated into units having a smaller area or the entire metal frame 200 is directly separated into the metal units independent of each other, then during the heating and cooling processes in the packaging process, the metal frame 200 having a smaller area or the metal unit expand and contract independently, and a degree of expansion and contraction of each unit is small due to the smaller area, so that it is easier to control and operate the packaging process.

Preferably, as shown in FIG. 8b, after the metal frame 200 is adhered onto the temporary support 300, the connection bars 203 are separated and removed from the metal frame 200, so as to separate the metal units in the metal frame 200; as shown in FIG. 8b, the connection pads 201 become portions independent of each other. Because the features on the metal frame are independent of each other, a panel-level test for example is performed prior to cutting, which greatly reduces costs and time for tests.

As shown in FIG. 9, the carrier 117 is provided, and the carrier 117 has a carrier front surface 1171 and a carrier back surface 1172. The carrier 117 for example has a shape of a circle, a triangle, a quadrangle or any other shape; the carrier 117 for example has a size of a small-sized wafer substrate, or has various sizes, particularly is a large-sized rectangular carrier; and the carrier 117 for example is made of metal, non-metal, plastic, resin, glass and stainless steel, etc. Preferably, the carrier 117 is a large-sized quadrangular stainless steel panel.

The carrier 117 has the carrier front surface 1171 and the carrier back surface 1172, and the carrier front surface 1171 is a flat surface.

The die 113 is bonded and fixed onto the carrier 117 by the adhesive layer 121.

The adhesive layer 121 for example is formed on the carrier front surface 1171 by lamination, printing, spraying and coating, etc. In order to facilitate separation of the carrier 117 from the die 113 whose back side has been packaged in a subsequent process, the adhesive layer 121 is preferably made of a material capable of being easily separated, for example, a thermal-releasing material.

A side of the temporary support 300 that is adhered with the metal frame 200 faces the carrier front surface 1171; the temporary support 300 has a surface area equal to the surface area of the carrier 117, and a shape same as that of the carrier 117; the temporary support 300 and the carrier 117 are aligned to get in contact with each other, the metal frame 200 is affixed onto the adhesive layer 121, then the temporary support 300 is peeled off, and the adhesive layer 301 on the metal frame 200 is removed, so as to complete the affixing of the metal frame 200 onto the carrier 117.

In the step, preferably, the metal frame 200 is aligned onto the carrier 117 by alignment marks (not shown) previously formed on the carrier 117 and the metal frame 200, and the metal frame 200 is adhered onto the carrier 117 by the adhesive layer 121.

In addition, optionally, a metal foil or a metal sheet for example is adhered to the temporary support 300 by the adhesive layer 301 provided on the temporary support 300, then the metal foil or the metal sheet is etched into a desired pattern to form the patterned metal frame 200, and then the metal frame 200 is transferred onto the carrier 117.

A surface of the metal frame 200 that faces the carrier 117 is defined as a metal frame front surface, and a surface that faces away from the carrier 117 is defined as a metal frame back surface. A metal structure front surface and a metal structure back surface, a metal unit front surface and a metal unit back surface, a metal feature front surface and a metal feature back surface are defined in same way.

Figure 10:
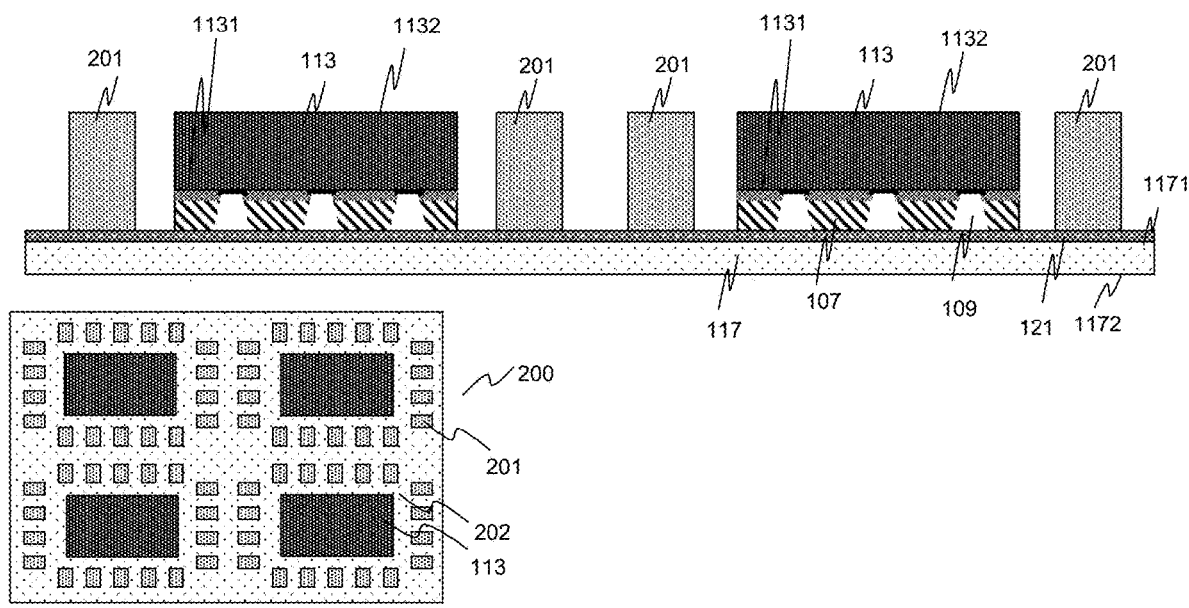

FIG. 10 shows an implementation mode of providing the die 113 onto the carrier 117 in step S5.

Because the metal frame 200 which is embodied as the connection pads 201 in FIG. 10 has been adhered onto the adhesive layer 121 provided on the carrier front surface 1171, it should be ensured that the die 113 does not get in contact with the metal frame 200 during the die 113 is adhered; in the present disclosure, the die 113 is adhered in the vacancy 202 of the metal frame 200; optionally, one vacancy 202 corresponds to one die 113 or one vacancy 202 corresponds to two or more dies 113. Preferably, a position mark for arranging the die 113 is provided on the carrier 117, the mark for example is formed on the carrier 117 by laser, mechanical patterning, etc.; and meanwhile, an alignment mark is provided on the die 113 to aim for and align with a position for adhering on the carrier 117 during adhering. FIG. 10 is merely an exemplary diagram, and only shows that the die 113 adhered onto the adhesive layer 121 of the carrier 117 is in a form of the die having the protective layer 107 and the protective layer opening 109 as shown in FIG. 6a. The die adhered onto the adhesive layer 121 of the carrier 117 may be in a form of the die having the wafer conductive layer 130 and the protective layer 107 as well as the protective layer opening 109 as shown in FIG. 6b, or may be in a form of the die having the wafer conductive layer 130 and the protective layer 107 as shown in FIG. 6c. Meanwhile, the metal frame 200 adhered on the adhesive layer 121 may be the metal frame 200 which only has the connection bar 203 cut but not removed as shown in FIG. 8a, or may be the metal frame 200 having a complete connection bar 203.

As shown in FIG. 10, one metal unit corresponds to one die 113, the amount of the dies 113 on the carrier 117 is equal to the amount of the metal units on the carrier 117, and an arrangement mode of the dies 113 corresponds to an arrangement mode of the metal units on the carrier 117. The amount of the metal units and the arrangement mode of the metal units are not limited to those shown in FIG. 10, but may be designed according to actual needs.

In addition, one metal unit for example corresponds to two or more dies 113, and the plurality of dies 113 are placed in the pre-formed vacancy 202; particularly, the two or more dies are two or more dies having different functions, the plurality of dies are arranged in the metal unit on the carrier 117 according to actual product requirements, then are packaged, and further are cut into a plurality of package bodies after packaging is completed; and thus, one package body includes the plurality of dies so as to form a multi-chip module (MCM), and positions of the plurality of dies may be freely set according to actual product requirements.

A mounting order shown in FIG. 9 to FIG. 10 is that: firstly, the metal frame 200 is mounted on the carrier 117, and then the die 113 is mounted on the carrier 117; however, this is merely exemplary, and the mounting order may be that: firstly, the die 113 is mounted on the carrier 117, and then the metal frame 200 is mounted on the carrier 117.

Step S6: forming the molding layer 123 on the carrier 117.

Figure 11:
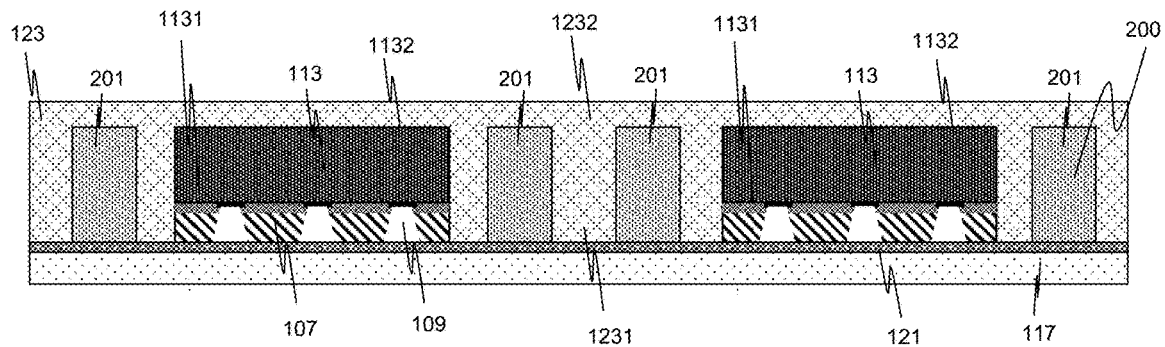

As shown in FIG. 11, the molding layer 123 covers the entire carrier 117 to encapsulate all of the dies 113 and the metal frames 200 (each of the metal frames 200 is embodied as the connection pads 201 in FIG. 11), so as to reconstruct a flat-plate structure; after the carrier 117 is peeled off, a subsequent packaging step is continued on the reconstructed flat-plate structure.

A surface of the molding layer 123 that is in contact with the carrier front surface 1171 or the adhesive layer 121 is defined as a molding layer front surface 1231. A surface of the molding layer 123 that faces away from the carrier front surface 1171 or the adhesive layer 121 is defined as a molding layer back surface 1232.

Preferably, the molding layer front surface 1231 and the molding layer back surface 1232 are substantially flat and parallel to the carrier front surface 1171.

The molding layer 123 for example is formed by paste printing, injection molding, hot press molding, compression molding, transfer molding, liquid sealant molding, vacuum lamination, or other suitable mode of molding. The molding layer 123 for example is made of an organic composite material, a resin composite material, a macromolecule composite material, a polymer composite material, such as an epoxy resin having a filler, an Ajinomoto buildup film (ABF) or other polymer having a suitable filler.

In one embodiment, the molding layer 123 is made of an organic/inorganic composite material by compression molding.

Optionally, before the molding layer 123 is formed, some pre-treatment processes such as chemical cleaning process and plasma cleaning process are performed to remove impurities on the surfaces of the die 113 and the metal frame 200, so that the molding layer 123 is bonded with the die 113, the metal frame 200 and the carrier 117 more closely without delamination or cracking.

Preferably, the molding layer 123 has a coefficient of thermal expansion in a range of 3 ppm/K to 10 ppm/K; in a preferred embodiment, the molding layer 123 has a coefficient of thermal expansion of 5 ppm/K; in another preferred embodiment; the molding layer 123 has a coefficient of thermal expansion of 7 ppm/K; and in still another preferred embodiment, the molding layer 123 has a coefficient of thermal expansion of 10 ppm/K.

Preferably, the molding layer 123 and the protective layer 107 have a same or similar coefficient of thermal expansion.

The coefficient of thermal expansion of the molding layer 123 is selected to be 3 ppm/K to 10 ppm/K, and is selected to be the same as or similar to the coefficient of thermal expansion of the protective layer 107; during heating and cooling processes of the molding process, the protective layer 107 and the molding layer 123 have a uniform degree of expansion and contraction, so that an interface stress is not easily caused between the protective layer 107 and the molding layer 123; and such low coefficient of thermal expansion of the molding layer 123 allows the molding layer 123, the protective layer 107 and the die 113 to have coefficients of thermal expansion close to one another, so that the molding layer 123, the protective layer 107 and the die 113 are bonded closely at the interfaces therebetween, to avoid their separations at the interfaces therebetween.

The packaged chip usually needs to undergo the thermal cycle during being used; in the case that the protective layer 107, the molding layer 123 and the die 113 have coefficients of thermal expansion close to one another, the protective layer 107, the molding layer 123 and the die 113 have little interface fatigue in the thermal cycle, and an interface gap is less likely to occur between the protective layer 107, the molding layer 123 and the die 113, so that a service life of the chip is prolonged and an application field of the chip is widen.

A difference in the coefficients of thermal expansion between the die 113 and the molding layer 123 may cause warpage of the panel after the molding process is completed; due to the warpage phenomenon, it is difficult to accurately position the die 113 in the panel in a subsequent process of forming the conductive layer, which thus has a great impact on the process of forming the conductive layer.

Particularly, in a large panel packaging process, because a size of the panel is relatively large, even slight panel warpage may cause the die in an outer peripheral portion of the panel that is away from a center of the panel to generate a greater position change as compared with the position of the die before being molded; so in the large panel packaging process, solving the warpage problem becomes one of key points of the whole process; and the warpage problem even limits magnification development of the size of the panel and becomes a technical barrier in the packaging process of the large-sized panel.

The coefficients of thermal expansion of the protective layer 107 and the molding layer 123 are limited to the range of 3 ppm/K to 10 ppm/K, and preferably, the molding layer 123 and the protective layer 107 have the same or similar coefficient of thermal expansion, so that occurrence of warpage of the panel is effectively avoided and the packaging process of the large panel is implemented.

Meanwhile, during the molding process, because the package pressure exerts a pressure, which is toward the carrier 117, onto the back side of the die 113, the pressure tends to press the die 113 into the adhesive layer 121, so that the die 113 sinks into the adhesive layer 121 in the process of forming the molding layer 123; after the molding layer 123 is formed, the die 113 and the molding layer front surface 1231 are not located in a same plane, and the surface of the die 113 protrudes beyond the molding layer front surface 1231 to form a stepped structure; during a subsequent process of forming the panel-level conductive layer, the panel-level conductive layer also has a corresponding stepped structure, which makes the package structure unstable.

In the case that the die active surface 1131 has the protective layer 107 with the above material properties, the protective layer 107 acts as a buffer under the package pressure to avoid the die 113 from sinking into the adhesive layer 121, so as to avoid generation of the stepped structure on the molding layer front surface 1231.

Figure 12:
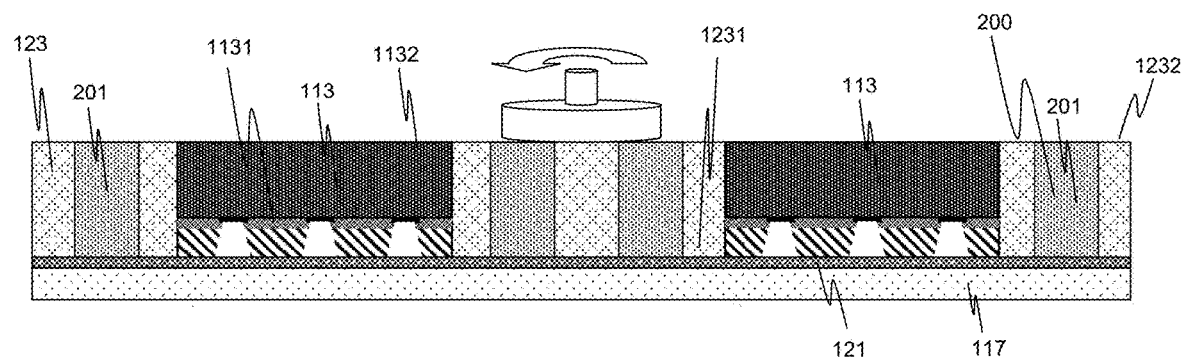

In order to expose the metal frame 200, it is further necessary to thin the molding layer 123, for example, the molding layer 123 is thinned by mechanically grinding or polishing the molding layer back surface 1232, so that the molding layer 123 is thinned to the back surface of the metal frame 200 to expose features on the surface of the metal frame 200. As shown in FIG. 12, in the case that a thickness of the metal frame 200 is thicker than that of the die 113, the molding layer 123 for example is further thinned to the die back surface 1132 of the die 113, so that the back surface of the metal frame 200 (represented as the connection pad back surface 2012 of the connection pad surface 201) and the die back surface 1132 of the die 113 are both exposed. For another example, if the die 113 is thicker than the metal frame 200, the molding layer 123 is thinned until the connection pad back surface 2012 is exposed from the molding layer 123. In this process, the die 113 is further thinned to the same thickness of the connection pad 201 and suitable for power modules due to shorter electrical conductance path and less electrical resistance.

Step S7: forming a second conductive structure 140 on the die back surface 1132 and a second dielectric layer 170.

The second conductive structure 140 is formed by using a method for forming a patterned conductive layer in a panel-level.

Figure 13:
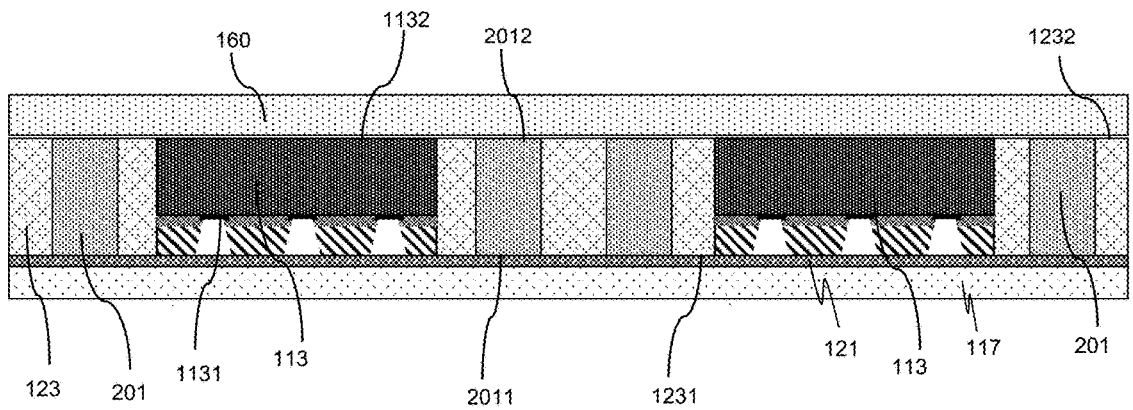

For example, the second conductive structure 140 is formed by a photolithograph process. As shown in FIG. 13, a dry film 160 is formed to cover the die back surface 1132, the molding layer back surface 1232 and the connection pad back surface 2012. The dry film 160 is a photosensitive film which can function as a plating mold. The dry film 160 may be adhered via a rolling process in which a heated roller applies a controlled pressure to simultaneously warm and press the dry film 160 onto the die back surface 1132, the molding layer back surface 1232 and the connection pad back surface 2012. Alternatively, the dry film 160 may be adhered via a vacuum process in which an elastomeric apparatus presses the dry film 160 onto the die back surface 1132, the molding layer back surface 1232 and the connection pad back surface 2012 when air is drawn to form vacuum around the dry film 160.

Figure 14:
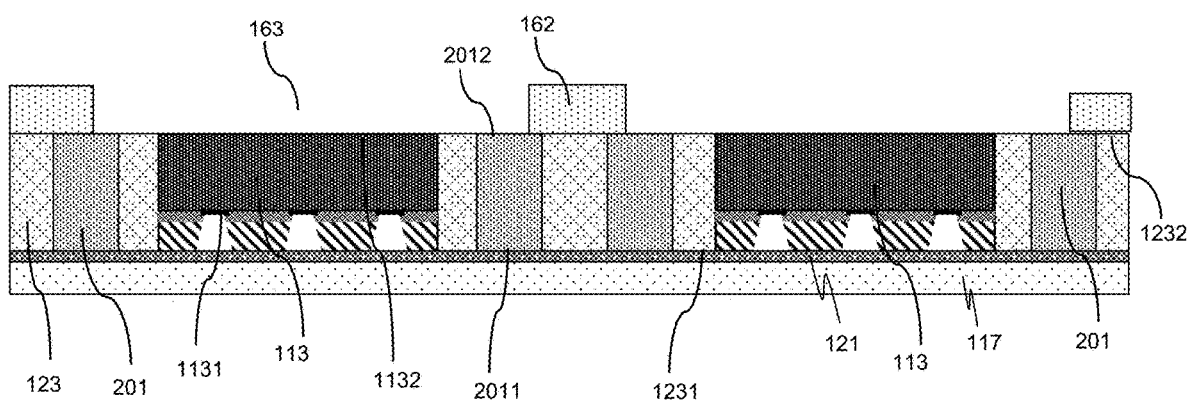

As shown in FIG. 14, the dry film 160 is subjected to a photolithography process forming a patterned dry film 162. In the photolithography, a mask (not shown) is positioned over the dry film 160 for covering a selected portion of the dry film 160 while an unselected portion of the dry film 160 is exposed through the mask to a light source for forming multiple dry film openings 163 of the patterned dry film 162. Accordingly, the die back surface 1132 (maybe either completely or a portion thereof) and at least a portion of the connection pad back surface 2012 are exposed from the dry film openings 163 of the patterned dry film 162.

Figure 15:
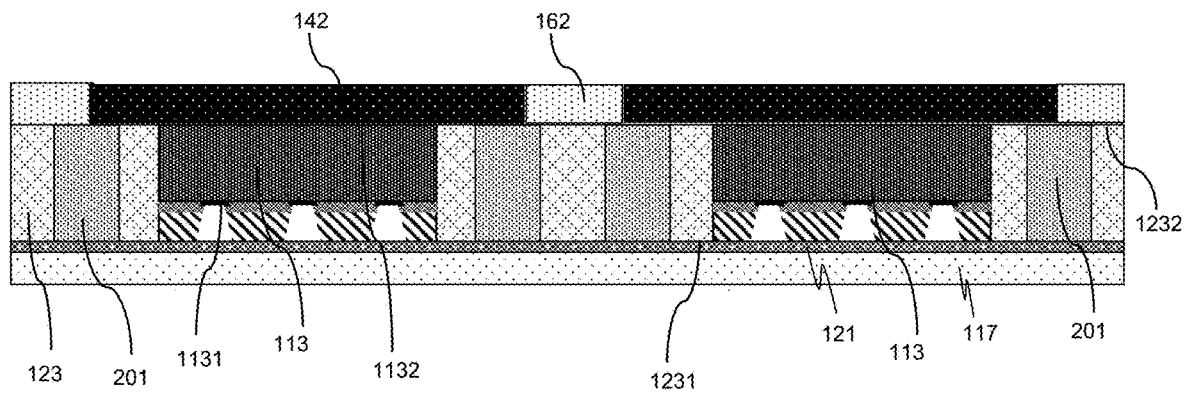

As shown in FIG. 15, a second panel-level conductive trace 142 is formed by filling the dry film openings 163 of the patterned dry film 162 with a conducive material such as copper, gold, silver, tin and aluminum or a combination thereof, or made of other suitable conductive material by PVD, CVD, sputtering, electrolytic electroplating, electrodeless electroplating, or other suitable metal deposition process. Therefore, the second panel-level conductive trace 162 covers the die back surface 1132 and at least a portion of the connection pad back surface 2012.

Figure 16:
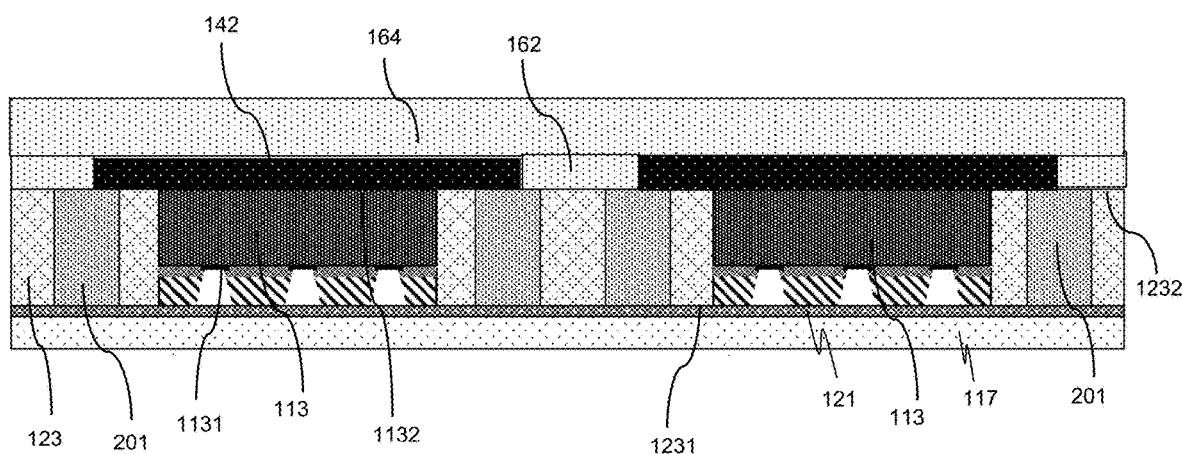

As shown in FIG. 16, another dry film 164 is formed to cover the patterned dry film 162 and the second panel-level conductive trace 142. Similar to the dry film 160, the dry film 164 is a photosensitive film which may be formed via a rolling process or a vacuum process as described above.

Figure 17:
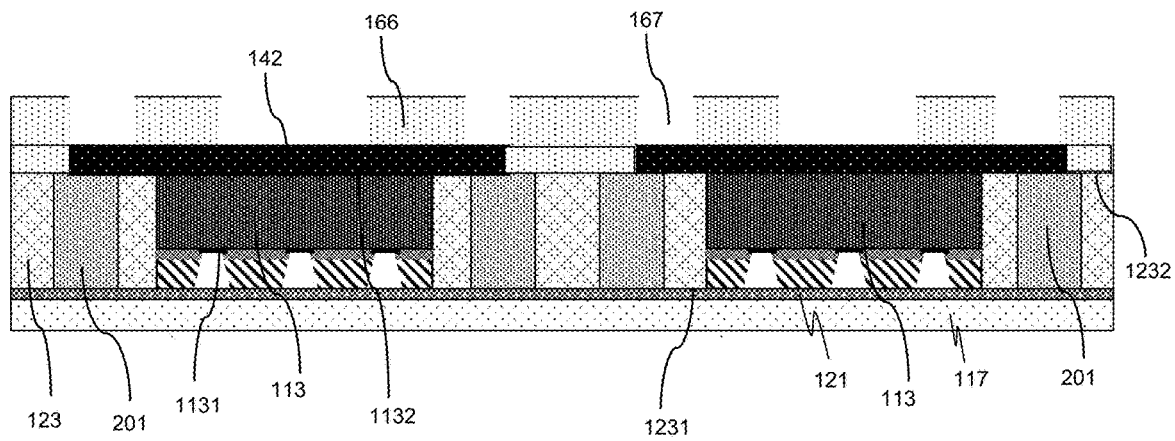

As shown in FIG. 17, the dry film 164 is also subjected to a photolithography process for forming a patterned dry film 166. The patterned dry film 166 has multiple dry film openings 167 where at least a portion of the second panel-level conductive trace 142 is exposed from. The patterned dry film 162 maybe either completely or partially covered by the pattern dry film 166.

Figure 18:
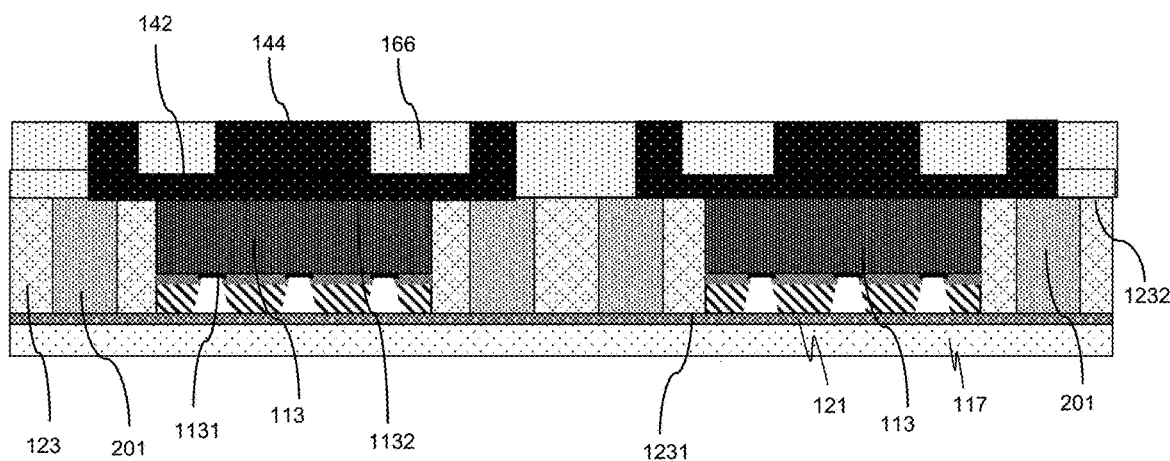

As shown in FIG. 18, a second panel conductive stud 144 is formed by filling the dry film openings 167 with a conductive material such as copper, gold, silver, tin and aluminum or a combination thereof, or made of other suitable conductive material by PVD, CVD, sputtering, electrolytic electroplating, electrodeless electroplating, or other suitable metal deposition process. As a result, the second panel conductive stud 144 is electrically connected to the second panel-level conductive trace 162 and further to the connection pad 201 of the meal frame 200.

Figure 19:
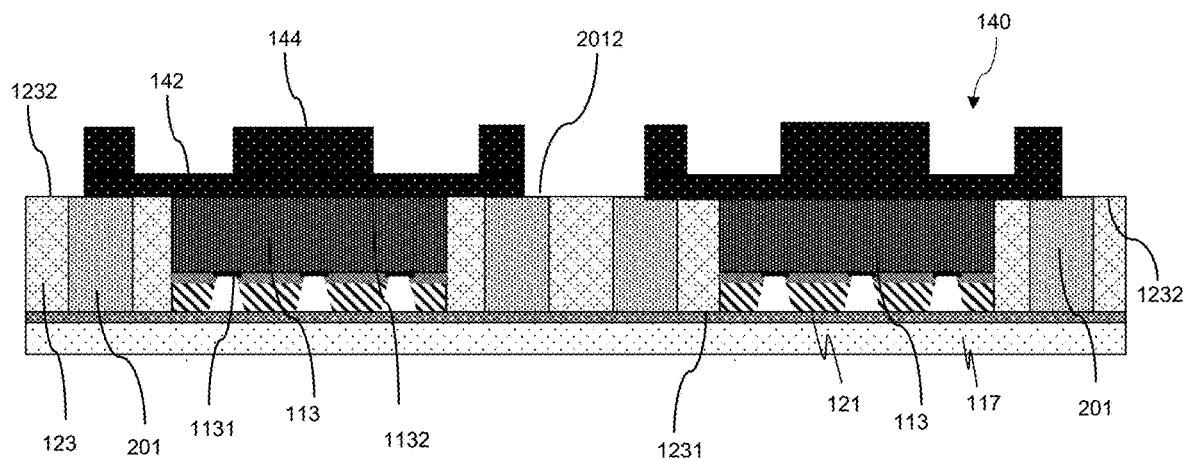

As shown in FIG. 19, the patterned dry film 162 and the patterned dry film 166 are removed; while the second panel-level conductive trace 142 and the second panel conductive stud 144 remain on the die back surface 1132 and the connection pad back surface 2012. The second panel-level conductive trace 142 and the second panel conductive stud 144 are collectively defined as the second conductive structure 140. In particular, the second conductive structure is conducted in a panel-level for increasing throughout and lowering manufacture costs.

A pattern of the second conductive structure 140 in FIG. 19 is merely exemplary, and the second conductive structure 140 may have various patterns according to specific circuit design.

Figure 20:
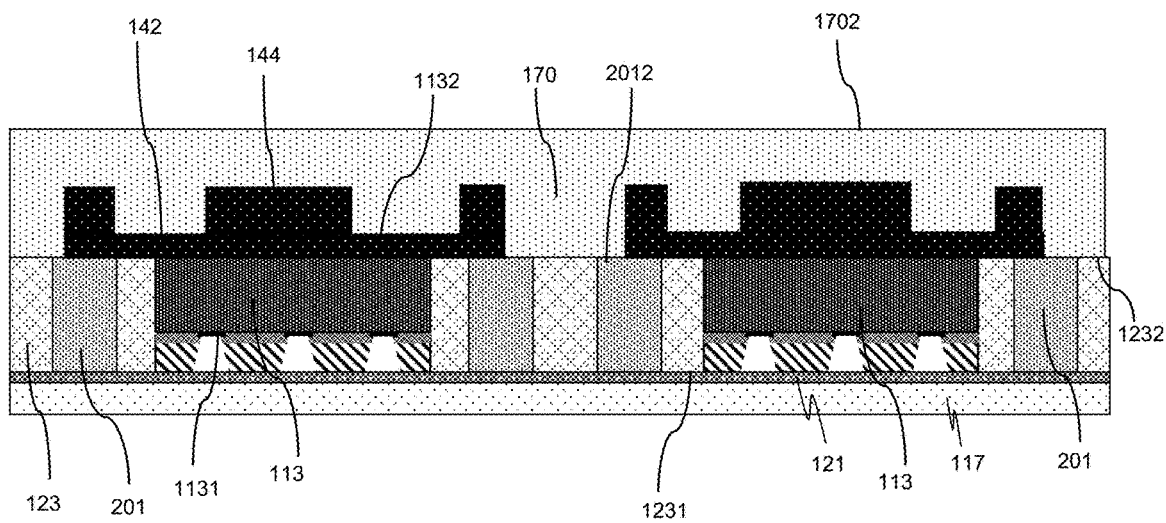

As shown in FIG. 20, the second dielectric layer 170 is formed to encapsulate the second conductive structure 140 (including the second panel-level conductive trace 142 and the second panel conductive stud 144) entirely. In addition, the second dielectric layer 170 may also to cover the molding layer back surface 1232 and the portion of the connection pad back surface 2012 uncovered by the second panel-level conductive trace 142. The second dielectric layer 170 may include epoxy mold compounds in forms of film, granule or liquid. The second dielectric layer 170 may have similar components and properties to the molding layer 123 as described hereabove. For example, the second dielectric layer 170 has a same or similar coefficient of thermal expansion (CTE) with the molding layer 123 so that an interface stress is not easily caused between the second dielectric layer 170 and the molding layer 123.

Figure 21:
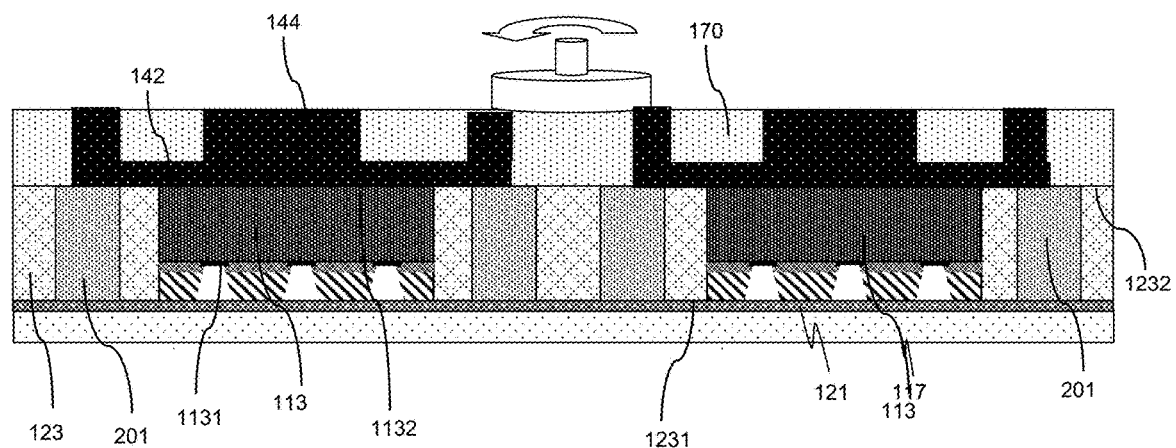

In order to expose the second panel-level conductive stud 144, it is further necessary to thin the second dielectric layer 170. As shown in FIG. 21, the second dielectric layer 170 is thinned by mechanically grinding or polishing a second dielectric layer back surface 1702 to the extent that the second panel-level conductive stud 144 is expose from the second dielectric layer 170.

Step S8: peeling off the carrier (also known as first carrier) 117 to form the panel assembly 150 having the second conductive structure 140.

Figure 22:
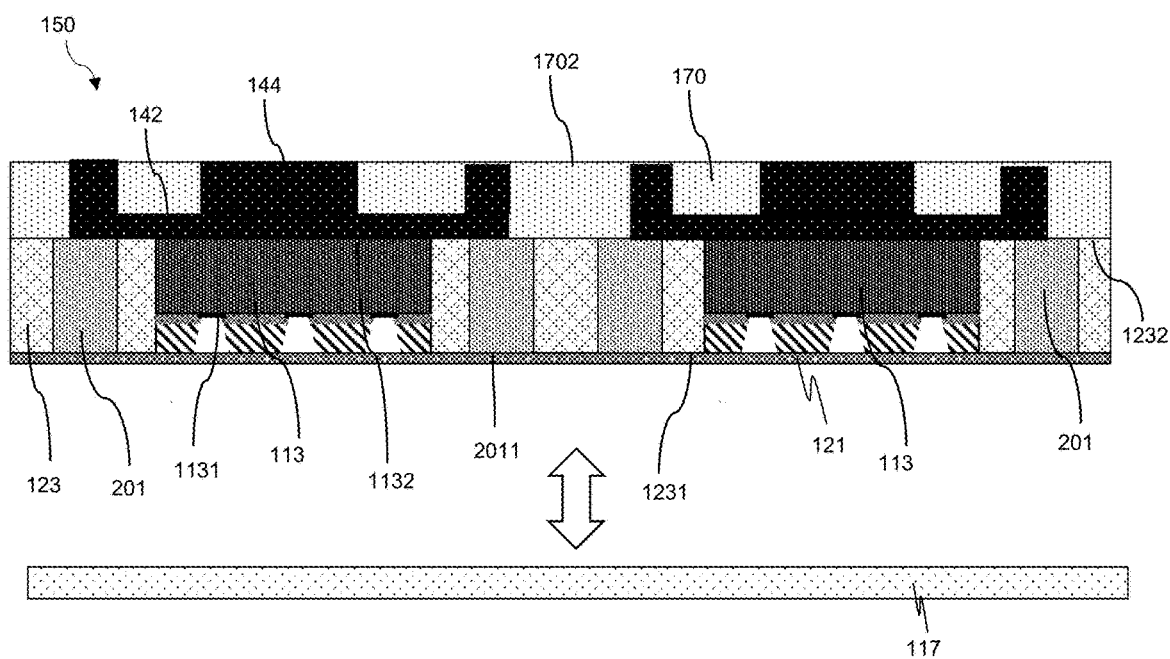

As shown in FIG. 22, after the carrier 117 is peeled off, the protective layer 107 on the die active surface 1131, the lower surface of the metal frame 200 (represented by the connection pad front surface 2011 of the connection pad 201), and the molding layer front surface 1231 are exposed. An arrow in FIG. 22 shows separation of the carrier 117 from the panel assembly 150.

After the carrier 117 is removed, a structure in which the molding layer 123 encapsulates the die 113 and the metal frame 200 is defined as the panel assembly 150 having the second conductive structure 140.

FIG. 13 to FIG. 22 show that the second panel-level conductive trace 142 and the second panel conductive stud 144 have one conductive layer, respectively for simple illustration. However, it is understood that the second panel-level conductive trace 142 and the second panel conductive stud 144 have one conductive layer may have multiple conductive layers by repeating FIG. 13 to FIG. 22 before separating the first carrier 117 from the panel assembly 150.

Figure 23A:
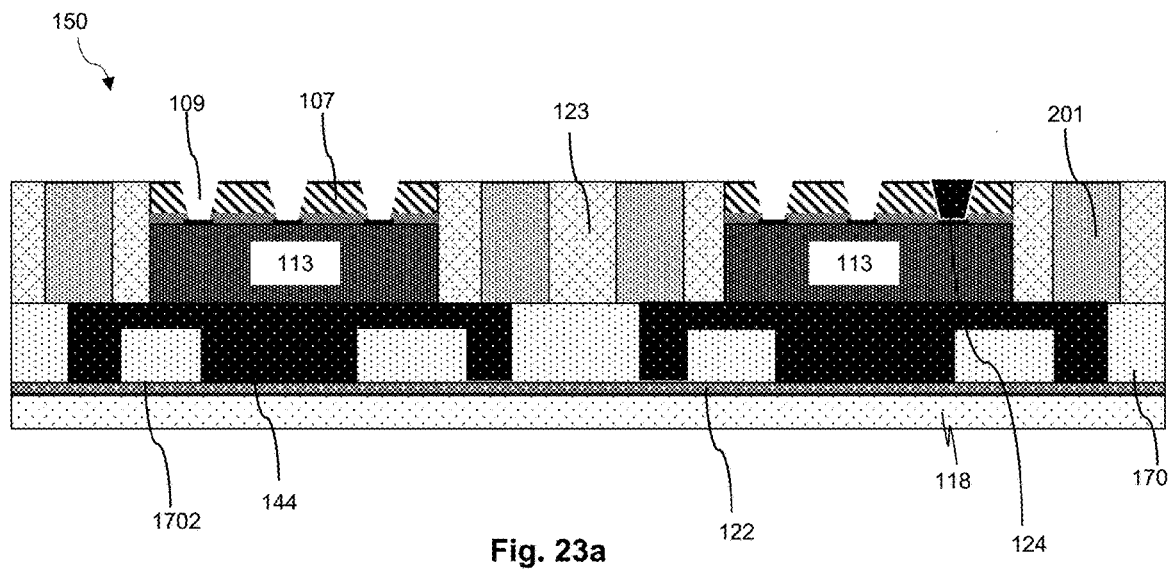

Step S9: inverting the panel assembly 150 having the second conductive structure 140 onto another carrier (also known as second carrier) 118, as shown in FIG. 23a.

In some implementations, an adhesive layer 122 is formed between the second carrier 118 and the second dielectric layer back surface 1702 by lamination, printing, spraying and coating, etc. In order to facilitate separation of the carrier 118 from the second dielectric layer back surface 1702 in subsequent processes, the adhesive layer 122 is preferably made of a material capable of being easily separated, for example, a thermal-releasing material.

Step 10: forming a first conductive structure 129 on the die active surface 1311 in a panel-level.

Figure 23B:
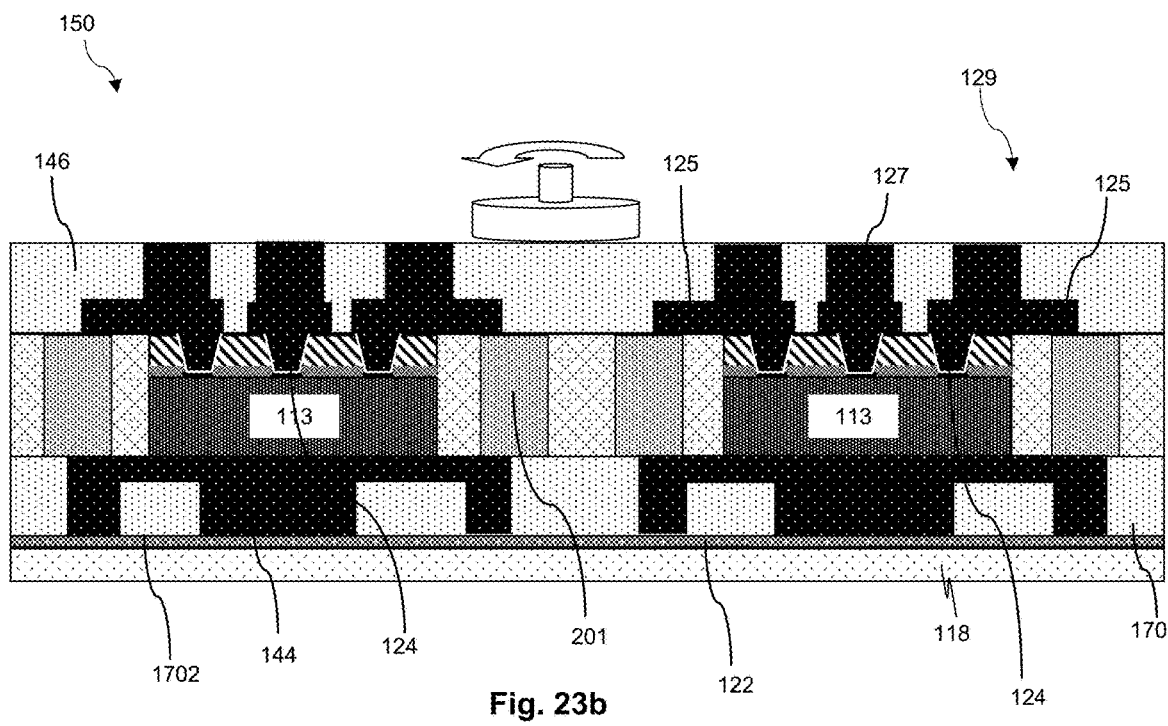

As shown in FIG. 23b, the protective layer openings 109 is filled to form the conductive filled via 124. Then the panel-level conductive layer is formed on the surface of the protective layer 107, and the panel-level conductive layer is connected with the electrical connection pad 103 provided on the die active surface 1131 through the wafer conductive layer 130 and/or the conductive filled via 124, and is further connected with the metal frame 200 (represented by the connection pad 201). The panel-level conductive layer may comprise one conductive layer or multiple conductive layers.

As shown in FIG. 23b, the panel-level conductive layer is a panel-level conductive trace 125 (also known as first panel-level conductive trace 125). Optionally, the conductive filled via 124 and the panel-level conductive trace 125 are formed in a same step for forming the panel-level conductive layer. Similar to the second panel-level conductive trace 142, the conductive filled via 124 and the panel-level conductive trace 125 are formed by using a method for forming a patterned conductive layer, such as a photolithograph process. The conductive filled via 124 and the panel-level conductive trace 125 for example are made of a material such as copper, gold, silver, tin and aluminum or a combination thereof, or made of other suitable conductive material by PVD, CVD, sputtering, electrolytic electroplating, electrodeless electroplating, or other suitable metal deposition process.

At least a part of the panel-level conductive traces 125 are connected with the electrical connection pad 103 provided on the die active surface 1131 through the conductive filled via 124 and are connected with the connection pad 201; the panel-level conductive trace 125 leads the electrical connection pad 103 provided on the die active surface 1131 to the connection pad 201 through the conductive filled via 124. Meanwhile, the panel-level conductive traces 125 is also electrically connected with the second conductive structure 140 via the connection pad 201. Therefore, the die 113 can be electrically back-grounded (i.e., the die 113 is earthed from the die back surface 1132 to the ground) to the second conductive structure 140 via the conductive filled via 124, the panel-level conductive traces 125 and the connection pad 201. Since the second conductive structure 140 can provide a large contact area for the die 113 being electrically back-grounded, the die 113 may have superior performance for power modules.

A pattern of the panel-level conductive trace 125 in FIG. 23b is merely exemplary, and the panel-level conductive trace 125 may have various patterns according to specific circuit design.

Optionally, the conductive filled via 124 and the panel-level conductive trace 125 are formed in different steps so as to firstly form the conductive filled via 124 and then form the panel-level conductive trace 125.

In the case that the conductive filled via 124 has been formed in the preceding step of applying the protective layer 107, the step of forming the panel-level conductive layer is directly performed.

In the case that the protective layer opening 109 has not been formed in the preceding step of applying the protective layer, it is necessary to include a step of forming the protective layer opening 109.

In some implementations, a first panel conductive stud 127 is formed on the first panel-level conductive trace 125 by using a method for forming a patterned conductive layer in a panel-level.

For example, the first panel conductive stud 127 may be formed by a photolithograph process, similar to the second panel conductive stud 127. The first panel conductive stud 127 is made of a conducive material such as copper, gold, silver, tin and aluminum or a combination thereof, or made of other suitable conductive material by PVD, CVD, sputtering, electrolytic electroplating, electrodeless electroplating, or other suitable metal deposition process. The panel-level conductive trace 125 and the first panel conductive stud 127 are collectively defined as the first conductive structure 129. Therefore, the die 113 may be electrically connected onto an external component (such as printed circuit board (PCB)) through the conductive filled via 124 and the first conductive structure 129 (including the panel-level conductive trace 125 and the first panel conductive stud 127).

A pattern of the first panel conductive stud 127 in FIG. 23b is merely exemplary, and the panel-level conductive trace 125 may have various patterns according to specific circuit design.

A first dielectric layer 146 is formed to encapsulate the first conductive structure 129 with the first panel conductive stud 127 exposed from the first dielectric layer 146 after a grinding process (either mechanically grinding or polishing). The first dielectric layer 146 may include epoxy mold compounds in forms of film, granule or liquid. In addition, the first dielectric layer 146 may have similar components and properties to the molding layer 132 as described hereabove. For example, the first dielectric layer 146 has a same or similar coefficient of thermal expansion (CTE) with the molding layer 123 so that an interface stress is not easily caused between the first dielectric layer 146 and the molding layer 123.

Figure 24:
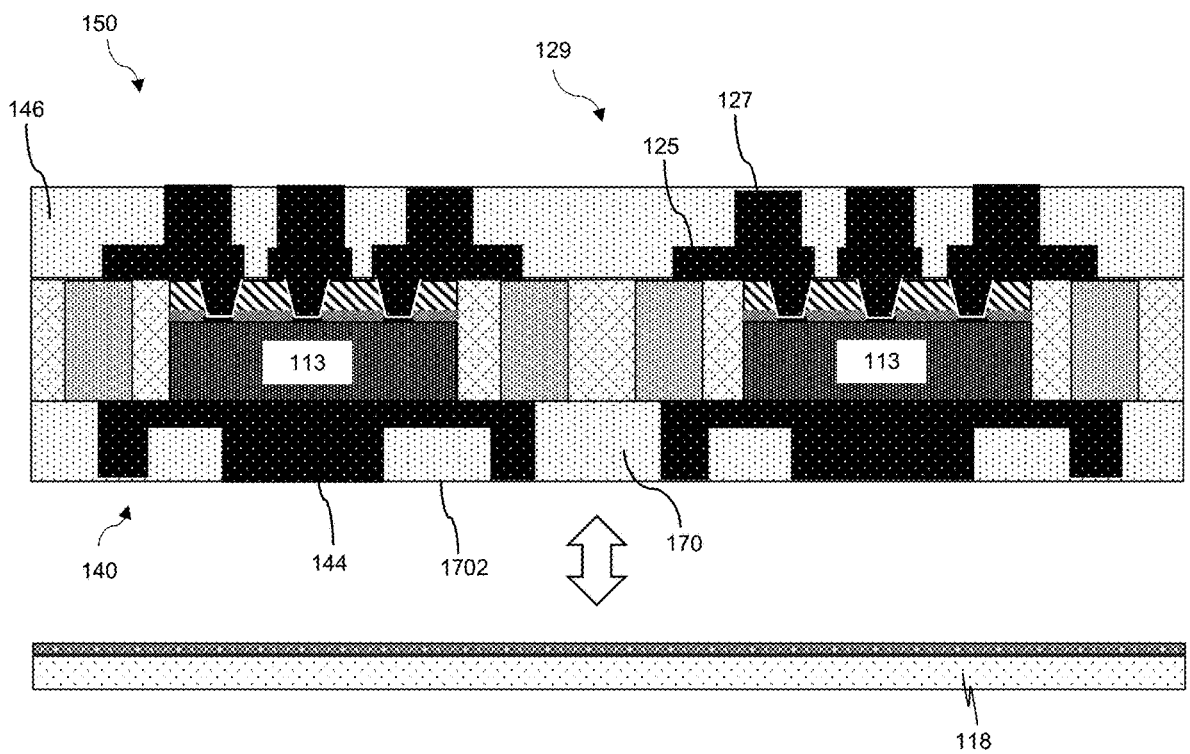

FIG. 24 shows that the first panel-level conductive trace 125 and the first panel conductive stud 127 have one conductive layer, respectively for simple illustration. However, it is understood that the first panel-level conductive trace 125 and the first panel conductive stud 127 may have multiple conductive layers i by repeating the process as described above before separating the second carrier 118 from the panel assembly 150.

Furthermore, the second carrier 118 is peeled off to form a panel assembly 150 having the second conductive structure 140 encapsulated in the second dielectric layer 170 and the first conductive structure 129 encapsulated in the first dielectric layer 146.

As shown in FIG. 24, after the second carrier 118 is peeled off, the second dielectric layer 170 and the second panel conductive stud 144 of the second conductive structure 140 are exposed. An arrow in FIG. 24 shows separation of the second carrier 118 from the panel assembly 150. As a result, the die 113 can be both electrically and thermally connected to external components via the first conductive structure 129 from the die active surface 1131 and the second conducive structure 140 from the die back surface 1132, respectively.

Step S11: cutting to form a plurality of packaged chips 400.

Figure 25:
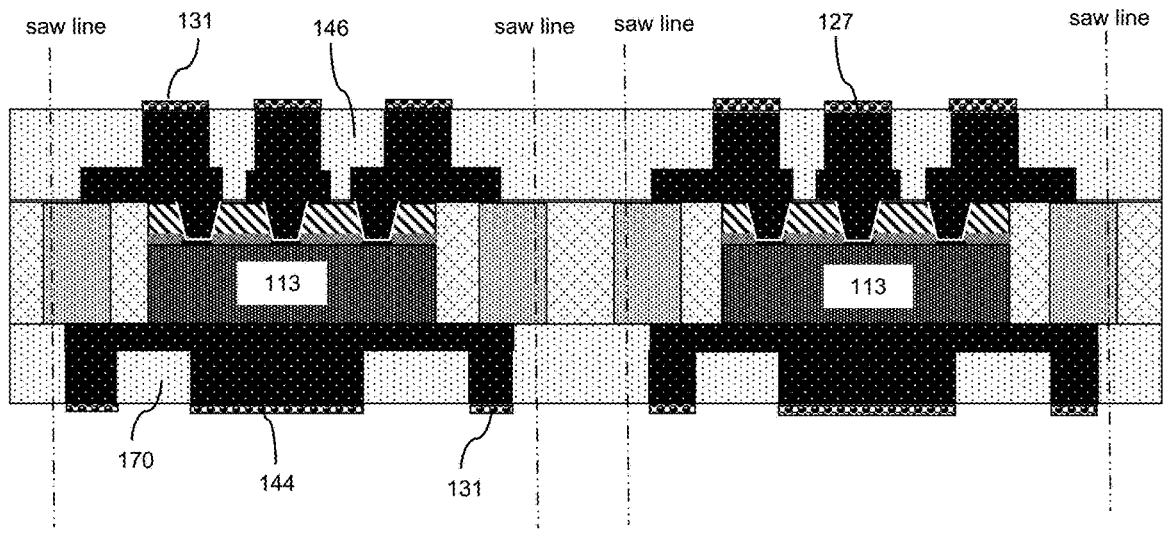

As shown in FIG. 25, a package single body is separated out by cutting the panel assembly 150 to form multiple packaged chips 400, and the cutting for example is performed by employing machinery or laser. Dash-dotted line lines in FIG. 25 show cutting lines (also called saw lines) along which the separation is performed.

In the case that the packaged metal frame 200 is the metal frame 200 including the connection bar 203 as shown in FIG. 8a, during this cutting and separating process, it is necessary to perform cutting on the connection bar 203 to remove the connection bar 203, so that the connection bar 203 is not included in the packaged chip 400 after the packaging is completed, and the metal features in the metal unit of the metal frame 200 are all independent from each other.

Preferably, before or after the step of cutting and separating, a surface treatment layer 131 is formed on the first conductive structure 129 and/or second conductive structure 140 exposed from the packaged chip 400, optionally by electroplating, electrodeless electroplating, or other suitable method; for example, the surface treatment layer 131 may be a surface finish formed by electroless nickel immersion gold (ENIG), electroless nickel electroless palladium immersion gold (ENEPIG), tin plating (Tin), NiAu plating, or a combination thereof.

Optionally, the surface treatment layer 131 is further configured to implement back-grounding of the die 113 in the packaged chip 400, that is, the surface treatment layer 131, according to specific design of the circuit, electrically connects the die back surface 1132 to a special connection pad 201 for implementing back-grounding (the special connection pad for implementing back-grounding is: the connection pad that is connected with the electrical connection pad having its back surface grounded and provided on the die active surface through a conductive structure).

Figure 26:
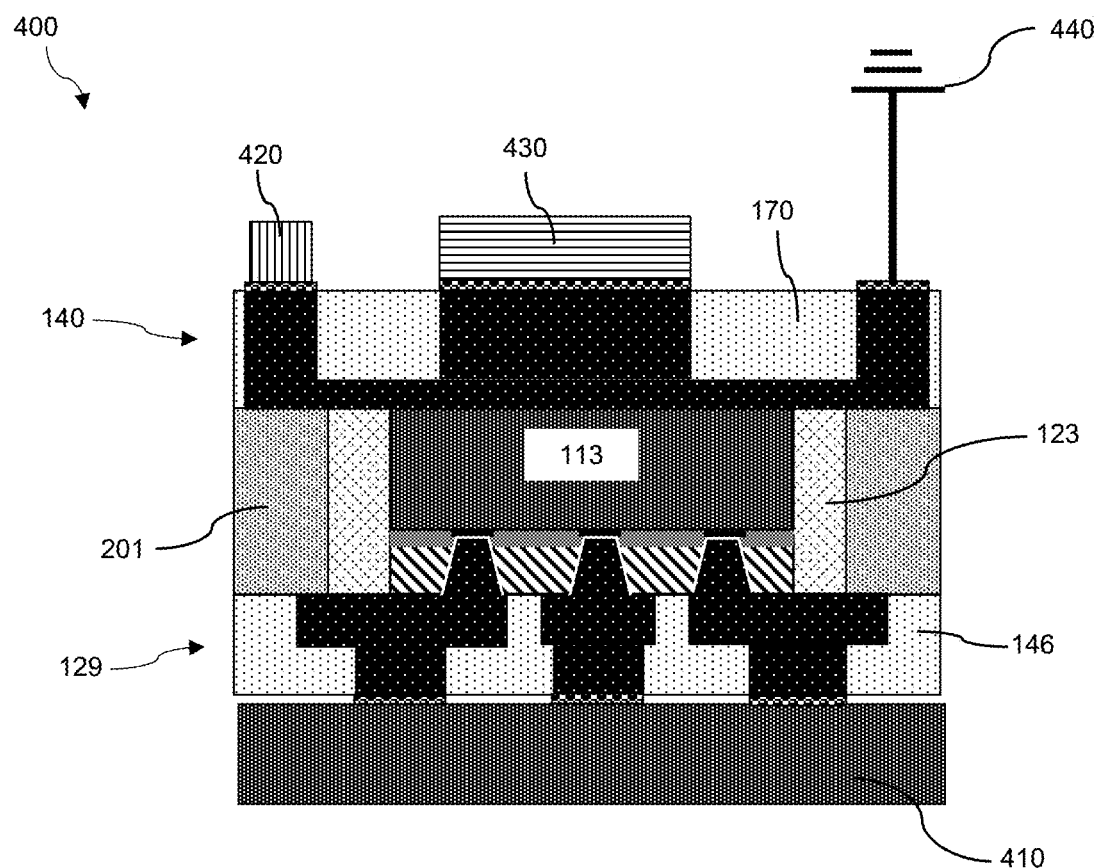
FIG. 26 illustrates a schematic diagram of a packaged chip singulated from the panel assembly in FIG. 2 to FIG. 25.

FIG. 26 is an exemplary schematic diagram of the packaged chip 400 singulated from the panel assembly 150 and in use; during the packaged chip 400 is used, at least one metal feature which is embodied as the connection pad 201 is employed to connect the packaged chip 400 to a printed circuit board (PCB) or a substrate 410 via the first conductive structure 129. In addition, passive components 420 may be also mounted onto the second conductive structure 140 and electrically connected with the die 113 in the packaged chip 400. The passive components 420 may be resistors, capacitors, inductors or a combination thereof.

A heat sink 430 may be also mounted onto the second conductive structure 140 for dissipating heat generated from the die 113 via the conductive filled vias 124, the first conductive structure 129, the connection pad 201 of the metal frame 200 and the second conductive structure 140, in addition to heat dissipation to the PCB or substrate 410 via the first conductive structure 129. In particular, the connection pad 201 is exposed from a lateral surface 402 of the packaged chip 400. Accordingly, the heat can also be dissipated from the connection pad 201. Therefore, the packaged chip 400 has a three-sided heat dissipation design advantageously for an efficient cooling function, i.e., from a first side of the die active surface 1131 via the first conductive structure 129, from a second side of the die back surface 1132 via the second conductive structure 140, and from a third side of the lateral surface 402 via the connection pad 201.

In addition, a grounding label 440 shows implementation of the back-grounding of the packaged chip 400 from the die back surface 1132 via the second conductive structure 140. Compared with a traditional grounding, the back-grounding via the second conductive structure 140 may provide a large contact area for grounding the packaged chip 400 more stably and safely, particularly for power modules with the large electric flux.

Alternative to the passive components 420 and/or the heat sink 430, another packaged chip 400 may be mounted on the second conductive structure 140 of this packaged chip 400 to form a package-on-package (POP) configuration.

Figure 27:
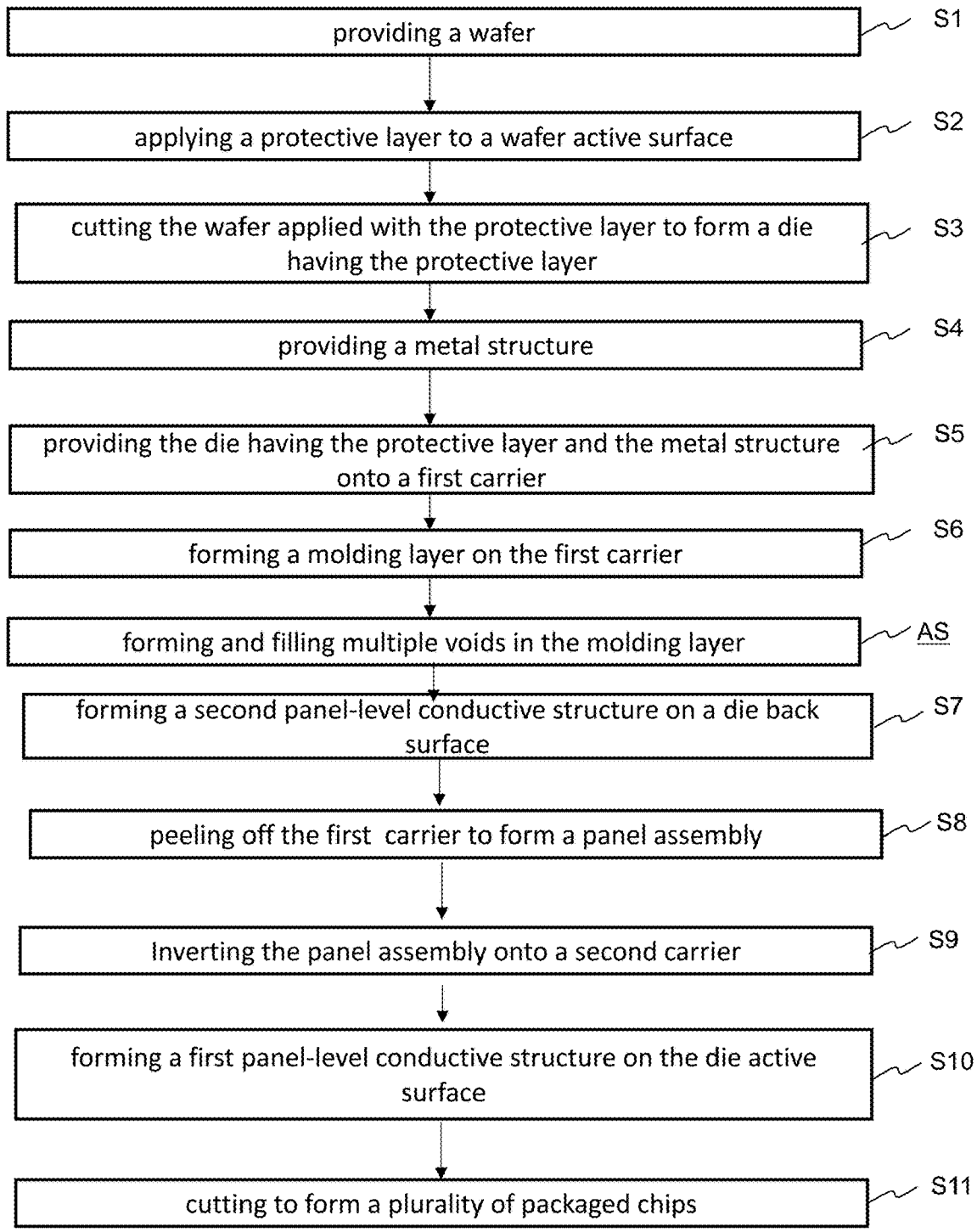
FIG. 27 illustrates a flow chart of another chip packaging method according to an exemplary embodiment of the present disclosure.

FIG. 27 illustrates a flow chart of another chip packaging method 20 according to an exemplary embodiment of the present disclosure. Compared with the chip packaging method 10, the chip packaging method 20 includes all the steps from S1 to S11, and an additional step (AS) between S6 and S7, i.e., forming and filling multiple voids 502 in the molding layer 123.

Figure 28:
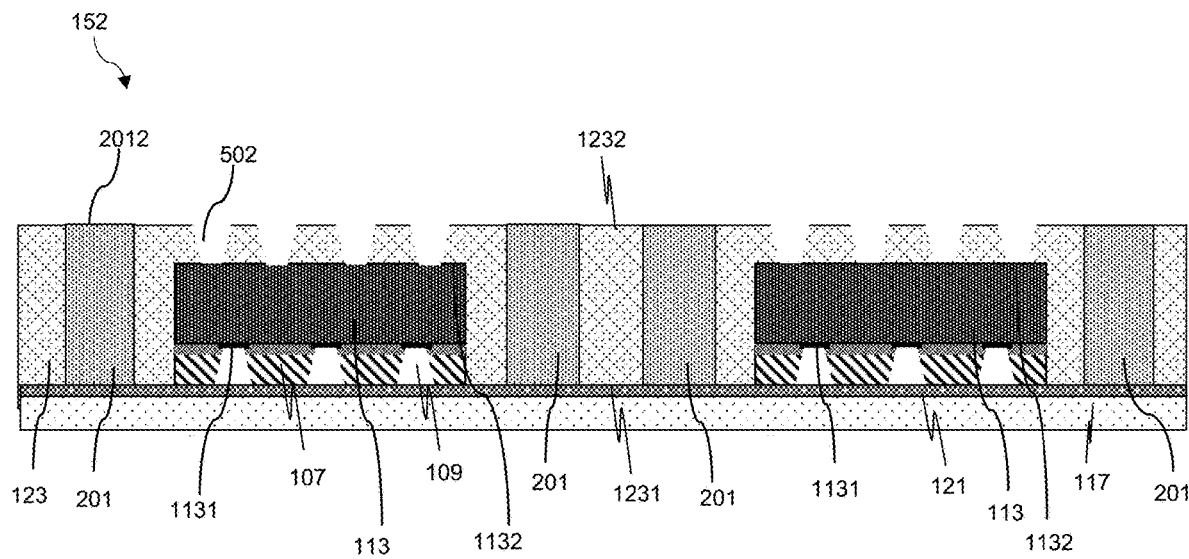
FIG. 28 to FIG. 30 illustrate additional schematic diagrams of making another panel assembly with the chip packaging method of FIG. 27.
Figure 29:
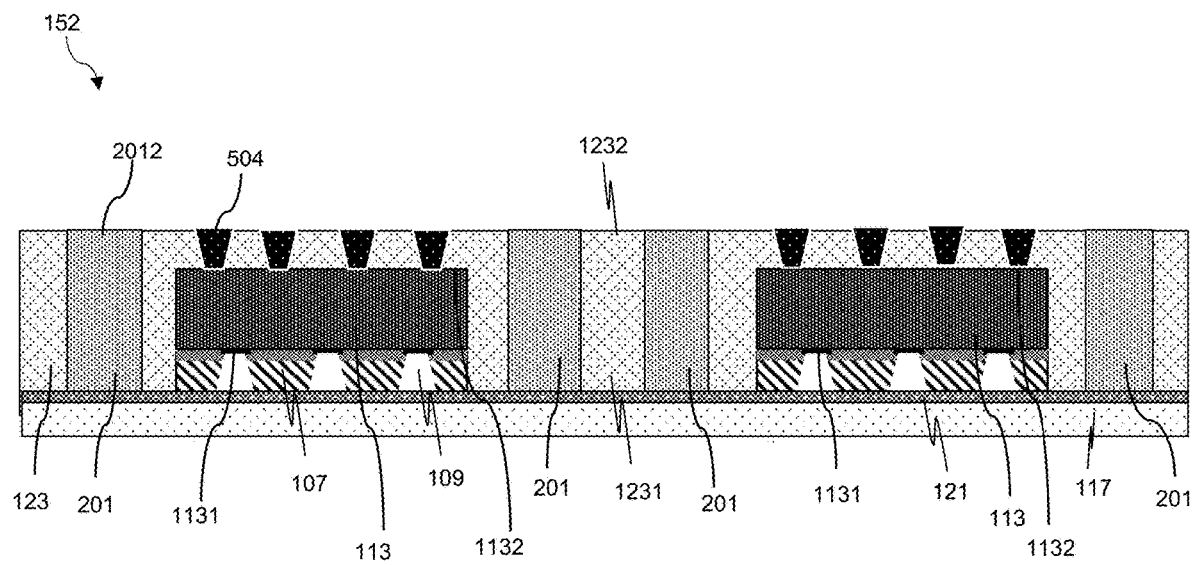
Figure 30:
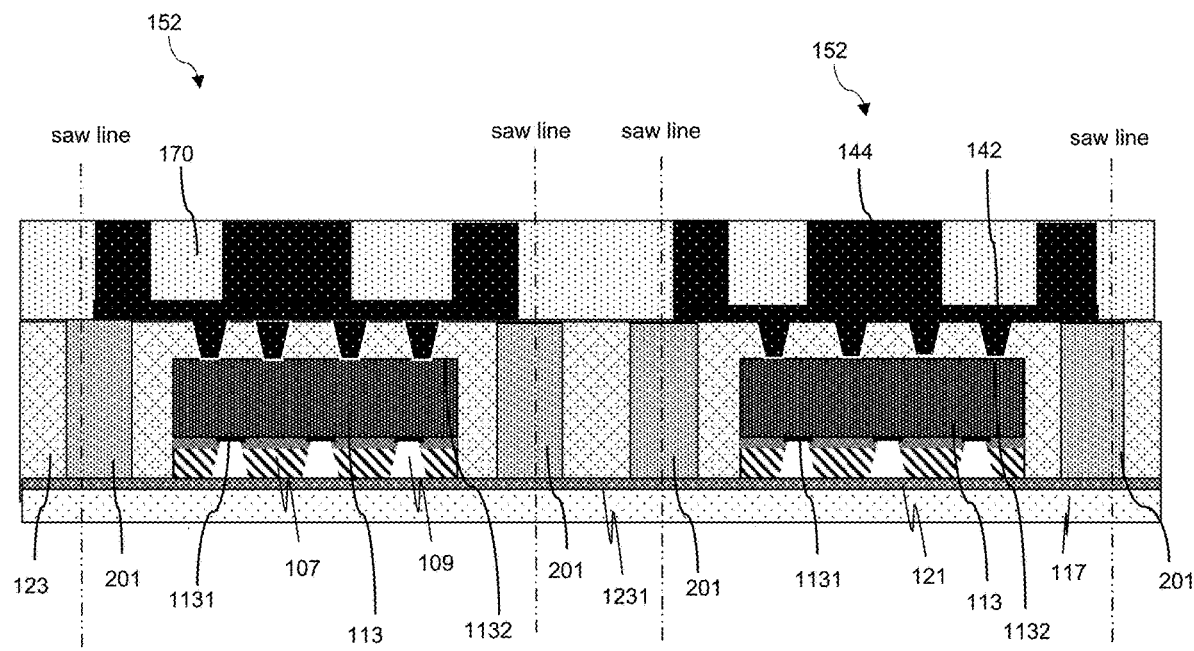

FIG. 28 to FIG. 30 illustrate additional schematic diagrams of making a panel assembly 152 with the chip packaging method 20. The chip packaging method 20 has the same steps S1 to S11 of the chip packaging method 10 and an additional step (AS). The same step S1 to S11 will not be repeated for the second chip packaging method 20, and accordingly, the same reference numerals are also used herein for describing the same or similar features in FIG. 2 to FIG. 25. The additional step (AS) is described in the following.

As shown in FIG. 28, the connection pad 201 has a larger height than the thickness of the die 113; such that the molding layer 123 is thinned until the connection pad back surface 2012 is exposed from the molding layer 123, while the die 113 is still completely encapsulated inside the molding layer 123. Multiple voids 502 are then formed through the molding layer 123 until the die back surface 1132 of the die 113. Therefore, a portion of the die back surface 1132 is exposed from the molding layer 123 through the voids 502. The voids 502 may be formed by any suitable process, such as a laser patterning process, a mechanical patterning process, a laser drilling, or a combination thereof.

Similar to the conductive filled vias 124, the voids 502 are also filled with a conductive medium. The conductive medium for example is made of a conductive material such as gold, silver, copper, tin, aluminum and the like, or a combination thereof, or other suitable conductive materials; the conductive medium is filled in the voids 502 to form the conductive filled voids 504 by physical vapor deposition (PVD), chemical vapor deposition (CVD), sputtering, electrolytic electroplating, electrodeless electroplating, or other suitable metal deposition processes.

As shown in FIG. 30, the second panel-level conductive trace 142 is formed on and connected to the conductive filled voids 504. Therefore, the die 113 can still be back-grounded from the die back surface 1132 via the second panel-level conductive trace 142 and the second panel conductive stud 144 of the second conductive structure 140.

Similarly, the second dielectric layer 170 is formed to encapsulate the second conductive structure 140 with the second conducive structure 140 exposed from the second dielectric layer 170 after a grinding process (either mechanically grinding or polishing). In addition, the second dielectric layer 170 may have similar components and properties to the molding layer 132 as described above.

As shown in FIG. 30, a package single body is separated out by cutting the panel assembly 152 to form multiple packaged chips 500, and the cutting for example is performed by employing machinery or laser. Dash-dotted lines in FIG. 30 show cutting lines (also called saw lines) along which the separation is performed.

Figure 31:
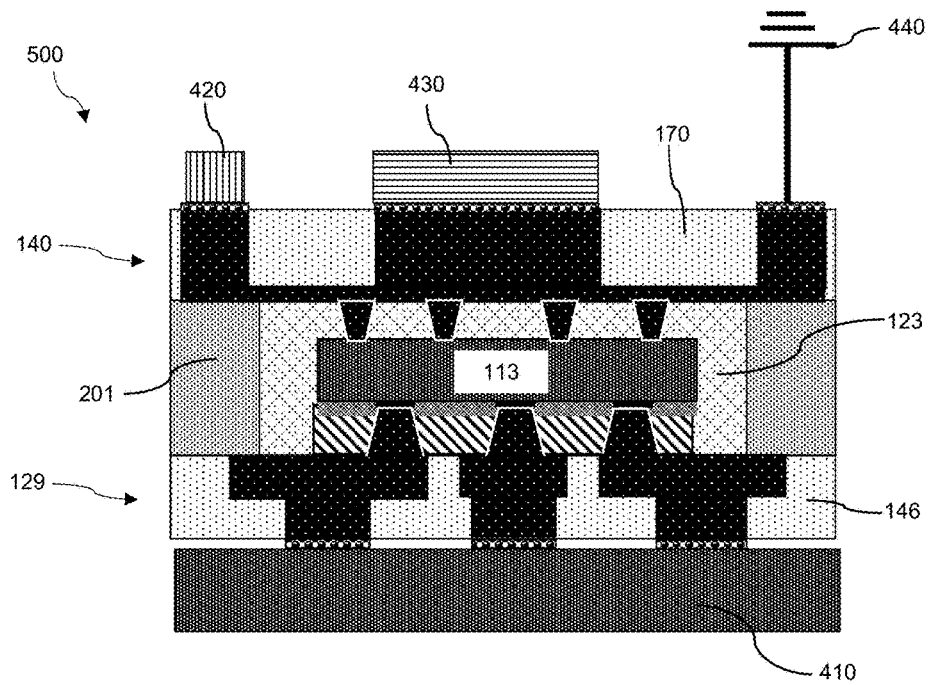
FIG. 31 illustrates a schematic diagram of another packaged chip singulated from the panel assembly of FIG. 28 to FIG. 30.

FIG. 31 illustrates a schematic diagram of another packaged chip 500 singulated from the panel assembly 152 of FIG. 28 to FIG. 30. The same reference numerals are also used herein for describing the same or similar features in FIG. 26. Similar to the packaged chip 400, the connection pad 201 is also exposed from a lateral surface 402 of the packaged chip 500. Accordingly, the packaged chip 500 also has the three-sided heat dissipation design advantageously for an efficient cooling function.

Compared with the packaged structure 400, the second conductive structure 140 of the packaged structure 500 applies less stress on the die 113 from the die back surface 1132, since the second panel-level conductive trace 142 has a larger contact area with the molding layer 123 when the voids 502 are filled with the molding layer 123. In addition, the larger contact area also connects the second panel-level conductive trace 142 and the molding layer 123 more securely, which allows the second panel-level conductive trace 142 to have a thin profile; and the panel-level conductive trace 142 has less weight accordingly, which further reduces the stress applied on the die 113 from the die back surface 1132.

Alternative to the passive components 420 and/or the heat sink 430, another packaged chip 500 may be mounted on the second conductive structure 140 of this packaged chip 500 to form the package-on-package (POP) configuration. Alternatively, one packaged chip 400 may be mounted on the second conductive structure 140 of this packaged chip 500 to form the package-on-package (POP) configuration. Alternatively, this packaged chip 500 may be mounted on the second conductive structure 140 of one packaged chip 400 to form the package-on-package (POP) configuration.

Figure 32:
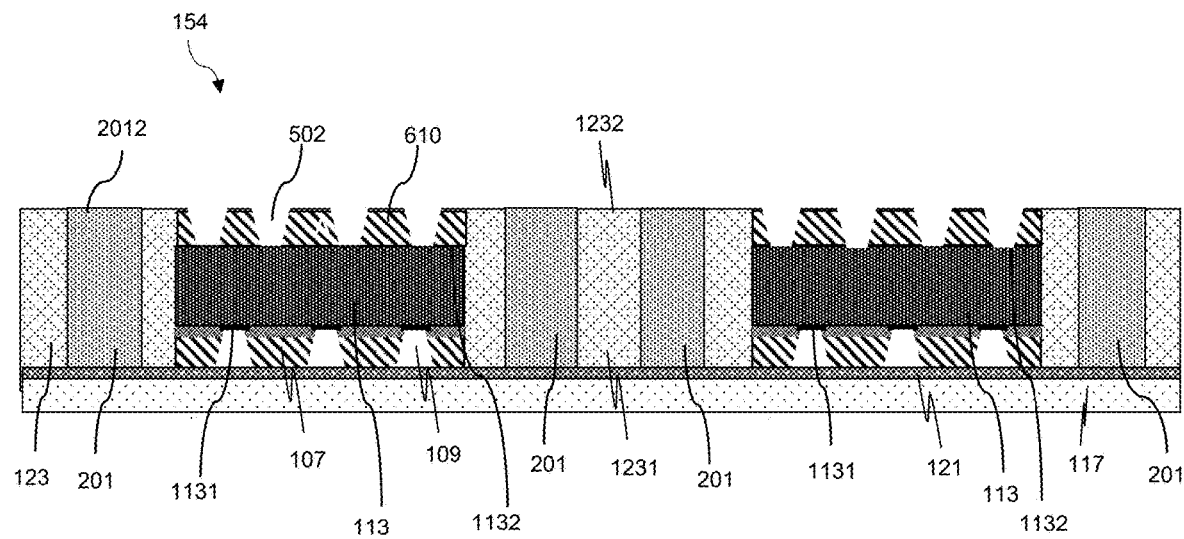
FIG. 32 to FIG. 34 illustrate schematic diagrams of making a variation of the panel assembly of FIG. 28 to FIG. 30.
Figure 33:
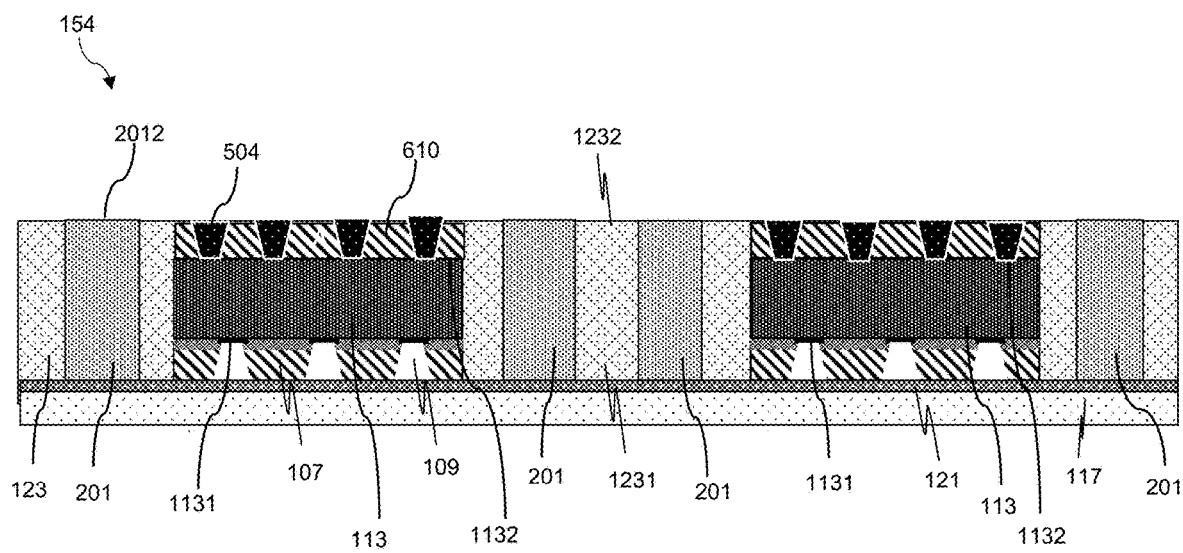
Figure 34:
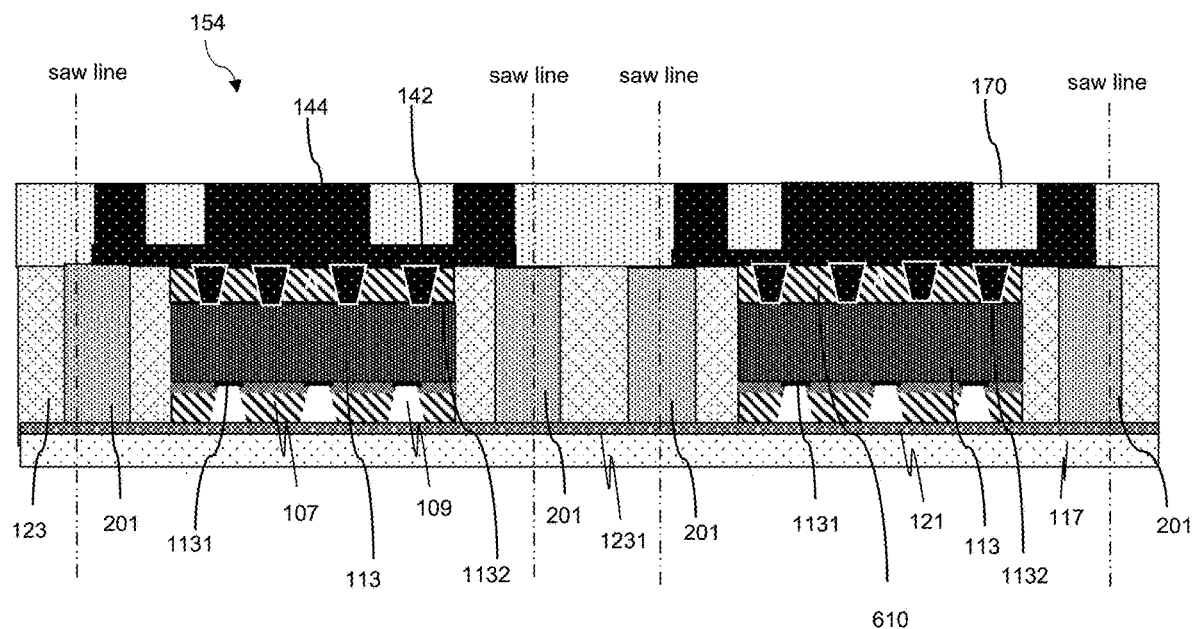

FIG. 32 to FIG. 34 illustrate schematic diagrams of making a variation (i.e., panel assembly 154) to the panel assembly 152 with the chip packaging method 20. Similarly, the steps S1 to S11 of the chip packaging method 10 will not be repeated; and accordingly, the same reference numerals are also used herein for describing the same or similar features in FIG. 2 to FIG. 25 and FIG. 28 to FIG. 30. In addition, the additional step (AS) of the chip packaging method 20 is varied for making the panel assembly 154, compared with the panel assembly 152 shown in FIG. 28 to FIG. 30. Therefore, the variation of the additional step (AS) for making the panel assembly 154 is described in the following.

As shown in FIG. 32, the panel assembly 154 has a similar structure as the panel assembly 152 in FIG. 28, except that a molding layer 610 is formed on the die back surface 1132 of the die 113 and exposed from the molding layer 123. The molding layer 610 may be formed by paste printing, injection molding, hot press molding, compression molding, transfer molding, liquid sealant molding, vacuum lamination, or other suitable mode of molding. For example, the molding layer 610 is formed in a film molding process onto the die back surface 1132.

The molding layer 610 may be made of a same material of the molding layer 123, for example an organic composite material, a resin composite material, a macromolecule composite material, a polymer composite material, such as an epoxy resin having a filler, an Ajinomoto buildup film (ABF) or other polymer having a suitable filler. Alternatively, the molding layer 610 may be made of a different material of the molding layer 123. The different material may have better compatibility with the second panel-level conductive trace 142 than the molding layer 123 for securing the second conductive structure 140 more stably with the molding layer 123.

As shown in FIG. 33, The voids 502 are formed in the molding layer 610 for exposing a portion of the die back surface 1132 of the die 113 by any suitable process, such as a laser patterning process, a mechanical patterning process, a laser drilling process, or a combination thereof; and then the voids 502 are filled with a conductive medium such as gold, silver, copper, tin, aluminum and the like, or a combination thereof, or other suitable conductive materials; the conductive medium is filled in the voids 502 to form the conductive filled voids 504 by physical vapor deposition (PVD), chemical vapor deposition (CVD), sputtering, electrolytic electroplating, electrodeless electroplating, or other suitable metal deposition processes.

As shown in FIG. 34, a package single body is separated out by cutting the panel assembly 154 to form multiple packaged chips 550, and the cutting for example is performed by employing machinery or laser. Dash-dotted lines in FIG. 34 show cutting lines (also called saw lines) along which the separation is performed.

Figure 35:
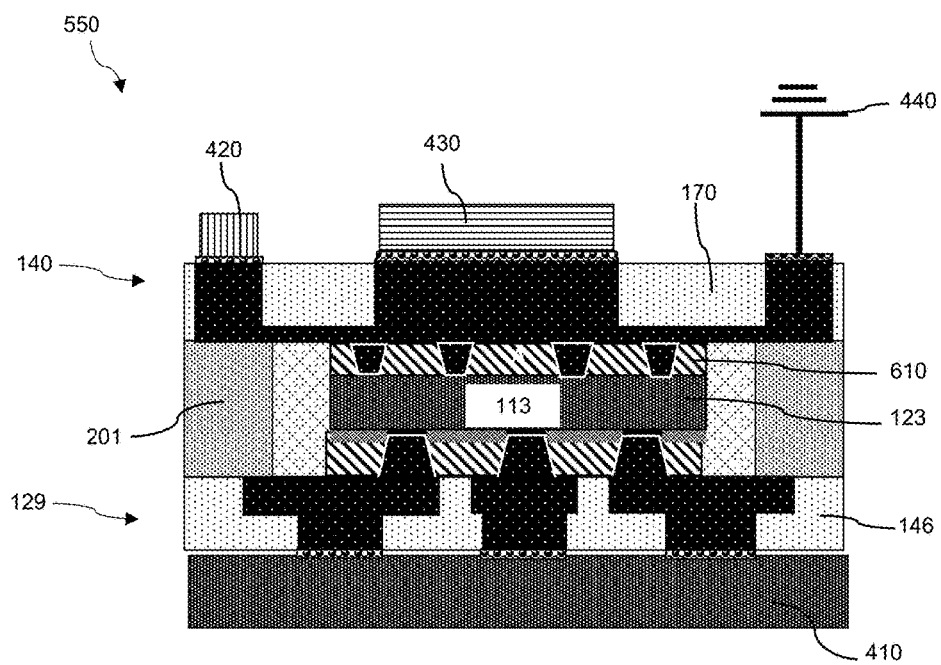
FIG. 35 illustrates a schematic diagram of a packaged chip singulated from the panel assembly of FIG. 32 to FIG. 34.

FIG. 35 illustrates a schematic diagram of a packaged chip 550 singulated from the panel assembly 154 of FIG. 32 to FIG. 34. The packaged chip 550 has a same structure with the packaged chip 550, except that the voids 510 are formed inside the molding layer 610 on the die back surface 1132 as described above. In addition, the passive components 420 and/or the heat sink 430 may be mounted on the second conductive structure 140 of the packaged chip 550.

Alternatively, another packaged chip 550 may be mounted on the second conductive structure 140 of this packaged chip 550 to form the package-on-package (POP) configuration. Alternatively, one packaged chip 400, 500 may be mounted on the second conductive structure 140 of this packaged chip 550 to form the package-on-package (POP) configuration. Alternatively, this packaged chip 550 may be mounted on the second conductive structure 140 of one packaged chip 400, 500 to form the package-on-package (POP) configuration.

In the case that the first conductive structure 129 and the second conductive structure 140 are made of metals or metallic materials (such as Copper (Cu)), they have relatively heavy weights, compared with the die 113, the metal frame (represented as the connection pad 201), the molding layer 123 and other components described above (such as the protective layer 107). Therefore, the first conductive structure 129 and the second conductive structure 140 is preferred to have a substantially same weight for balancing the packaged chips 400, 500, 550 as a whole. In other words, the first conductive structure 129 and the second conductive structure 140 have a substantially equal amount of mass if they are made of a same metal or metallic material (such as Copper (Cu)).

Figure 36A:
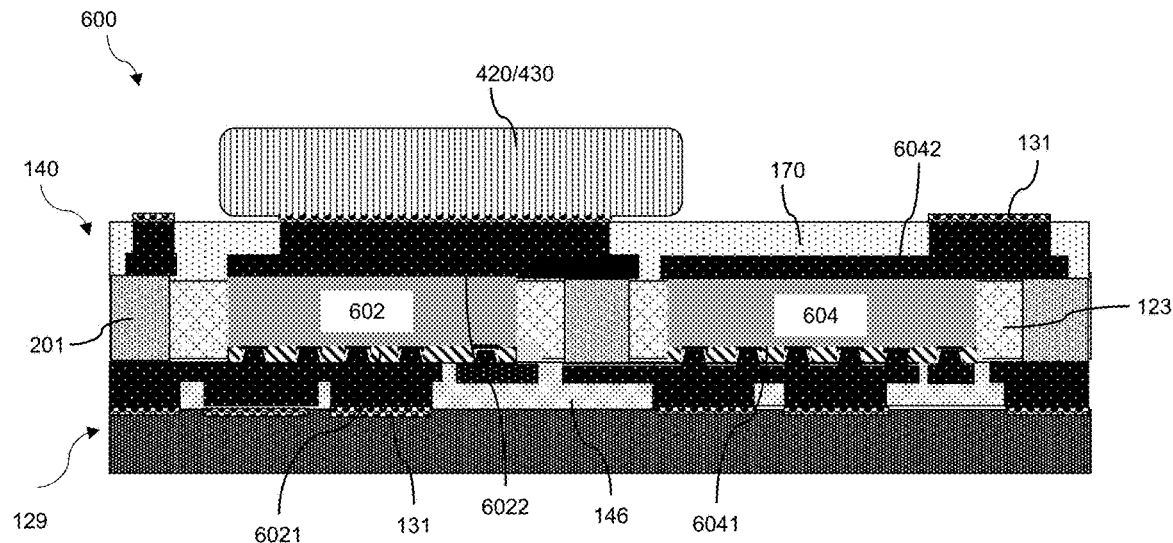
FIGS. 36a-36b illustrate a schematic diagram of a packaged chip having two dies with the chip packaging method of FIG. 1.

FIG. 36a illustrates a schematic diagram of a packaged chip 600 having a first die 602 and a second die 604 with the chip packaging method 10 of FIG. 1. The dies 602, 604 may be traditional Silicon (Si) dies, Silicon carbide (SiC) dies, Gallium nitride (GaN) dies or a combination thereof. The dies 602, 604 may select any suitable design for desired applications. For example, the dies 602, 604 are first field effect transistor (FET) and second field effect transistor (FET) placed in a side-by-side design.

The packaged chip 600 has a similar package structure with the packaged chips 400; and accordingly the same reference numerals are used herein for describing the same or similar features in FIG. 26. The first conductive structure 129 and the second conductive structure 140 are formed on both sides of the first and second dies 602, 604. Accordingly, the first conductive structure 129 is connected with a first die active surface 6021 of the first die 602 and a second die active surface 6041 of the second die 604; while the second conductive structure 140 is connected with a first die back surface 6022 of the first die 602 and a second die back surface 6042 of the second die 604.

Similarly, the first conductive structure 129 and the second conductive structure 140 are also connected via the connection pads 201 in the packaged chip 600. Therefore, the first and second die active surfaces 6021, 6041 are electrically connected to the second conductive structure 140 for implementing the back-grounding of the first and second dies 602, 604 in the packaged chip 600.

Similarly, the packaged chip 600 also has the three-sided heat dissipation design advantageously for an efficient cooling function, i.e., from the first side of the die active surfaces 6021, 6041 via the first conductive structure 129, from the second side of the die back surfaces 6022, 6042 via the second conductive structure 140, and from the third side of the lateral surface 402 via the connection pads 201. In addition, the heat sink 430 may be mounted onto the second conductive structure 140 for accelerating heat dissipation from the packaged chip 600.

The packaged chip 600 may advantageously include the heat sink 430 of a large size (called large heat sink) for further enhancing heat dissipation due to a flexible design of the first and second dies 602, 604. For example, the large heat sink 430 may be mounted over the first die 602 if the first die 602 occupies more space than the second die 604. In this case, heat generated by the second die 604 can still be dissipated to the large heat sink 430 via the first conductive structure 129, the connection pad 201 and the second conductive structure 140.

Alternatively, passive components 420 of large sizes may be mounted on the second conductive structure 140 and over the first die 602; while the heat sink 430 of a small size (called small heat sink) may be mounted on the second conductive structure 140 and over the second die 604. In this case, heat generated by the first die 602 can still be dissipated to the small heat sink 430 via the first conductive structure 129, the connection pad 201 and the second conductive structure 140.

In particular, both the first die 602 and the second die 604 have a face-down configuration connected to the external component (such as PCB or substrate) via a direct flip-chip process without solder bumps or solder balls. For example, both the first die active surface 6021 and the second die active surface 6041 are directly connected onto the external component (such as PCB or substrate) through the conductive filled via 124 and the first conductive structure 129. In other words, bumping and reflowing process of a traditional flip-chip process of solder bumps or solder balls are not needed for the packaged chip 600 using the direct flip-chip process. Considering the solder bumps or solder balls do not have satisfactory electrical and thermal conductance, the direct flip-chip process herein renders the packaged chip 600 better electrical and thermal performance, which is very important for power modules with the large electric flux and accompanying heat generated during its operation. FIG. 36a shows that the packaged chip 600 may be directly connected to the PCB or substrate 410 via the first panel conductive stud 127 of the first conductive structure 129.

Figure 36B:
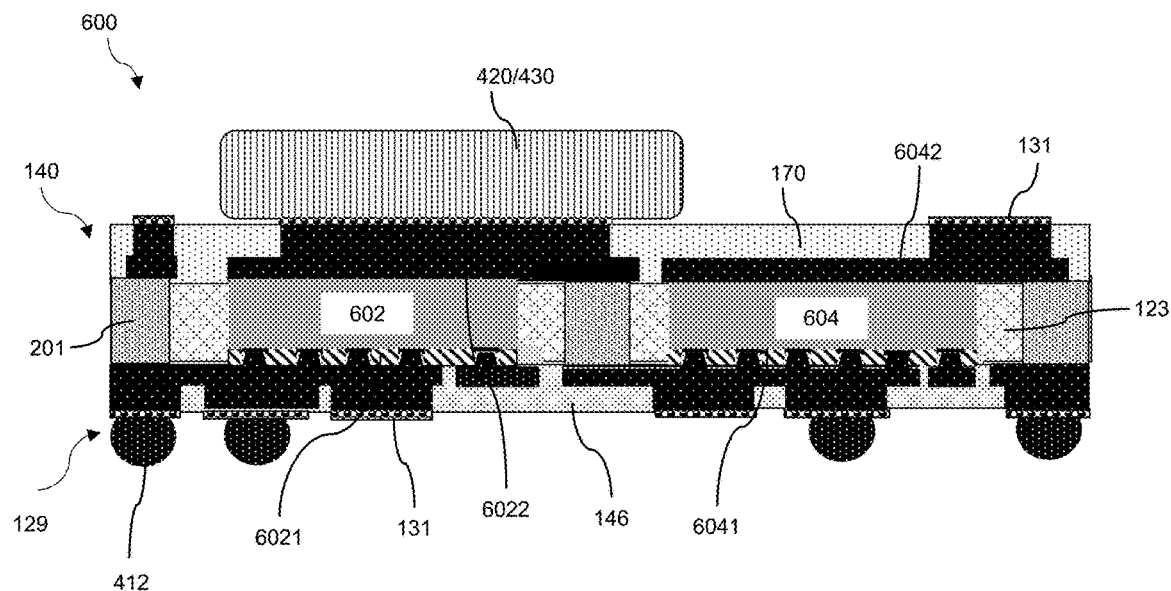

Alternatively, the traditional flip-chip process can also be applied to the packaged chip 600 if needed. FIG. 36b shows that the solder bumps or solder balls 412 are formed below the first panel conductive stud 127 of the first conductive structure 129 for connecting the packaged chip 600 to the PCB or substrate 410.

The face-down configuration of both the first and second dies 602, 604 would make the panel-level packaging method much easier and more efficient. For example, the step S5 (known as the reconstruction process for panel-level packaging) requires the first and second dies 602, 604 (referred as dies 113 in FIG. 10) to be arranged and adhered to the carrier 117 accurately, since properties on the die active surfaces 6021, 6041 (such as the alignment marks (not shown)) can be observed easily through the protective layer 107 before bonding the first and second dies 602, 604 to the carrier 117.

Alternative to the passive components 420 and/or the heat sink 430, another packaged chip 600 may be mounted on the second conductive structure 140 of this packaged chip 600 to form the package-on-package (POP) configuration. Alternatively, one or more packaged chip 400, 500, 550 may be mounted on the second conductive structure 140 of this packaged chip 600 to form the package-on-package (POP) configuration.

Similarly, in the case that the first conductive structure 129 and the second conductive structure 140 are made of metals or metallic materials (such as Copper (Cu)), they have relatively heavy weights, compared with the die 113, the connection pad 201, the molding layer 123 and other components described above (such as the protective layer 107). Therefore, the first conductive structure 129 and the second conductive structure 140 are preferred to have a substantially same weight for balancing the packaged chip 600 as a whole. In other words, the first conductive structure 129 and the second conductive structure 140 have a substantially equal amount of mass if they are made of a same metal or metallic material (such as Copper (Cu)).

Figure 37A:
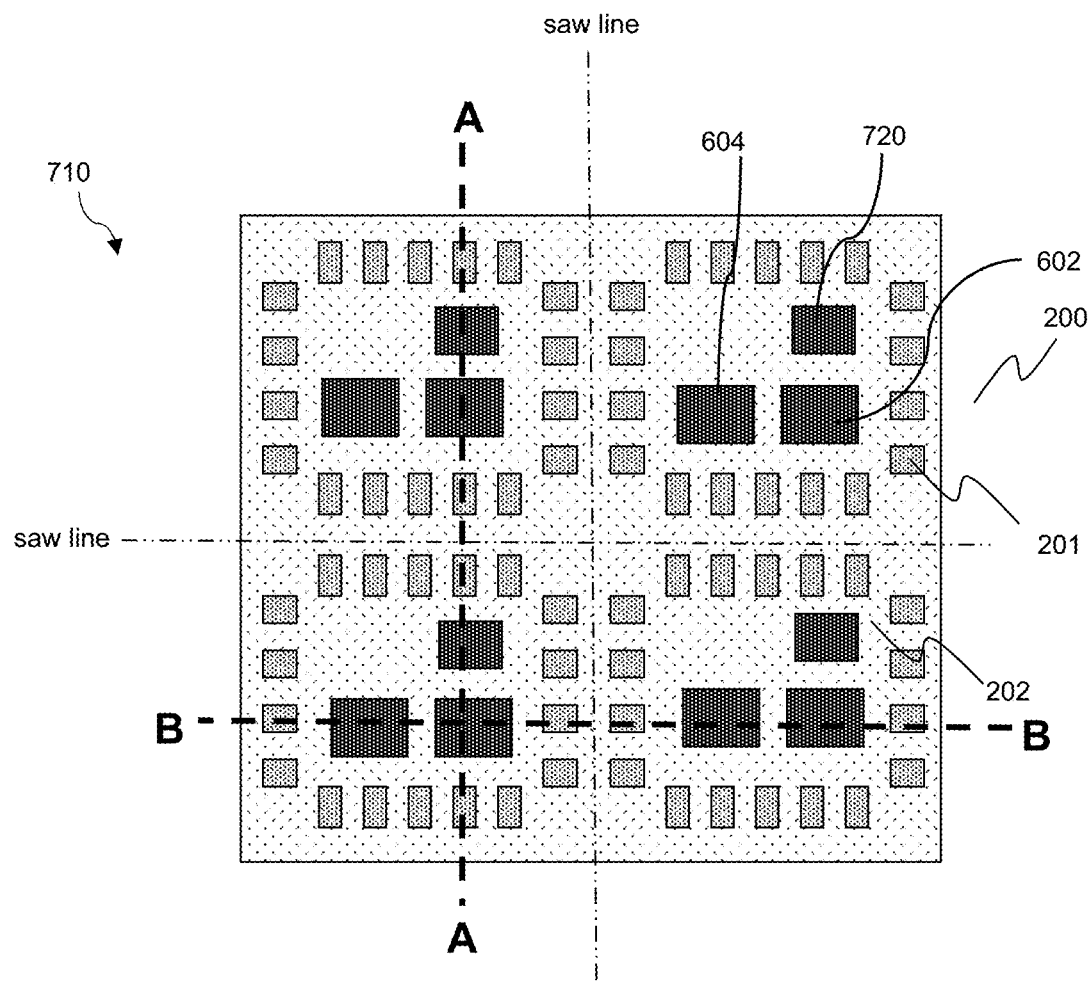
FIGS. 37a-37c illustrate a schematic diagram of a chip package for power modules according to an exemplary embodiment of the present disclosure.
Figure 37B:
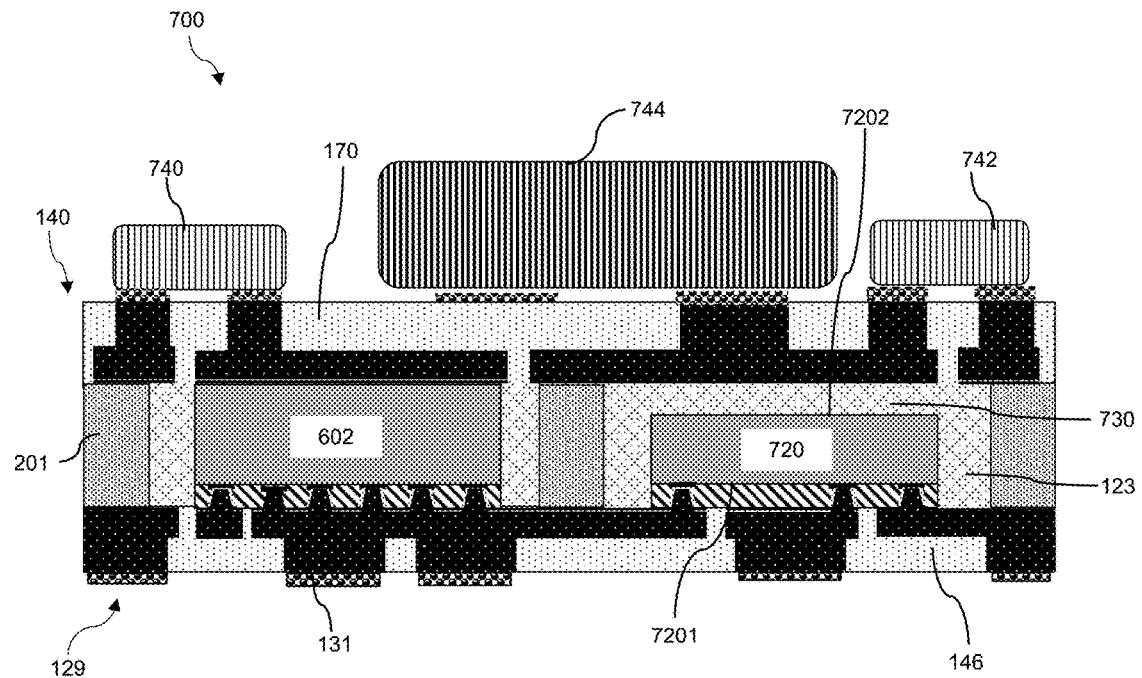
Figure 37C:
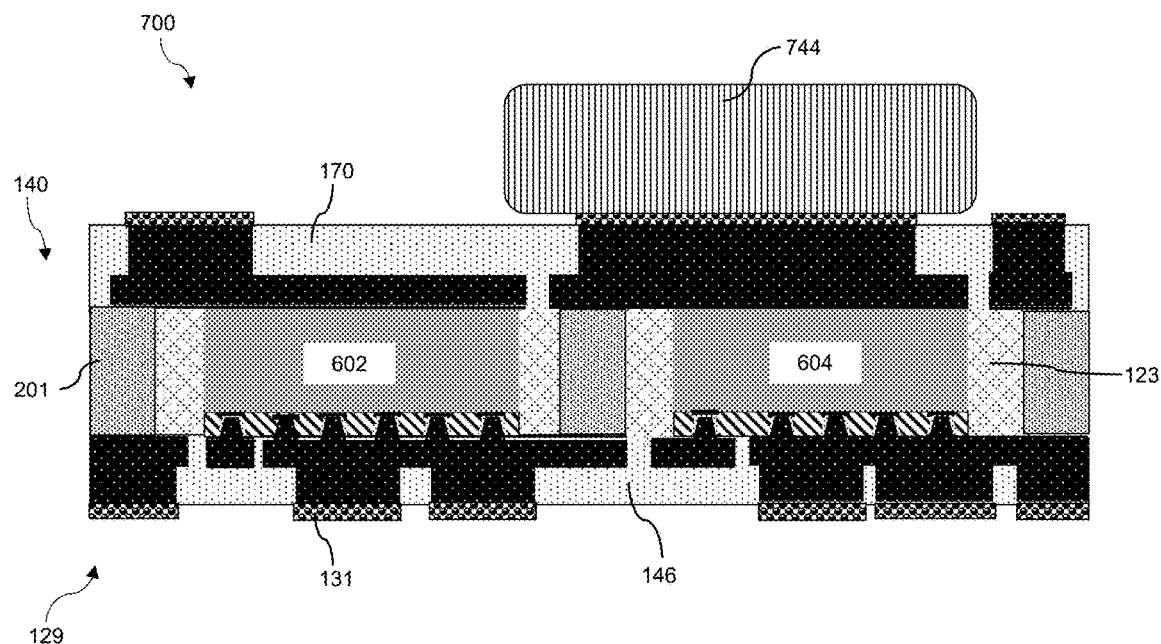

FIGS. 37a-37c illustrate a schematic diagram of a chip package 700 for power modules according to an exemplary embodiment of the present disclosure. The chip package 700 is manufactured with the chip packaging method 10 of FIG. 1. Accordingly, the same reference numerals are used for the same or similar features of FIG. 2 to FIG. 25.

FIG. 37a shows a top view of a panel assembly 710 including multiple chip packages 700 (such as four as shown in FIG. 37a) before singulation. The multiple chip packages 700 arranged in a matrix configuration. Each of the chip package 700 may function as a DrMOS power module by including a first die 602 and a second die 604 of metal-oxide-semiconductor field-effect transistors (MOSFET), and a driver circuit (also called driver) 720 for controlling the first die 602 and the second die 604. For example, the first die 602 is a low side MOSFET optimized for ultra-fast switching and the second die 604 is a high side MOSFET optimized for minimum conduction losses.

Accordingly, the metal frame 200 includes multiple metal units (such as four as shown in FIG. 37a); and each metal unit encloses the first die 602, the second die 604 and the driver circuit 720 for constituting the chip package 700. In addition, the chip package 700 is manufactured by singulating the panel assembly 710, dash-dotted lines in FIG. 37a show cutting lines (also called saw lines) along which the separation is performed.

FIG. 37b shows a cross-sectional view of the chip package 700 along the dash line A-A in FIG. 37a. The chip package 700 has a similar structure as the packaged chip 600, except that the second die 604 is replaced with the driver circuit 720. The driver circuit 720 has a thinner profile than the first die 602; and thus a driver back surface 6042 of the driver circuit 720 is not in direct contact with the second conductive structure 140. Accordingly, a space 730 is formed between the driver back surface 7022 and the second conductive structure 140. The space 730 is filled with the molding layer 123 in FIG. 11 of the chip packaging method 10, so that heat can still be dissipated from the driver back surface 7202 to the second conductive structure 140 via the molding layer 123.

Passive components 420 may be mounted on the second conductive structure 1401, such as a resistor 740 and a capacitor 742 mounted over the first die 602 and the driver circuit 720 respectively, as well as an inductor 744 mounted between the resistor 740 and the capacitor 742. Accordingly, the first die 602 and the driver circuit 720 are electrically connected to the passive components 420 via the filled conductive vias 124, the first conductive structure 129, the connection pad 201 and the second conductive structure 140 for transmitting electrical signals. Similarly, the chip package 700 may also implement the back-grounding via the second conductive structure 140.

In particular, the chip package 700 retains the three-sided heat dissipation design along the dash line A-A in FIG. 37a advantageously for an efficient cooling function, i.e., from the first side of the first die active surface 6021 and a driver active surface 7201 of the driver circuit 720 via the first conductive structure 129, from the second side of the second die back surface 6022 and the driver back surface 7202 of the driver circuit 720 via the second conductive structure 140, and from the third side of the lateral surface 402 via the connection pad 201.

FIG. 37c shows a cross-sectional view of the chip package 700 along the dash line B-B in FIG. 37a. The chip package 700 has a similar structure as the packaged chip 600 such that the first die 602 and the second die 604 are in direct contact with the second conductive structure 140 at the first die back surface 6022 and the second die back surface 6042, respectively. The inductor 744 is also shown to be mounted on the second structure 140 exposed from the molding layer 123.

Similarly, the chip package 700 still retains the three-sided heat dissipation design along the dash line B-B in FIG. 37a advantageously for an efficient cooling function, i.e., from the first side of the first and second die active surfaces 6021, 6041 via the first conductive structure 129, from the second side of the first and second die back surfaces 6022, 6042 via the second conductive structure 140, and from the third side of the lateral surface 402 via the connection pad 201 exposed from the molding layer 123.

Alternative to the passive components 420 (such as the resistor 740, the capacitor 742 and the inductor 744) and/or the heat sink 430, another chip package 700 may be mounted on the second conductive structure 140 of this chip package 700 to form the package-on-package (POP) configuration for power modules.

Figure 38A:
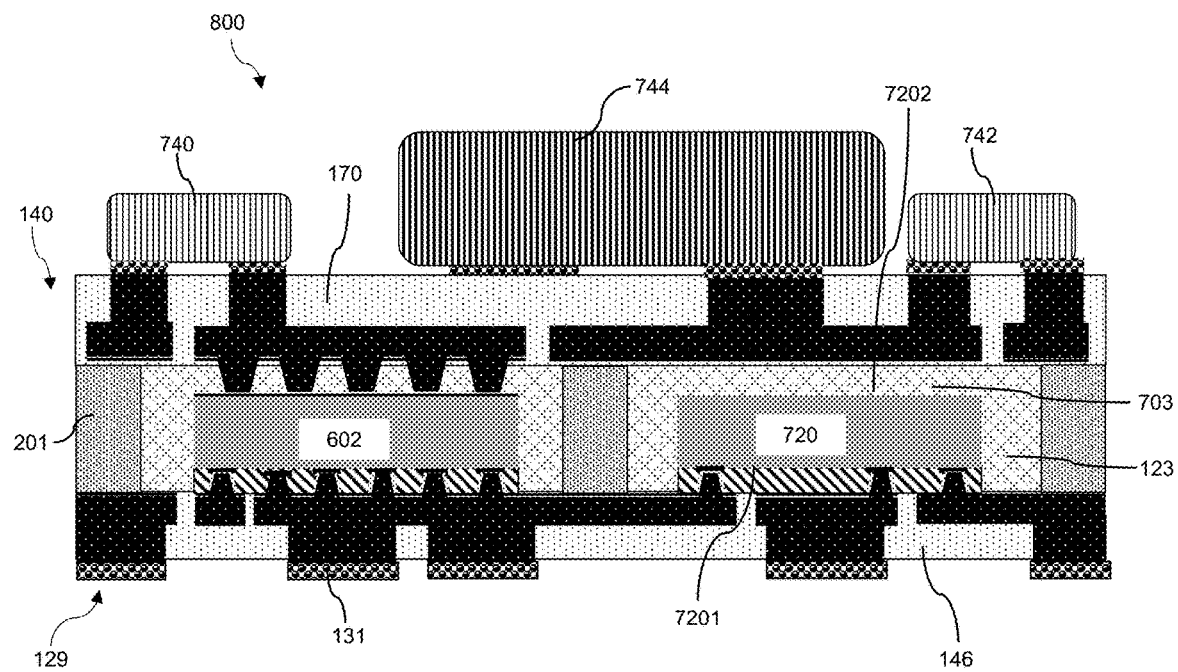
FIGS. 38a-38b illustrate a schematic diagram of another chip package for power modules according to an exemplary embodiment of the present disclosure.
Figure 38B:
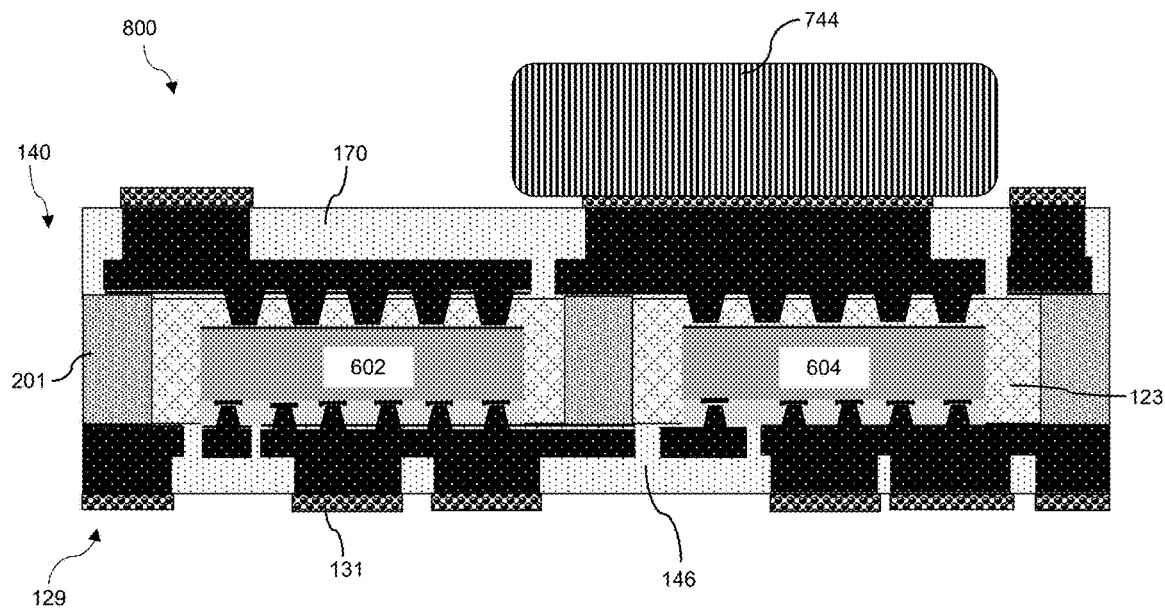

FIGS. 38a-38b illustrate a schematic diagram of another chip package 800 for power modules according to an exemplary embodiment of the present disclosure. The chip package 800 is manufactured with the chip packaging method 20 of FIG. 27. Therefore, the same reference numbers are used for the same or similar features shown in FIG. 2 to FIG. 25 and FIG. 28 to FIG. 30.

Similar to the chip package 700, the chip package 800 is also manufactured by singulating the panel assembly 710 as shown in FIG. 37a for the top view.

FIG. 38a shows a cross-sectional view of the chip package 800 along the dash line A-A in FIG. 37a. The chip package 800 has a similar structure as the chip package 700 shown in FIG. 37b in that the space 730 formed between the driver back surface 7022 and the second conductive structure 140 is filled with the molding layer 123 so that heat can still be dissipated from the driver back surface 7202 to the second conductive structure 140 via the molding layer 123.

However, multiple voids 502 as described in FIG. 28 are formed through the molding layer 123 until the first die back surface 6022 by any suitable process, such as a laser patterning process, a mechanical patterning process, a drilling process, or a combination thereof. The voids 502 are then filled with the conductive medium such as gold, silver, copper, tin, aluminum and the like, or a combination thereof, or other suitable conductive materials as described in FIG. 29.

FIG. 38b shows a cross-sectional view of the chip package 800 along the dash line B-B in FIG. 37a. Compared with the chip package 700 shown in FIG. 37c, multiple voids 502 as described in FIG. 28 are also formed through the molding layer 123 until the second die back surface 6042 by any suitable process, such as a laser patterning process, a mechanical patterning process, a drilling process or a combination thereof. The voids 502 are then filled with the conductive medium such as gold, silver, copper, tin, aluminum and the like, or a combination thereof, or other suitable conductive materials as described in FIG. 29 for forming the conductive filled voids 504.

Alternative to the passive components 420 (such as the resistor 740, the capacitor 742 and the inductor 744) and/or the heat sink 430, another chip package 800 may be mounted on the second conductive structure 140 of this chip package 800 to form the package-on-package (POP) configuration. Alternatively, one chip package 700 may be mounted on the second conductive structure 140 of this chip package 800 to form the package-on-package (POP) configuration. Alternatively, this chip package 800 may be mounted on the second conductive structure 140 of one chip package 700 to form the package-on-package (POP) configuration.

Figure 39A:
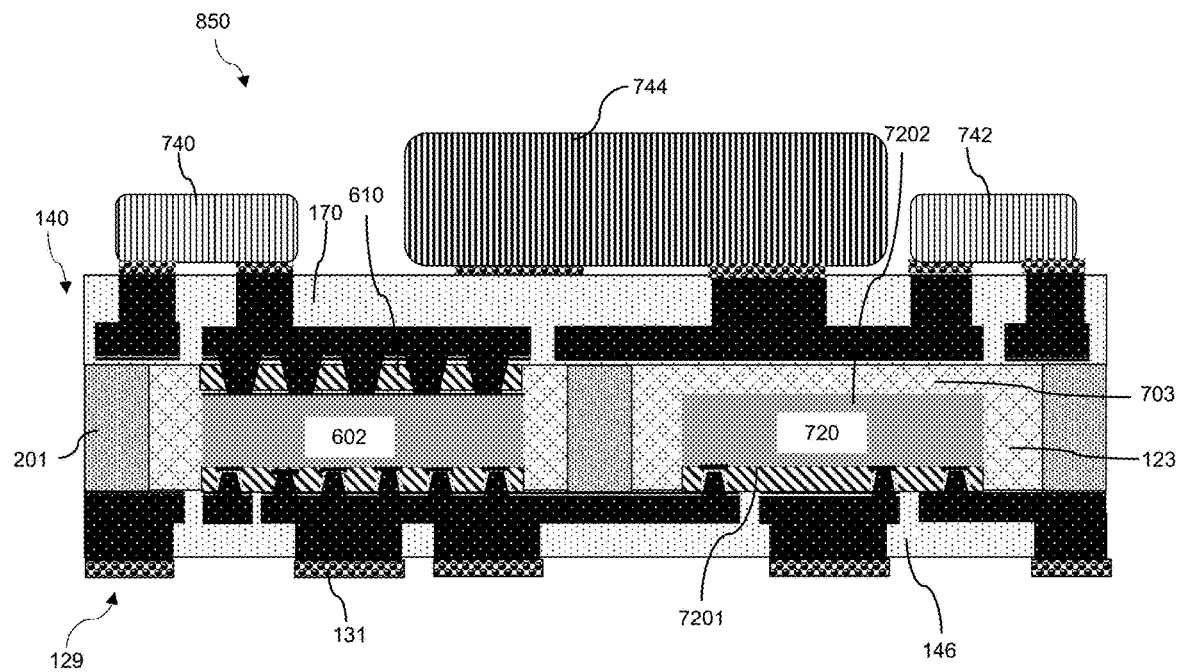
FIGS. 39a-39b illustrate a schematic diagram of another chip package for power modules according to an exemplary embodiment of the present disclosure.
Figure 39B:
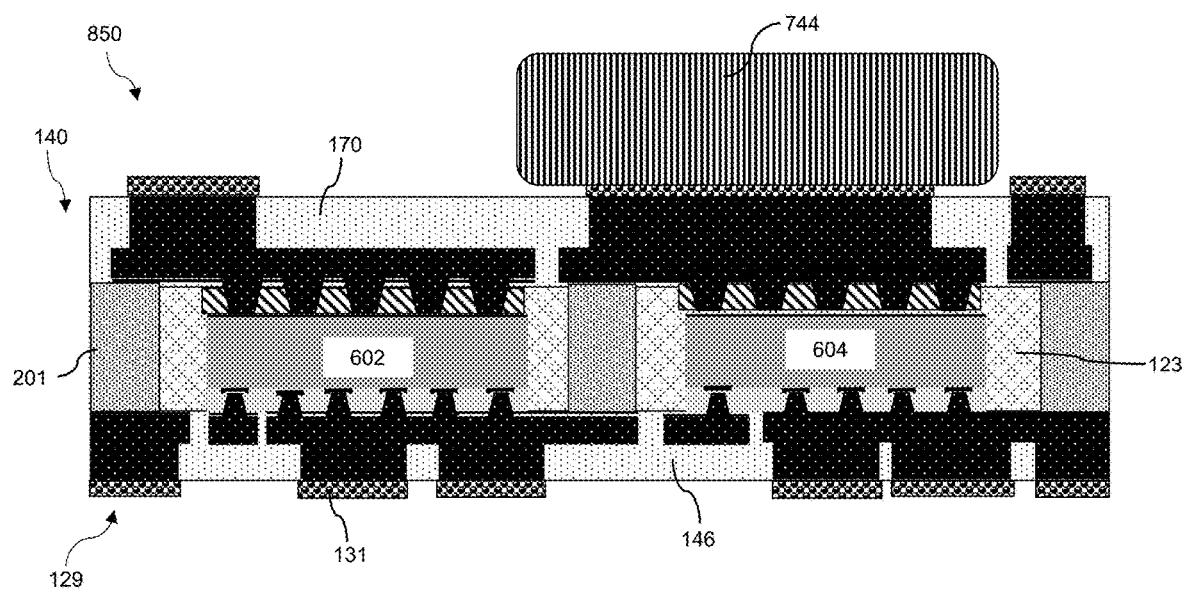

FIGS. 39a-39b illustrate a schematic diagram of another chip package 850 for power modules according to an exemplary embodiment of the present disclosure. The chip package 850 is manufactured with the chip packaging method 20 of FIG. 27. Therefore, the same reference numbers are used for the same or similar features shown in FIG. 2 to FIG. 25 and FIG. 32 to FIG. 34.

Similar to the chip package 700, the package 850 is also manufactured by singulating the panel assembly 710 as shown in FIG. 37a for the top view.

FIG. 39a shows a cross-sectional view of the chip package 850 along the dash line A-A in FIG. 37a. The chip package 850 has a similar structure as the chip package 800 shown in FIG. 38a. However, the space 730 in the chip package 800 is filled with the molding layer 123; and the voids 502 are formed in the molding layer 123 and then filled with the conductive medium for forming the conductive filled voids 504.

In comparison, the voids 502 in the chip package 850 are formed in the molding layer 610 as described in FIG. 32. The molding layer 610 may be formed by paste printing, injection molding, hot press molding, compression molding, transfer molding, liquid sealant molding, vacuum lamination, or other suitable mode of molding. For example, the molding layer 610 is formed in a film molding process onto the die back surfaces 6022, 6042 of the first and second dies 602, 604.

Alternative to the passive components 420 (such as the resistor 740, the capacitor 742 and the inductor 744) and/or the heat sink 430, another chip package 850 may be mounted on the second conductive structure 140 of this chip package 850 to form the package-on-package (POP) configuration. Alternatively, one chip package 700, 800 may be mounted on the second conductive structure 140 of this chip package 850 to form the package-on-package (POP) configuration. Alternatively, this chip package 850 may be mounted on the second conductive structure 140 of the chip package 700, 800 to form the package-on-package (POP) configuration.

In the case that the first conductive structure 129 and the second conductive structure 140 are made of metals or metallic materials (such as Copper (Cu)), they have relatively heavy weights, compared with the die 113, the connection pad 201, the molding layer 123 and other components described above (such as the protective layer 107). Therefore, the first conductive structure 129 and the second conductive structure 140 are preferred to have a substantially same weight for balancing the chip packages 700, 800, 850 as a whole. In other words, the first conductive structure 129 and the second conductive structure 140 have a substantially equal amount of mass if they are made of a same metal or metallic material (such as copper (Cu)).

Figure 40:
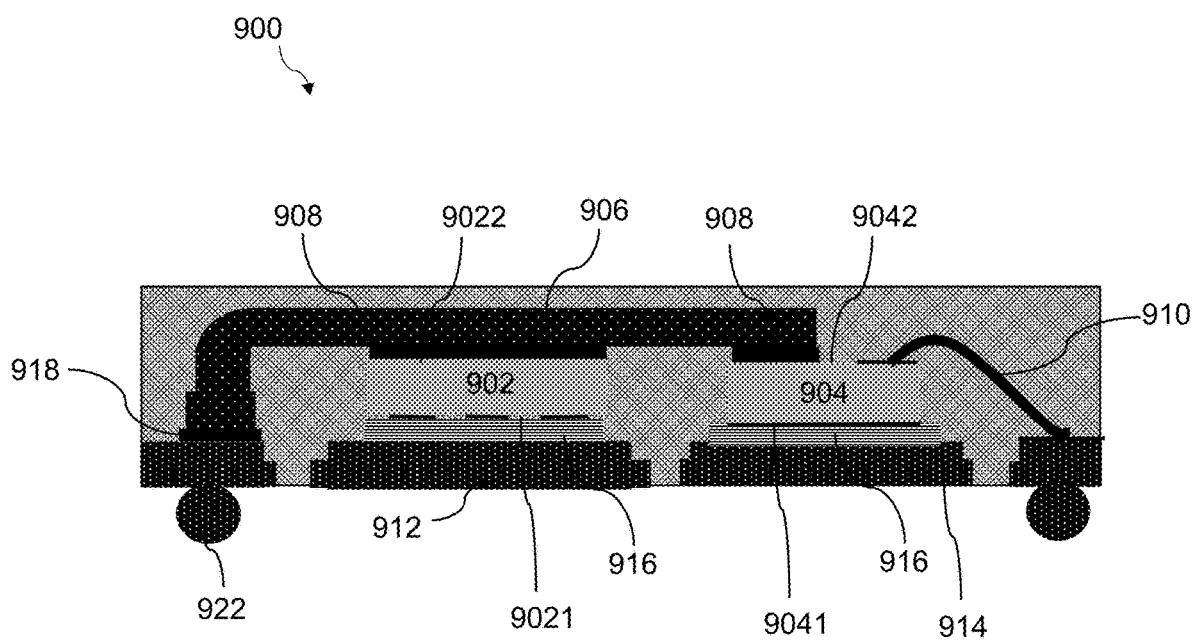
FIG. 40 illustrate a schematic diagram of a traditional chip package for power modules.

FIG. 40 illustrates a schematic diagram of a traditional chip package 900 for power modules. The traditional chip package 900 has a first semiconductor die 902 in a face-down configuration, i.e., a first die active surface 9021 of the semiconductor die 902 facing towards and being connected to a lead frame 912 via the traditional flip-chip process with solder bumps or solder balls; and a second semiconductor die 904 in a face-up configuration, i.e., a second die active surface 9041 of the second semiconductor die 904 facing away from and being connected to the lead frame 912 via a wire bond 910. The two different configurations (i.e., the face-down configuration of the first semiconductor die 902 and the face-down configuration of the second semiconductor die 904) would make a manufacturing process of the traditional chip package 900 complicated and costly, and also less accurate for bonding the first and second semiconductor dies 902, 904 to the carrier 117 in the reconstruction process.

In contrast, both of the first and second dies 602, 604 have the face-down configuration in the chip packages 700, 800, 850 via the direct flip-chip process (without solder bumps or solder balls) to connect to the first conductive structure 129 and further to the PCB or substrate 410; and thus the chip packaging methods 10, 20 are less complicated, less costly and more accurately for producing the chip packages 700, 800, 850, particularly for the reconstruction process of bonding the first and second dies 602, 604 and the driver circuit 720 to the carrier 117 as shown in FIG. 10 (the die 113 represents the first and second dies 602, 604 in FIG. 10).

As shown in FIG. 40, a Cu clip 906 is mounted onto the first semiconductor die 902 and the second semiconductor die 904. However, the Cu clip 906 has a bulky size and makes traditional chip package 900 to have a thick and large profile. Accordingly, the Cu clip 906 has a heavy weight which may induce the first and second semiconductor dies 902, 904 to crack. Meanwhile, a wire bond 910 is also commonly used in the traditional chip package 900 to connect the second semiconductor die 904 to the lead frame 912. The wire bond 910 also needs a large space (both vertically and laterally) and makes the profile of the traditional chip package 900 further thicker and larger.

In contrast, both the first and second dies 602, 604 and the driver circuit 720 are directly connected to the PCB or substrate 410 via the direct flip-chip process without solder bumps or solder balls in the present disclosure. Accordingly, the chip packages 700, 800, 850 has a thinner and smaller profile and thus are suitable for portable electronic devices (such as mobile phones, touchable pads and laptops) which becomes more and more popular nowadays.

As shown in FIG. 40, a die attach material 916 is used to attach the first and second semiconductor dies 902, 904 onto the lead frame 912. Although maybe conductive (such as conductive pastes or solder), the die attach material 916 still has a much higher electrical resistance than the conductive materials of the first conductive structure 129 (such as Copper (Cu)). Therefore, the traditional chip package 900 having the conductive die attach material 916 is not applicable for power modules which require a low electrical resistance for the larger electric flux to flow through. Alternatively, the die attach material may be electrically non-conductive material (such as adhesive paste or film adhesives), which cannot dissipate heat efficiently. Therefore, the traditional chip package 900 having the non-conductive die attach material 916 is also not applicable for power modules in which much heat is generated by the large electric flux.

In contrast, the first and second 602, 604 and driver circuit 720 are directly connected to the connection pad 201 of the metal frame 200 (such as the lead frame) via the first and second conductive structures 129, 140 in the chip packages 700, 800, 850, without the die attach material 916 for the traditional chip package 900. The first and second conductive structures 129, 140 may be made of a highly electrically conductive material (such as Copper (Cu)) which allows the large electric flux to flow in the power modules. Accordingly, less heat would be generated due to less electrical resistance of the first and second consecutive structures 129, 140.

In particular, a die back metal layer 908 (such as Copper (Cu)) has to be additionally applied on the first and second die back surfaces 9022, 9042 for vertical electrical conductance through the first and second semiconductor dies 902, 904 in the traditional chip package 900. For example, the die back metal layer 908 is applied to the first die back surface 9022 for the vertical electrical conductance from the first die active surface 9021 to the first die back surface 9022. However, the grinding process as shown in FIG. 12 cannot be conducted to the die back metal layer 908; and thus the first and second semiconductor dies 902, 904 cannot be thinned by the grinding process for reducing their electrical resistance, which would reduce performance of the power modules using the traditional chip package 900.

In contrast, the chip packages 700, 800, 850 do not have the die back metal layer 908 since the vertical electrical conductance is conducted via the connection pad 201 of the metal frame 200 and the second conductive structure 140 on the die ack surfaces 6022, 6042 and the driver back surface 7202. Therefore, the grinding process as shown in FIG. 12 can be performed to make the first and second dies 602, 604 and the driver circuit 720 thinner for enhancing the electrical performance of the chip packages 700, 800, 850 for power modules.

Furthermore, discrete metal components fabricated separately and individually before packaging (such as the Cu clip 906 and the lead frame 912) are used in the traditional chip package 900. Thus, a spot plating layer 918 made of expensive metals (such as Ag or NiPdAu) is additionally needed to connect any two discrete metal components during the packaging. For example, the spot plating layer 918 is applied between the Cu clip 906 and the lead frame 918 for installing the Cu clip 906 on the lead frame 912. For another example, the spot plating layer 918 (not shown) is also applied between the Cu clip 906 and the die back metal layer 908 for installing the Cu clip 906 on the first die back surface 9022 of the first semiconductor die 902.

In contrast, the chip packages 700, 800, 850 do not use the discrete metal components. Instead, the metal components of the chip packages 700, 800, 850 are built during the packaging (such as the conductive filled vias 124, the first and second conductive structures 129, 140) by suitable metal deposition process such as PVD, CVD, sputtering, electrolytic electroplating, and electrodeless electroplating. For example, the first panel-level conductive trace 125 is directly formed on the conductive filled vias 124 and the connection pad front surface 2011; and then the first panel conductive stud 127 is then directly formed on the first panel-level conductive trace 125. Therefore, the chip packages 700, 800, 850 provide direct connections of all conductive components, and thus do not need a process to form the spot plating layer 918 during the packaging. The direct connections as described above in the chip packages 700, 800, 850 thus improves reliability and mechanical stability of the connections between the conductive components, which further improve its performance in a moisture senility level test (MST).

In addition, the chip packages 700, 800, 850 does not need solder balls or solder bumps 922 in the traditional chip package 900 to connect to PCB or substrate, passive components or heat sinks. For example, the first and second dies 602, 604 and the driver circuit 720 are directly connected to the PCB or substrate 410 via the first conductive structure 129, without using the solder bumps or solder balls. For another example, the first and second dies 602, 604 and the driver circuit 720 are directly connected to the passive components 420 (such as the resistor 740, the capacitor 742 and the inductor 744) or the heat sink 430 via the second conductive structure, without using the solder bumps or solder balls. The direct connections have multiple benefits to the chip packages 700, 800, 850 over the traditional chip package 900, particularly for use in power modules.

Solder is quite soft in nature; and the solder bumps or solder balls 922 are easily deformed when the components of the traditional chip package 900 (including the semiconductors dies 902, 904, the Cu clip 906, lead frame 912 and the molding layer 920) are mounted. In addition, solder has a low melting temperature; and the solder bumps or solder balls 922 may melt and shift when much heat is generated in the traditional chip package (particularly for application as power modules), which may deteriorate or even destroy electrical connections in the traditional chip package 900.

Solder also has relatively high electrical resistance and impedance to an electric flux to flow through, and may be also subjected to electromigration when the electric flux is large for power modules. In contrast, the conducive material of the direct connections (such as Copper (Cu)) in the chip packages 700, 800, 850 has much less electrical resistance and impedance and is not easily subjected to the electromigration for application as power modules.

Furthermore, the traditional chip package 900 has a long electrical path along the Cu clip 906 and the wire bond 910, which may induce severe parasitic effect and conduction loss. In contrast, the direct connections in the direct connection chip packages 700, 800, 850 provide shorter path via the first and second conductive structures 129, 140 and the connection pad 201 of the metal frame 200 for reducing the parasitic effect and the conduction loss.

In addition, a seed layer (not shown) may be formed before forming the direct connections in the chip packages 700, 800, 850 for further enhancing the direct connections. The seed layer may be formed by sputter Ti/Cu, sputter SUS/Cu/SUS, electroless Cu, or a combination thereof.

As shown in FIG. 40, the traditional chip package 900 dissipates heat mainly from a molding layer 920 completely encapsulating the first and second semiconductor dies 902, 904 and the Cu clip 906. Heat generated by the first and second semiconductor dies 902, 904 and electrical heat generated by the electric flux flowing in the traditional chip package 900 may not be efficiently dissipated to an ambient environment. Thus, the traditional chip package 900 is not applicable to power modules.

In contrast, the chip packages 700, 800, 850 have the three-sided heat dissipation design advantageously for an efficient cooling function, i.e., from the first side of the first and second die active surface 6021, 6041 and the driver active surface 7201 of the driver circuit 720 via the first conductive structure 129, from the second side of the first and second die back surfaces 6022, 6042 and the driver back surface 7202 of the driver circuit 720 via the second conductive structure 140, and from the third side of the lateral surface 402 via the connection pad 201. In addition, the heat sink 430 may be mounted onto the second conductive structure 140 for accelerating heat dissipation from the packaged chip 600.

The specific embodiments as described above are intended to further explain the technical solutions and technical effects of the present disclosure in detail; but it should be understood by those skilled in the art that the foregoing embodiments merely are specific embodiments, and not intended to limit the present disclosure; any modification, equivalent substitution, improvement and the like, made within the inventive ideas of the present disclosure should be covered within the protection scope of the present disclosure.

Because the instant application is a continuation-in-part application, to the extent any amendments, characterizations, or other assertions previously made (in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

The invention claimed is:

1. A chip package for a power module, comprising:
    at least one semiconductor die having a die active surface and a die back surface opposed to each other, wherein the at least one semiconductor die has a thin profile for reducing electrical resistance for the power module;
    a driver circuit for controlling the at least one semiconductor die, wherein the driver circuit has a driver active surface and a driver back surface opposed to each other;
    a protective layer formed on the die active surface and the driver active surface, wherein the protective layer comprises a plurality of protective layer openings for exposing the die active surface and the driver active surface from the protective layer;
    a metal unit having at least one metal feature, wherein the at least one metal feature comprises at least one connection pad having a connection pad front surface and a connection pad back surface opposed to each other, and an external side edge; and
    a molding layer for encapsulating the at least one semiconductor die, the driver circuit, the protective layer, and the metal unit, with the external side edge of the at least one connection pad exposed along a lateral surface of the packaged chip,
    wherein the chip package is connected with an external circuit via the at least one metal feature.

2. The chip package of claim 1, wherein the at least one semiconductor die comprises
    a first die having a first active surface; and
    a second die having a second active surface,
    wherein the first die, the second die and the driver circuit are enclosed within the metal unit, and the first active surface, the second active surface and the driver active surface are substantially coplanar with each other.

3. The chip package of claim 1, further comprising:
    a first conductive structure formed on the at least one metal feature of the metal unit, the protective layer and the molding layer, wherein the first conductive structure is connected to the die active surface and the driver active surface for connecting the at least one die and the driver circuit to the metal unit.

4. The chip package of claim 3, wherein the first conductive structure comprises
    a plurality of conductive filled vias connected to the die active surface and the driver active surface; and
    a panel-level conductive layer formed on the at least one metal feature of the metal unit, the protective layer and the molding layer,
    wherein the conductive filled vias are provided by filling the protective layer openings with a conductive material.

5. The chip package of claim 3, further comprising:
    a second conductive structure formed on the at least one metal feature of the metal unit and the molding layer and opposed to the first conductive structure, wherein the second conductive structure is connected to the first conductive structure via the at least one metal feature of the metal unit.

6. The chip package of claim 5, wherein the first conductive structure and the second conductive structure have a substantially equal weight for balancing the chip package from the die active surface and the die back surface.

7. The chip package of claim 5, wherein the second conductive structure is in direct contact with the die back surface of the at least one semiconductor die for electrical back-grounding of the chip package.

8. The chip package of claim 5, further comprising:
    at least one void formed in the molding layer for exposing the die back surface from the molding layer, wherein the at least one void is filled with a conductive medium to form a conductive filled void for connecting with the second conductive structure.

9. The chip package of claim 5, further comprising:
    an additional molding layer formed on the die back surface of the at least one die and encapsulated by the molding layer; and
    at least one void formed in the additional molding layer for exposing the die back surface from the molding layer, wherein the at least one void is filled with a conductive medium to form a conductive filled void for connecting with the second conductive structure.

10. The chip package of claim 5, further comprising:
    a first dielectric layer for encapsulating the first conductive structure, wherein the first conductive structure is exposed from the first dielectric layer for connecting with the external circuit; and
    a second dielectric layer for encapsulating the second conductive structure, wherein the second conductive structure is exposed from the second dielectric layer for connecting to an external device.

11. A method of making a chip package for a power module, comprising:
    providing at least one semiconductor die having a die active surface and a die back surface opposed to each other, wherein the at least one semiconductor die has a thin profile between the die active surface and the die back surface for reducing electrical resistance for the power module;
    providing a driver circuit for controlling the at least one semiconductor die, wherein the driver circuit has a driver active surface and a driver back surface opposed to each other;
    forming a protective layer on the die active surface and the driver active surface, wherein the protective layer comprises a plurality of protective layer openings for exposing the die active surface and the driver active surface from the protective layer;

disposing a metal unit enclosing the at least one semiconductor die and the driver circuit, wherein the metal unit has at least one metal feature, and the at least one metal feature further comprises at least one connection pad having a connection pad front surface and a connection pad back surface opposed to each other, and an external side edge;

forming a molding layer for encapsulating the at least one semiconductor die, the driver circuit, the protective layer and the metal unit; and connecting the chip package with an external circuit via the at least one metal feature of the metal unit, with the external side edge of the at least one connection pad exposed along a lateral surface of the packaged chip.

12. The method of claim 11, further comprising:

forming a first conductive structure in direct contact with the connection pad front surface of the at least one connection pad, a second protective surface of the protective layer and a molding layer front surface of the molding layer, wherein the connection pad front surface, the second protective surface and the molding layer front surface are substantially coplanar with each other.

13. The method of claim 12, further comprising:

forming a second conductive structure in direct with the connection pad back surface and a molding layer back surface of the molding layer, wherein the molding layer back surface is opposed to the molding layer front surface.

14. The method of claim 13, further comprising:

forming at least one void in the molding layer for exposing the die back surface of the at least one semiconductor die; and filling the at least one void with a conductive medium forming a conductive filled void connected to the second conductive structure.

15. The method of claim 11, further comprising:

forming a first dielectric layer encapsulating the first conductive structure, wherein the first conductive structure is exposed from the first dielectric layer for connecting with the external circuit; and forming a second dielectric layer encapsulating the second conductive structure, wherein the second conductive structure is exposed from the second dielectric layer for connecting to an external device.

* * * * *